US008542513B2

(12) United States Patent
Tang et al.

(10) Patent No.: US 8,542,513 B2
(45) Date of Patent: Sep. 24, 2013

(54) ARRAYS OF VERTICALLY STACKED TIERS OF NON-VOLATILE CROSS POINT MEMORY CELLS, METHODS OF FORMING ARRAYS OF VERTICALLY STACKED TIERS OF NON-VOLATILE CROSS POINT MEMORY CELLS, AND METHODS OF READING A DATA VALUE STORED BY AN ARRAY OF VERTICALLY STACKED TIERS OF NON-VOLATILE CROSS POINT MEMORY CELLS

(71) Applicant: Micron Technology, Inc., Boise, ID (US)

(72) Inventors: Sanh D. Tang, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/777,083

(22) Filed: Feb. 26, 2013

(65) Prior Publication Data
US 2013/0170284 A1 Jul. 4, 2013

Related U.S. Application Data

(62) Division of application No. 12/765,606, filed on Apr. 22, 2010, now Pat. No. 8,411,477.

(51) Int. Cl.
*G11C 5/02* (2006.01)
*G11C 5/06* (2006.01)
*G11C 11/00* (2006.01)
*H01L 21/82* (2006.01)

(52) U.S. Cl.
USPC ............... 365/51; 365/63; 365/148; 438/128; 438/129; 257/390; 257/E21.209; 257/E21.602

(58) Field of Classification Search
USPC ................. 365/51, 63, 148; 438/128, 129; 257/390, E21.209, E21.602
See application file for complete search history.

(56) References Cited

U.S. PATENT DOCUMENTS 4,715,685 A 12/1987 Yaniv et al.
4,964,080 A 10/1990 Tzeng (Continued)

FOREIGN PATENT DOCUMENTS

CN 1444284 9/2003
CN 1459792 12/2003

(Continued)

OTHER PUBLICATIONS

U.S. Appl. No. 12/701,885, Feb. 8, 2010, Sandhu et al.

(Continued)

*Primary Examiner* — Ly D Pham
(74) *Attorney, Agent, or Firm* — Wells St. John, P.S.

(57) ABSTRACT

An array of vertically stacked tiers of non-volatile cross point memory cells includes a plurality of horizontally oriented word lines within individual tiers of memory cells. A plurality of horizontally oriented global bit lines having local vertical bit line extensions extend through multiple of the tiers. Individual of the memory cells comprise multi-resistive state material received between one of the horizontally oriented word lines and one of the local vertical bit line extensions where such cross, with such ones comprising opposing conductive electrodes of individual memory cells where such cross. A plurality of bit line select circuits individually electrically and physically connects to individual of the local vertical bit line extensions and are configured to supply a voltage potential to an individual of the global horizontal bit lines. Other embodiments and aspects are disclosed.

17 Claims, 47 Drawing Sheets

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,524,867 B2 | 2/2003 | Yang et al. |
| 6,552,952 B2 | 4/2003 | Pascucci |
| 6,687,147 B2 | 2/2004 | Frickie et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Chevallier et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner et al. |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,465,675 B2 | 12/2008 | Koh |
| 7,473,982 B2 | 1/2009 | Aono et al. |
| 7,489,552 B2 | 2/2009 | Kurotsichi et al. |
| 7,525,410 B2 | 4/2009 | Aono et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,679,812 B2 | 3/2010 | Sasagawa et al. |
| 7,687,793 B2 | 3/2010 | Harshfield et al. |
| 7,696,077 B2 | 4/2010 | Liu |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,910,909 B2 | 3/2011 | Kim et al. |
| 8,021,897 B2 | 9/2011 | Sills et al. |
| 8,048,755 B2 | 11/2011 | Sandhu et al. |
| 8,094,477 B2 | 1/2012 | Maejima |
| 2002/0018355 A1 | 2/2002 | Johnson et al. |
| 2002/0196695 A1 | 12/2002 | Pascucci |
| 2003/0174042 A1 | 9/2003 | Aono et al. |
| 2003/0174570 A1 | 9/2003 | Oishi |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0205943 A1 | 9/2005 | Yamada |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0258079 A1 | 11/2006 | Lung et al. |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0045615 A1 | 3/2007 | Cho et al. |
| 2007/0048990 A1 | 3/2007 | Zhuang et al. |
| 2007/0109835 A1 | 5/2007 | Hsu |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0258279 A1 | 11/2007 | Lung et al. |
| 2007/0268739 A1 | 11/2007 | Yoo et al. |
| 2007/0268742 A1 | 11/2007 | Liu |
| 2007/0285965 A1 | 12/2007 | Toda et al. |
| 2007/0295950 A1 | 12/2007 | Cho et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0080229 A1 | 4/2008 | Choi et al. |
| 2008/0102278 A1 | 5/2008 | Kreupl et al. |
| 2008/0175031 A1 | 7/2008 | Park et al. |
| 2008/0185571 A1 | 8/2008 | Happ et al. |
| 2008/0232160 A1 | 9/2008 | Gopalakrishnan |
| 2008/0247219 A1 | 10/2008 | Choi et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |

| | | | |
|---|---|---|---|
| 2009/0057640 | A1 | 3/2009 | Lin et al. |
| 2009/0072217 | A1 | 3/2009 | Klostermann |
| 2009/0085121 | A1 | 4/2009 | Park et al. |
| 2009/0180309 | A1 | 7/2009 | Liu |
| 2009/0250681 | A1 | 10/2009 | Smythe et al. |
| 2009/0261314 | A1 | 10/2009 | Kim et al. |
| 2009/0261343 | A1 | 10/2009 | Herner et al. |
| 2009/0267047 | A1 | 10/2009 | Sasago et al. |
| 2009/0268532 | A1 | 10/2009 | DeAmbroggi et al. |
| 2009/0272960 | A1 | 11/2009 | Srinivasan et al. |
| 2009/0303780 | A1 | 12/2009 | Kasko et al. |
| 2009/0315090 | A1 | 12/2009 | Weis et al. |
| 2009/0316467 | A1 | 12/2009 | Liu |
| 2009/0317540 | A1 | 12/2009 | Sandhu et al. |
| 2010/0003782 | A1 | 1/2010 | Sinha et al. |
| 2010/0008163 | A1 | 1/2010 | Liu |
| 2010/0065836 | A1 | 3/2010 | Lee et al. |
| 2010/0084741 | A1 | 4/2010 | Andres et al. |
| 2010/0110759 | A1 | 5/2010 | Jin et al. |
| 2010/0135061 | A1 | 6/2010 | Li et al. |
| 2010/0140578 | A1 | 6/2010 | Tian et al. |
| 2010/0157657 | A1 | 6/2010 | Rinerson et al. |
| 2010/0163820 | A1 | 7/2010 | Son |
| 2010/0163829 | A1 | 7/2010 | Wang et al. |
| 2010/0193758 | A1 | 8/2010 | Tian et al. |
| 2010/0193761 | A1 | 8/2010 | Amin et al. |
| 2010/0193762 | A1 | 8/2010 | Hsieh et al. |
| 2010/0232200 | A1 | 9/2010 | Shepard |
| 2010/0237442 | A1 | 9/2010 | Li et al. |
| 2010/0259962 | A1 | 10/2010 | Yan et al. |
| 2011/0193044 | A1 | 8/2011 | Sandhu et al. |
| 2011/0261606 | A1 | 10/2011 | Sandhu et al. |
| 2011/0261607 | A1 | 10/2011 | Tang et al. |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 200880124714.6 | 7/2012 |
| EP | 1796103 | 9/2006 |
| JP | 2005175457 | 6/2005 |
| JP | 2006032729 | 2/2006 |
| JP | 2006040981 | 2/2006 |
| JP | 2006074028 | 3/2006 |
| JP | 2006121044 | 5/2006 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 20100083402 | 7/2010 |
| WO | WO 2006/003620 | 1/2006 |
| WO | WO 2008/084422 | 3/2009 |
| WO | WO 2009/127187 | 10/2009 |
| WO | WO 2010/068221 | 6/2010 |
| WO | WO 2008/084422 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2011/051785 | 4/2012 |
| WO | WO 2011/059095 | 5/2012 |
| WO | WO 2011/066770 | 9/2012 |
| WO | WO 2011/051785 | 4/2013 |

OTHER PUBLICATIONS

U.S. Appl. No. 12/765,598, Apr. 22, 2010, Sandhu et al.
U.S. Appl. No. 12/959,015, Dec. 2, 2010, Liu.
U.S. Appl. No. 12/979,189, Dec. 27, 2010, Sills et al.
U.S. Appl. No. 13/010,048, Jan. 20, 2011, Liu et al.
U.S. Appl. No. 12/141,388, Jun. 18, 2008, Liu.
U.S. Appl. No. 12/014,232, Jan. 15, 2008, Liu.
U.S. Appl. No. 12/099,267, Apr. 8, 2008, Smythe et al.
U.S. Appl. No. 12/114,096, May 2, 2008, Srinivasan et al.
U.S. Appl. No. 12/141,559, Jun. 18, 2008, Sandhu et al.
U.S. Appl. No. 12/166,604, Jul. 2, 2008, Sinha et al.
U.S. Appl. No. 12/765,506, Apr. 22, 2010, Tang et al.

Baek et al., "Multi-Layer cross-point Binary Oxide resistive Memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al., Peroskite RRAM Devices with Metal/Insulator/PCMO/Metal Heterostructures, 2005; pp. 125-128.
Choi et al., "Defect Structure and Electrical Properties of single-Crystal Ba0.03SR0.97TiO3", J. Am Ceram. Soc., 71, [4], pp. 201-205, 1988.
Courtade et al., "Microstructure and resistance switching in NiO binary oxide films obtained from Ni oxidation", IEEE, 2006, pp. 94-99.
Higaki et al., "Effects of Gas Phase Absorption into Si Substrates on Plasma doping Process" A208, Jan. 2004.
Ho et al., "A Highly Reliable Self-=Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology", Dec. 2006.
Hudgens et al., "Overview of Phase-Change Chalcogenide Nonvolatile Memory Technology", MRS Bulletin, Nov. 2004, pp. 829-832.
Ignatiev et al., "Resistance Non-volatile Memory-RRAM", Mater. Res. Soc. Symp. Proc., vol. 997, 2007, Materials Research Society, 9 pages.
Karg et al., "Nanoscale REsistive Memory Device using SrRiO3 Films", IEEE, 2007, pp. 68-70.
Kau et al., "A Stackable cross point phase change memory", IEEE, 2009, pp. 27.1.1-27.1.4.
Kooij et al., "Photoselective Metal Deposition on Amorphous Silicon p-i-n Solar Cells", Electrochemical Society Letters, Journal of Electrochemical Society vol. 44, No. 10, Oct. 1997, pp. L271-L272.
Kozicki et al., "Non-Volatile Memory Based on Solid Electrolytes", Center for Solid State Electronics Research, Arizona State University, 8 pages, Nov. 2004.
Kozicki, "Memory Devices Based on Solid Electrolytes", Mater. Res. Soc. Symp. Proc., vol. 997, 2007, Materials Research Society, 10 pages.
Lee et al., "2-stack 1D-1R Cross-Point Structure with Oxide Diodes as Switch Elements for High Density Resistance RAM Applications", IEE, 2007, pp. 771-774.
Lee et al., "Resistance Switching of Al doped ZnO for Non-Volatile Memory Applications", Dept. of Materials Science and Engineering, Gwangju Institute of Science and Technology, 2 pages, May 2006.
Lin et al., "Effect of Top Electrode Material on REsistive Switching Properties of ZrO2 Film Memory Devices", IEEE, May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual-Damascene (PMDD) for 0.13 um DRAMs and Beyond", IEEE, 2000, pp. 15.4.1-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006, IEEE, 4 pages.
Pein et al., "Performance of the 3-D Pencil Flash EPROM Cell and Memory Array", IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages.
Pirovano et al., "Self-Aligned u Trench Phase-Change Memory Cell Architecture for 90nm Technology and Beyond", IEEE, 2007, pp. 222-225.
Programmable metallization cell, Dec. 11, 2007; http://en.wikipedia.org/wiki/Programmable_metallization_cell on Dec. 13, 2011.
Scheck et al., "Selective Metal Electrodeposition Through Doping Modulation of Semiconductor Surfaces". Applied Physics Letters 86, 2005, 3 pgs.

Website, http://en.wikipedia.org/wiki/Programmable_metallization_cell, 4 pages, Dec. 11, 2007.

Wuttig, "Towards a Universal Memory?", Nature Materials, vol. 4, Apr. 2005, pp. 265-266.

Xing et al., "Characterization of AlGaN/GaN p-n Diodes with Selectively Regrown n-AlGaN by Metal-Organic Chemical-Vapor Deposition and its Application to GaN-Based Bipolar Transistors", Journal of Allpied Physics 97, 2005, 4 pgs.

Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.

Yoon et al., "Vertical Cross-Point Resistance Change Memory for Ultra-High Density Non-volatile Memory Applications", 2009 Symposium on VLSI Technology Digest of Technical Papers, pp. 26-27.

Yu et al., "Structure Effects on Resistive Switching of Al/TiOx/Al Devices for RRAM Applications", IEEE, 2008, pp. 331-333.

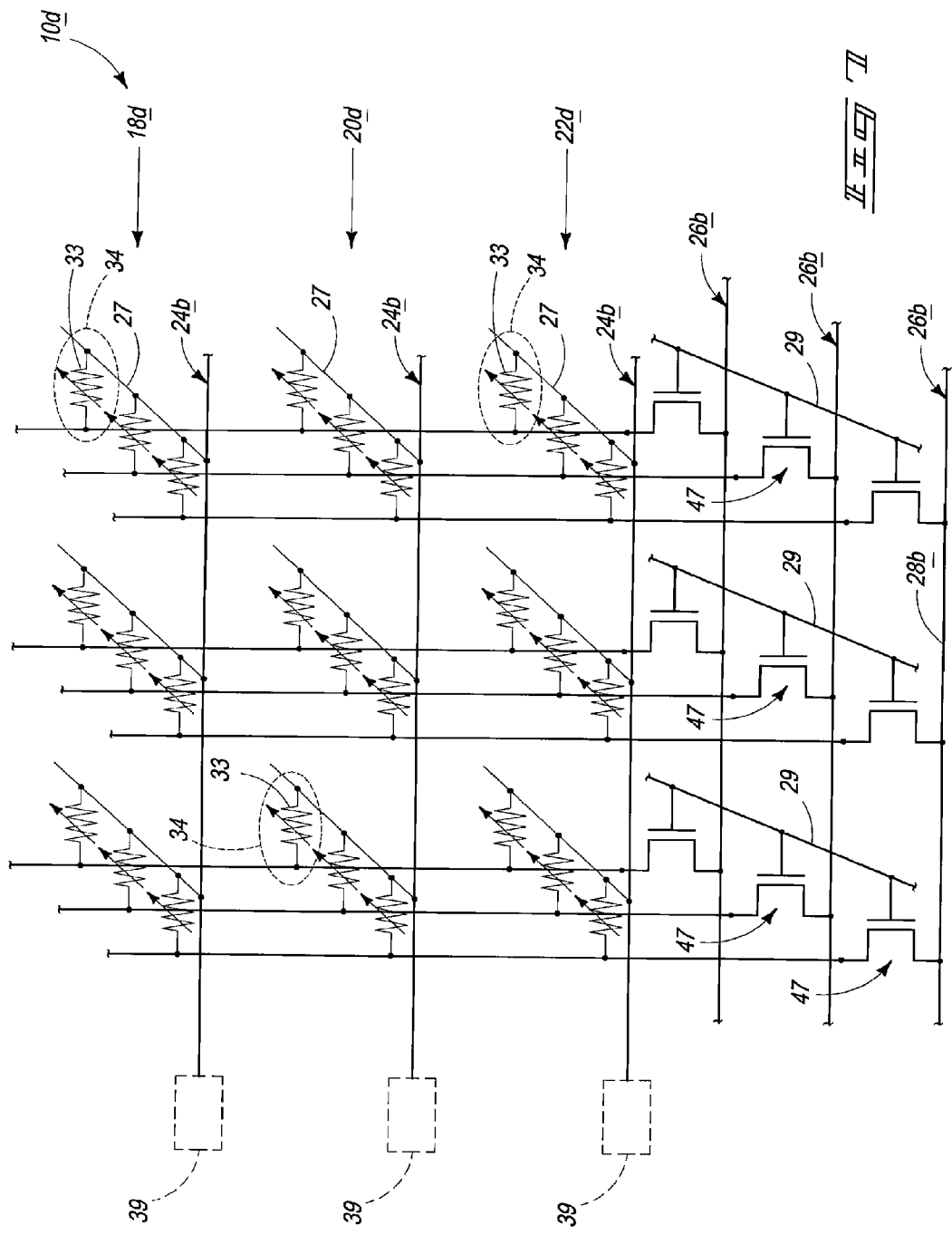

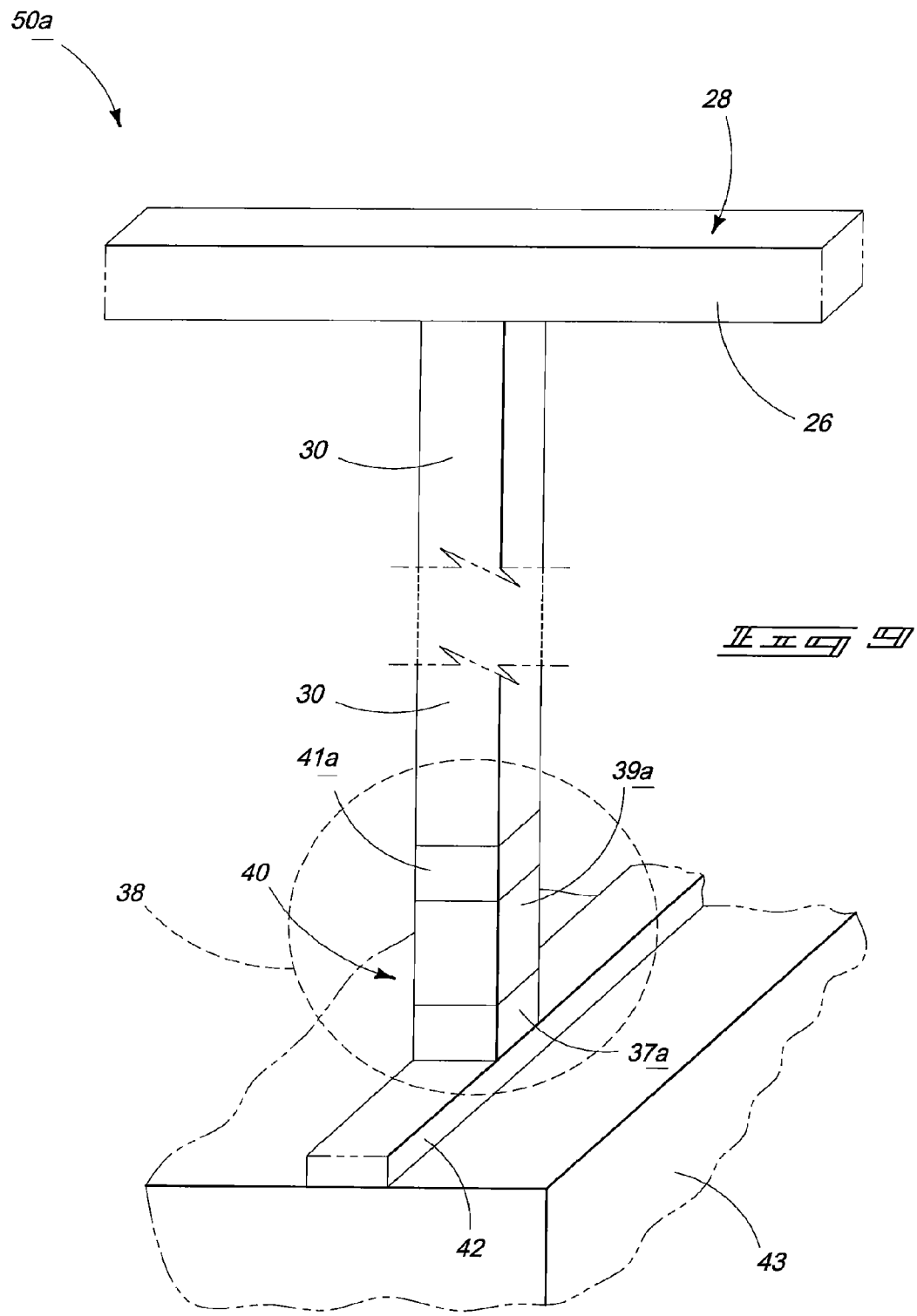

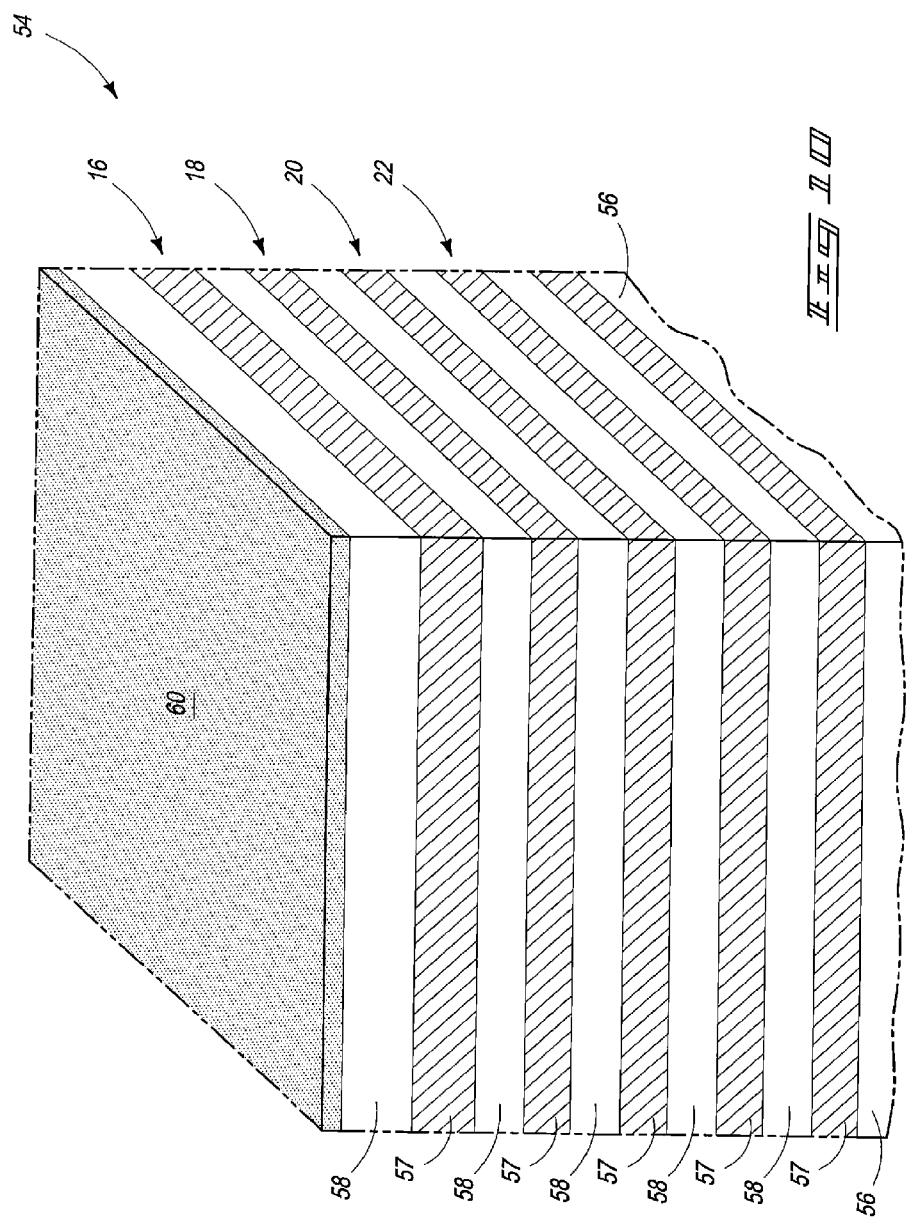

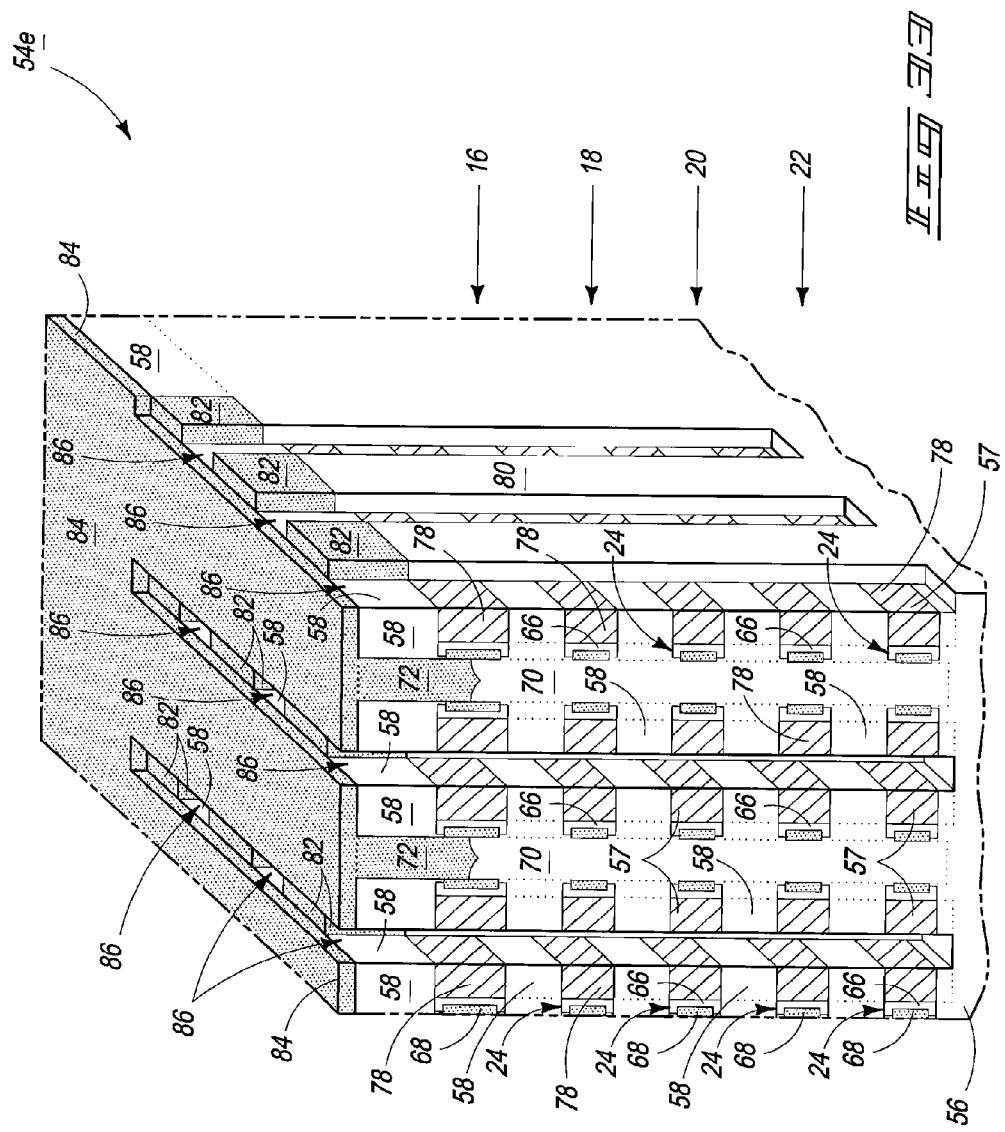

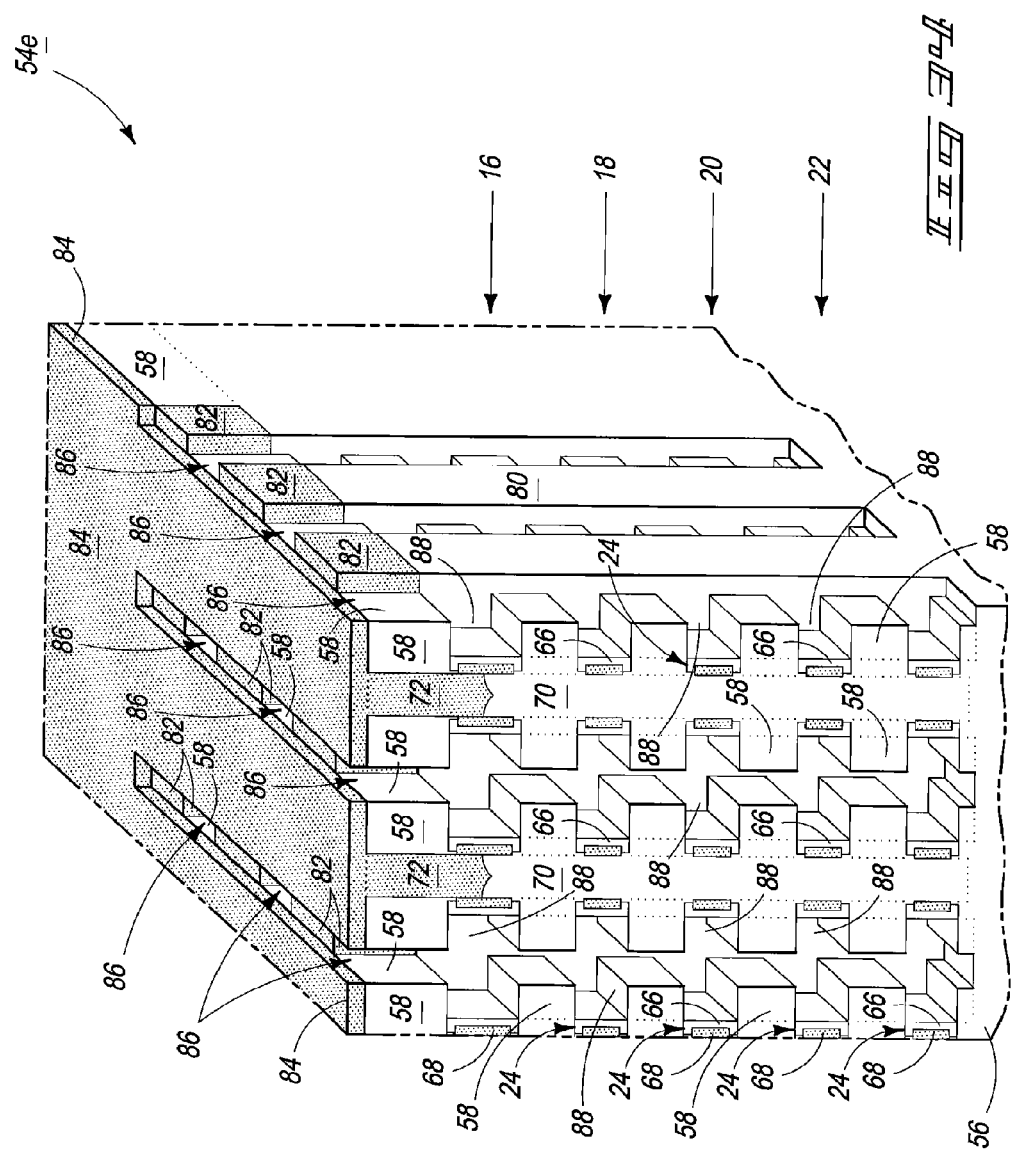

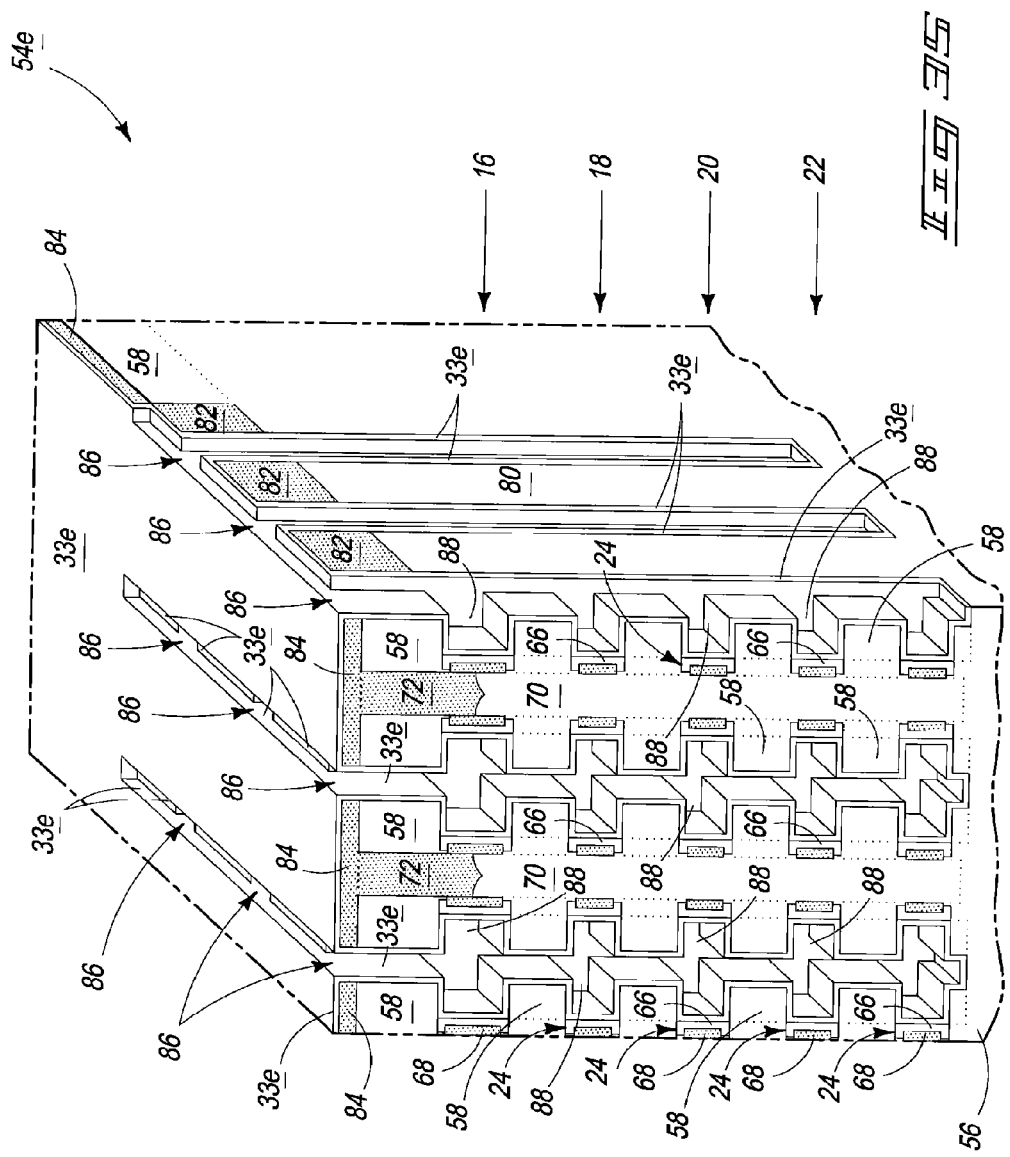

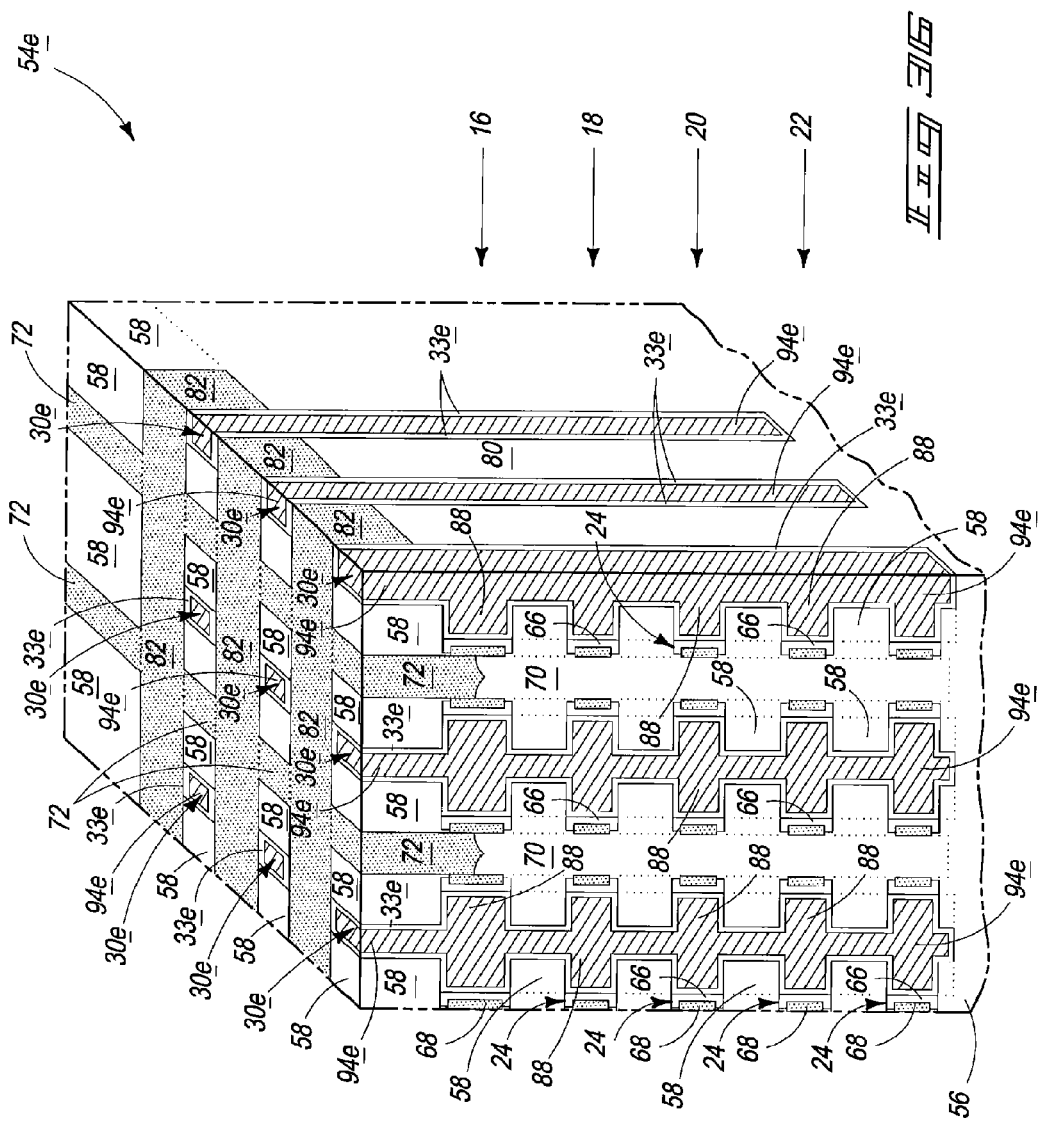

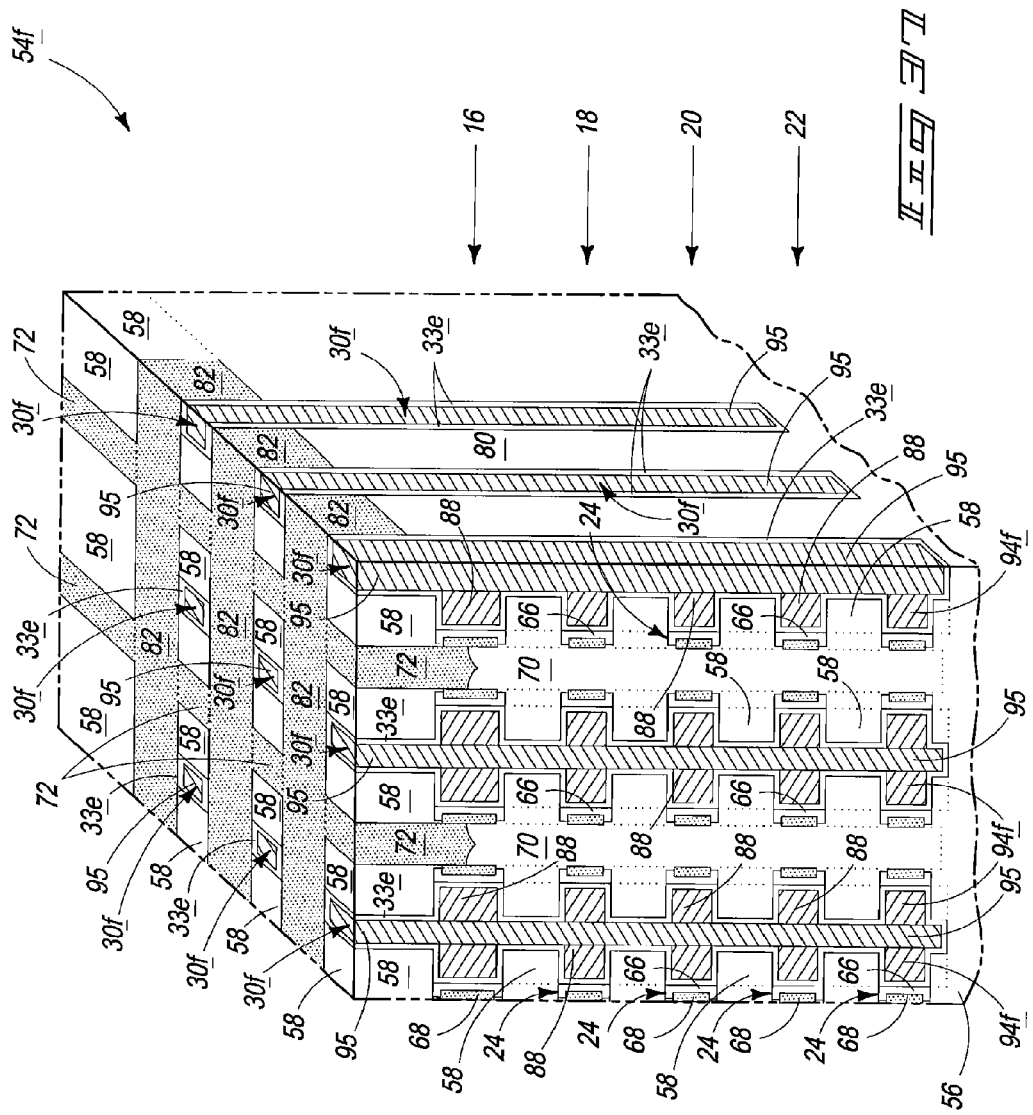

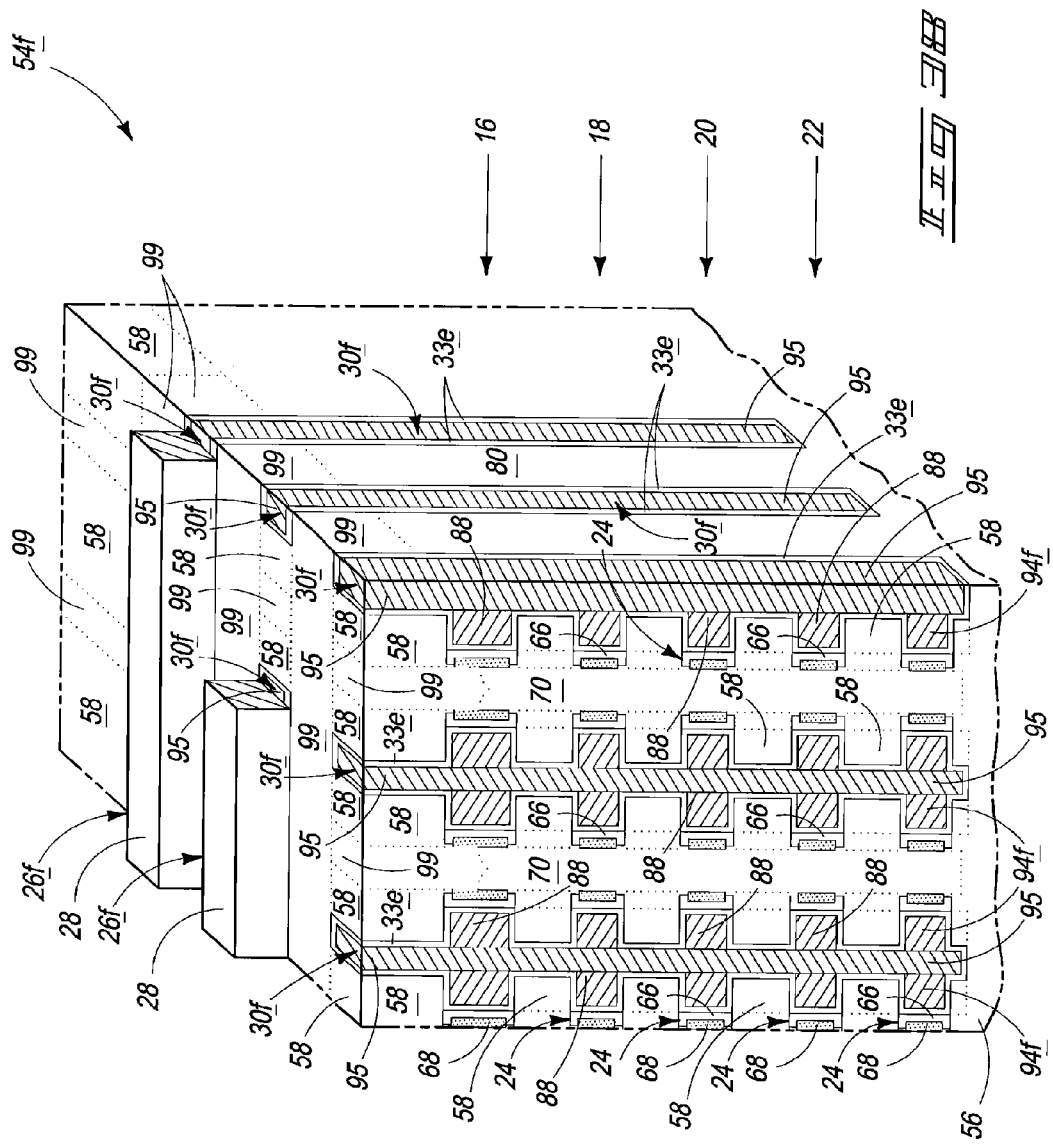

ARRAYS OF VERTICALLY STACKED TIERS OF NON-VOLATILE CROSS POINT MEMORY CELLS, METHODS OF FORMING ARRAYS OF VERTICALLY STACKED TIERS OF NON-VOLATILE CROSS POINT MEMORY CELLS, AND METHODS OF READING A DATA VALUE STORED BY AN ARRAY OF VERTICALLY STACKED TIERS OF NON-VOLATILE CROSS POINT MEMORY CELLS

RELATED PATENT DATA

This patent resulted from a divisional application of U.S. patent application Ser. No. 12/765,606, filed Apr. 22, 2010, entitled "Arrays Of Vertically Stacked Tiers Of Non-Volatile Cross Point Memory Cells, Methods Of Forming Arrays Of Vertically Stacked Tiers Of Non-Volatile Cross Point Memory Cells, And Methods Of Reading A Data Value Stored By An Array Of Vertically Stacked Tiers Of Non-Volatile Cross Point Memory Cells", naming Sanh D. Tang and Gurtej S. Sandhu as inventors, the disclosure of which is incorporated by reference.

TECHNICAL FIELD

Embodiments disclosed herein pertain to arrays of vertically stacked tiers of non-volatile cross point memory cells, to methods of forming arrays of vertically stacked tiers of non-volatile cross point memory cells, and to methods of reading a data value stored by an array of vertically stacked tiers of non-volatile cross point memory cells.

BACKGROUND

Memory is one type of integrated circuitry and is used in computer systems for storing data. Memory is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore requires being refreshed/rewritten, and in many instances multiple times per second. Regardless, the smallest unit in each array is termed as a memory cell and is configured to retain or store memory in an least two different selectable states. In a binary system, the storage conditions are considered as either a "0" or a "1". Further, some individual memory cells can be configured to store more than two bits of information.

Integrated circuitry fabrication continues to strive to produce smaller and denser integrated circuits. Accordingly, the fewer components an individual circuit device has, the smaller the construction of the finished circuit can be. Likely the smallest and simplest memory cell is comprised of two conductive electrodes having a programmable material received there-between. Example materials include metal oxides which may or may not be homogenous, and may or may not contain other materials therewith. Regardless, the collective material received between the two electrodes is selected or designed to be configured in a selected one of at least two different resistive states to enable storing of information by an individual memory cell. When configured in one extreme of the resistive states, the material may have a high resistance to electrical current. In contrast in the other extreme, when configured in another resistive state, the material may have a low resistance to electrical current. Existing and yet-to-be developed memory cells might also be configured to have one or more additional possible stable resistive states in between a highest and a lowest resistance state. Regardless, the resistive state in which the programmable material is configured may be changed using electrical signals. For example, if the material is in a high-resistance state, the material may be configured to be in a low resistance state by applying a suitable voltage across the material.

The programmed resistive state is designed to be persistent in non-volatile memory. For example, once configured in a resistive state, the material stays in such resistive state even if neither a current nor a voltage is applied to the material. Further, the configuration of the material may be repeatedly changed from one resistance state to another for programming the memory cell into different of at least two resistive states. Upon such programming, the resistive state of the material can be determined by appropriate signals applied to one or both of the two electrodes between which the material is received.

BRIEF DESCRIPTION OF THE DRAWINGS

FIG. 7 is another alternate embodiment to that depicted by FIG. 5.

FIG. 8 is diagrammatic perspective view of portions of circuitry encompassing the embodiment of FIG. 5.

FIG. 9 is diagrammatic perspective view of portions of circuitry of the embodiment of FIGS. 1 and 2.

FIG. 10 is a diagrammatic perspective view of a semiconductor substrate fragment in process in accordance with an embodiment of the invention.

FIG. 33 is a diagrammatic perspective view of a semiconductor substrate fragment in process in accordance with an embodiment of the invention.

FIG. 34 is a view of the FIG. 33 substrate at a processing step subsequent to that shown by FIG. 33.

FIG. 35 is a view of the FIG. 34 substrate at a processing step subsequent to that shown by FIG. 34.

FIG. 36 is a view of the FIG. 35 substrate at a processing step subsequent to that shown by FIG. 35.

FIG. 37 is a diagrammatic perspective view of a semiconductor substrate fragment in process in accordance with an embodiment of the invention.

FIG. 38 is a view of the FIG. 37 substrate at a processing step subsequent to that shown by FIG. 37.

FIG. 39 is a diagrammatic perspective view of a semiconductor substrate fragment in process in accordance with an embodiment of the invention.

DETAILED DESCRIPTION OF EXAMPLE EMBODIMENTS

Figure 1:
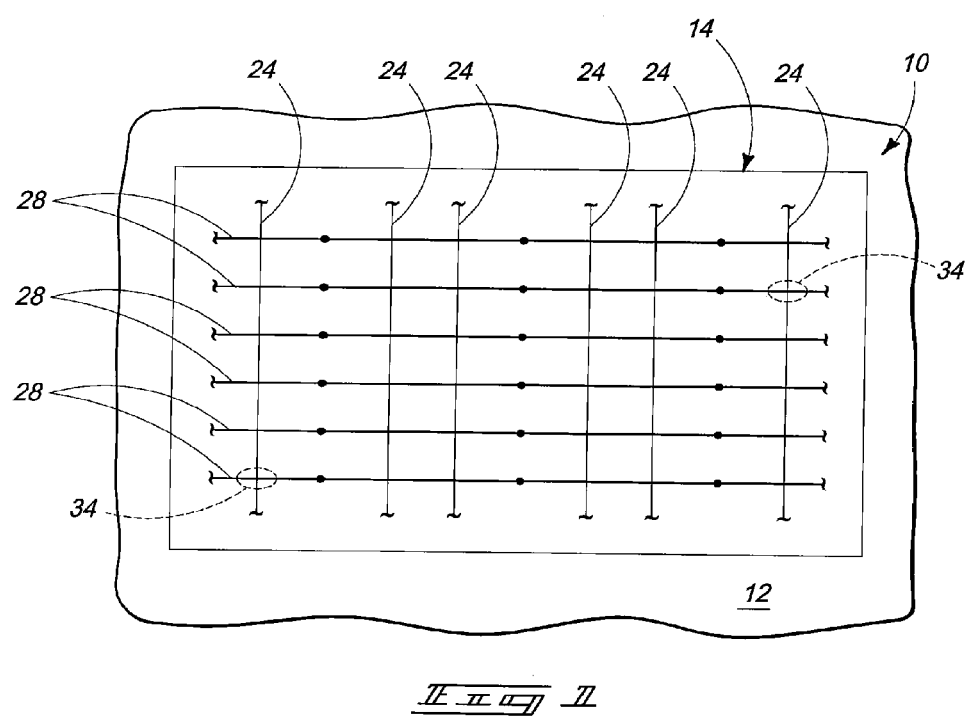
FIG. 1 is a diagrammatic top plan view of a substrate in accordance with an embodiment of the invention.
Figure 2:
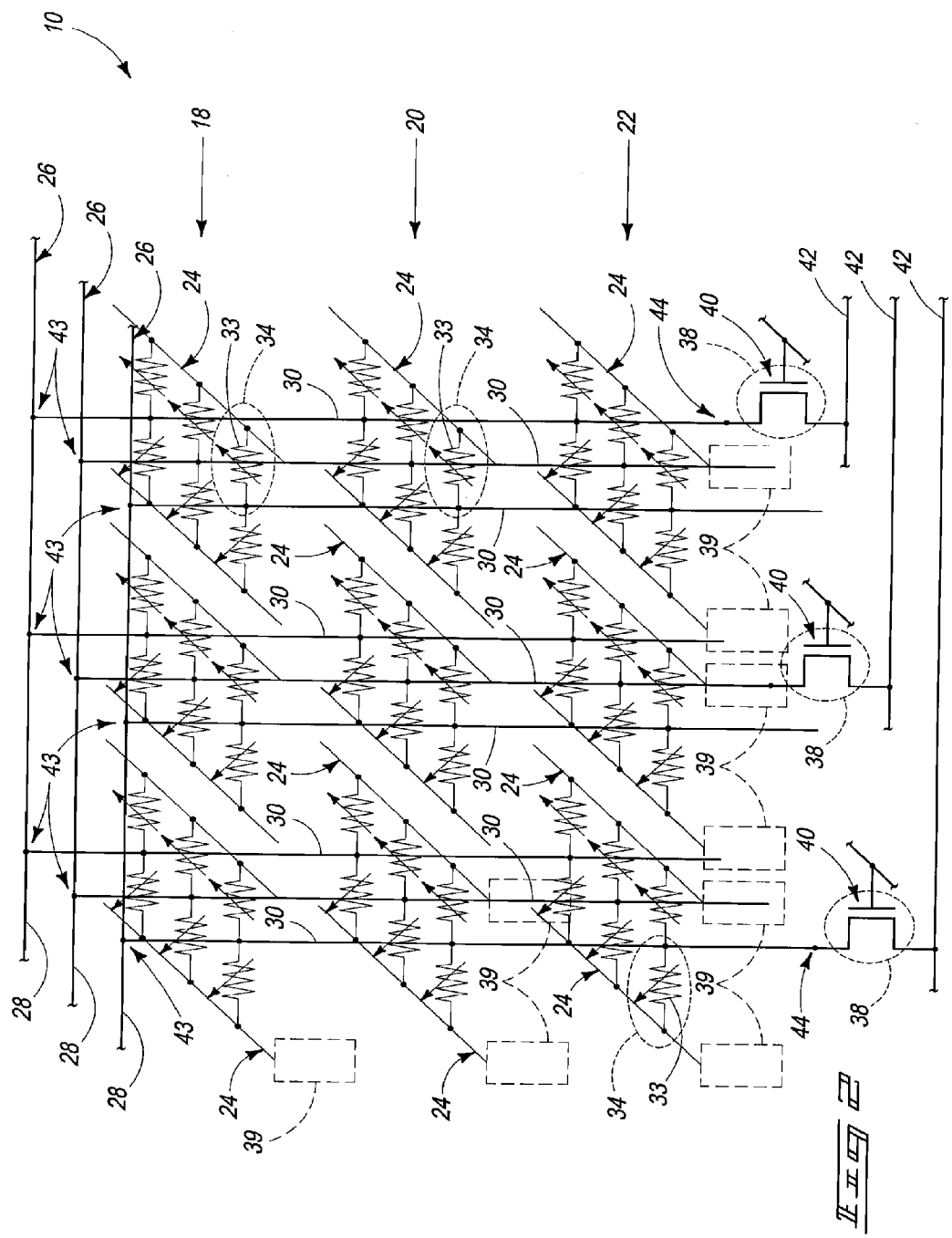
FIG. 2 is a diagrammatic schematic of an array of vertically stacked tiers of non-volatile cross point memory cells in accordance with FIG. 1 and an embodiment of the invention.

Embodiments of the invention encompass arrays of vertically stacked tiers of non-volatile cross point memory cells. Initial example such arrays are described with reference to FIGS. 1-7. Referring initially to FIGS. 1 and 2, an example array 10 is fabricated relative to a substrate 12. In one embodiment, substrate 12 comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 12 may be considered as having a primary elevationally outermost surface which can be considered to define a horizontal direction or orientation, with the direction orthogonal thereto defining a vertical direction or orientation. Such outermost surface may or may not be planar.

Memory cells of the array are fabricated within an array area 14 (FIG. 1). Logic circuitry would typically be fabricated outside of array area 14. Control and/or other peripheral circuitry for operating the memory array may or may not wholly or partially be received within array area 14, with such array area as a minimum encompassing all of the memory cells of a given array/sub-array. Further, multiple sub-arrays might also be fabricated and operated independently, in tandem, or otherwise relative one another. As used in this document, a "sub-array" may also be considered as an array.

Array 10 includes a plurality of tiers 18, 20, 22 of memory cells 34, with individual of the tiers comprising a plurality of horizontally oriented word lines 24. For simplicity of illustration, FIG. 2 depicts three tiers, although only two tiers or more than three tiers may be fabricated. Array 10 includes a plurality of bit lines 26 that individually comprise horizontally oriented global bit lines 28 having local vertical bit line extensions 30 extending therefrom through multiple of the tiers of memory cells. FIGS. 1 and 2 diagrammatically show only a few of such word lines and bit lines for clarity, with array 10 likely including thousands or millions of such. Further only three memory cells 34 are shown associated with the individual word line segments in FIG. 2, with the number of such likely being in the thousands or millions along a word line. Word lines 24 and global bit lines 28 may run perpendicular relative to one another (as shown in FIGS. 1 and 2), at one or more angles other than perpendicular relative to one another (not shown in FIGS. 1 and 2), or parallel relative one another (not shown in FIGS. 1 and 2). Further, global bit lines 28 need not be straight or run parallel relative to one another, nor do word lines 24 need to be straight or run parallel relative to one another. Further, bit lines 26 may include other extensions (not shown) beyond local vertical bit line extensions 30, and word lines 24 may comprise extensions (not shown).

Memory cells 34 individually comprise multi-resistive state material 33 which is received between one of the word lines 24 and one of the local vertical bit line extensions 30 where such cross with such comprising opposing conductive electrodes of an individual memory cell. Individual memory cells may encompass other devices, for example a diode, but will as a minimum comprise multi-resistive state material received between individual crossings of the word lines and local vertical bit line extensions. Example materials and example details of construction will be described subsequently.

In one embodiment, a plurality of bit line select circuits 38 individually electrically and physically connect to individual of local vertical bit line extensions 30 and are configured to supply a voltage potential to an individual of global horizontal bit lines 28. In one embodiment, a plurality of bit line select circuits 38 individually electrically and physically connect to individual of local vertical bit line extensions 30 and are configured to supply a voltage potential to multiple of local vertical bit line extensions 30. Bit line select circuits 38 may be as simple as a single electronic device, for example the depicted field effect transistor 40, or may encompass multiple electronic devices. Bit line select circuits 38 may be received partially or wholly within array area 14, or partially or wholly outside of array area 14.

In one embodiment, individual bit line select circuits 38 are configured to supply a voltage potential to multiple of local vertical bit line extensions 30 through individual of the global horizontal bit lines from which the individual local vertical bit line extension 30 extends. For example, conductive lines 42 are shown electrically connecting with bit line select circuits 38. Such may be received partially or wholly within array area 14, or partially or wholly outwardly thereof. Regardless, such may be provided at a selected voltage potential with bit line select circuit 38 operated to supply a voltage potential to the local vertical bit line extension 30 to which such connects. Such voltage potential is supplied to multiple other of the local vertical bit line extensions 30 connected to the same global bit line 28 through such global bit line. In one embodiment, and as shown, individual global bit lines 28 have only a single bit line select circuit 38 that electrically connects thereto through only a single vertical bit line extension 30. Alternately, individual of the global bit lines may have more than one (not shown) bit line select circuit 38 connected therethrough through multiple vertical bit line extensions 30.

A plurality of row decode select circuits 39 individually electrically connect with individual of word lines 24. Alternate configurations are contemplated. Regardless, row decode select circuits 39 may comprise one or more individual electronic components/devices.

Figure 3:
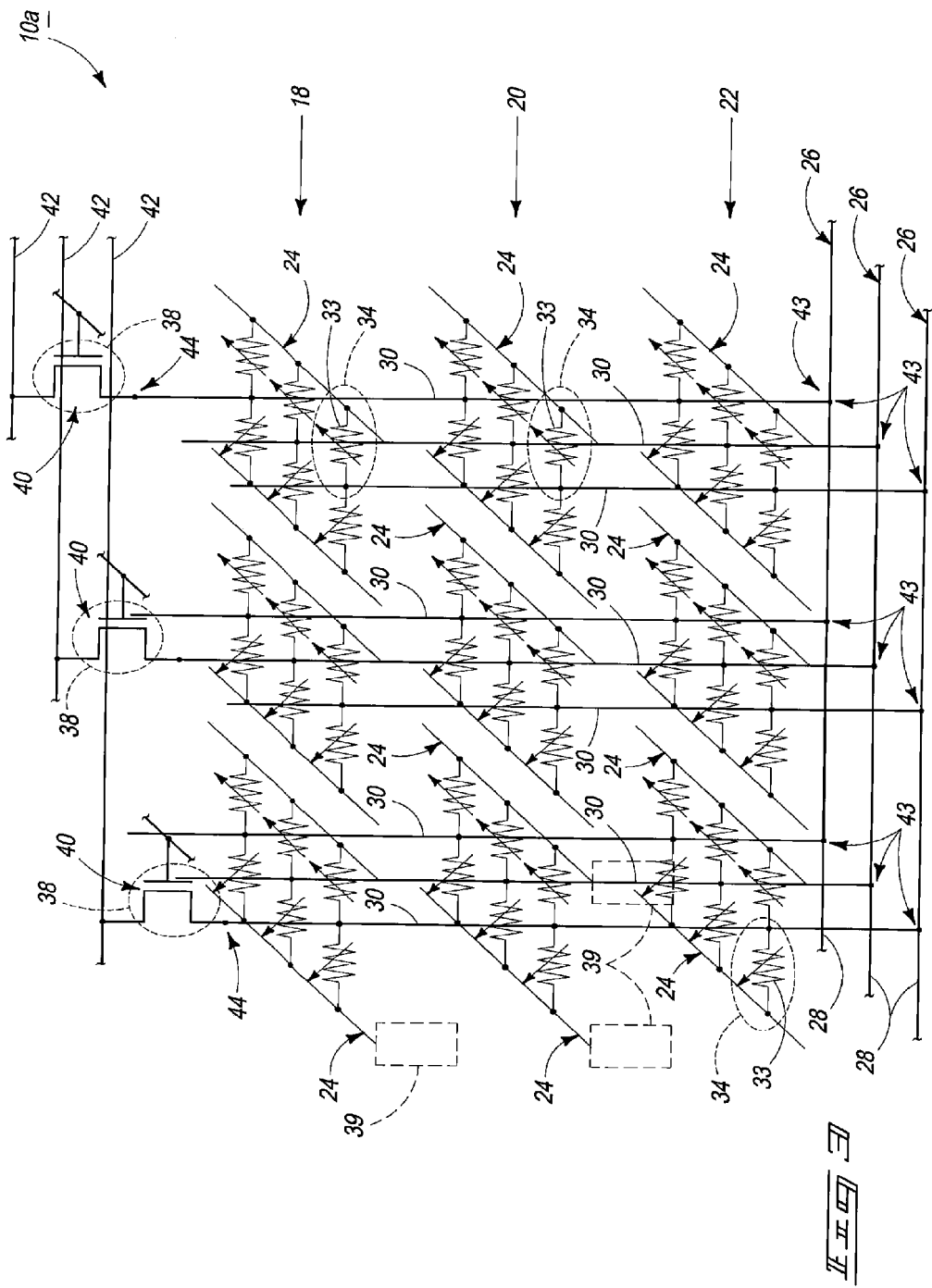
FIG. 3 is an alternate embodiment to that depicted by FIG. 2.

In one embodiment, individual of local vertical bit lines 30 have two opposing longitudinal ends 43, 44 one of which (end 43) electrically and physically connects with one of horizontal global bit lines 28. In one embodiment, individual of bit line select circuits 38 physically connect with the other end (end 44) of two longitudinal ends 43, 44 of individual of local vertical bit line extensions 30. Regardless, in one embodiment, at least one of tiers 18, 20, 22 of memory cells 34 is received elevationally between individual of the global horizontal bit lines 28 and the physical connection of individual of the bit line select circuits 38 with individual of local vertical bit line extensions 30. In one embodiment, and as shown, all tiers 18, 20, 22 of memory cells 34 are received elevationally between individual of global horizontal bit lines 28 and physical connection of individual of the bit line select circuits 38 with individual local vertical bit line extensions 30. Regardless, FIG. 2 depicts one example embodiment wherein the global horizontal bit lines 28 are received elevationally outward of tiers 18, 20, 22 of memory cells 34. FIG. 3 depicts an alternate example embodiment array 10a wherein global horizontal bit lines 28 are received elevationally inward of tiers 18, 20, 22 of memory cells 34.

Figure 4:
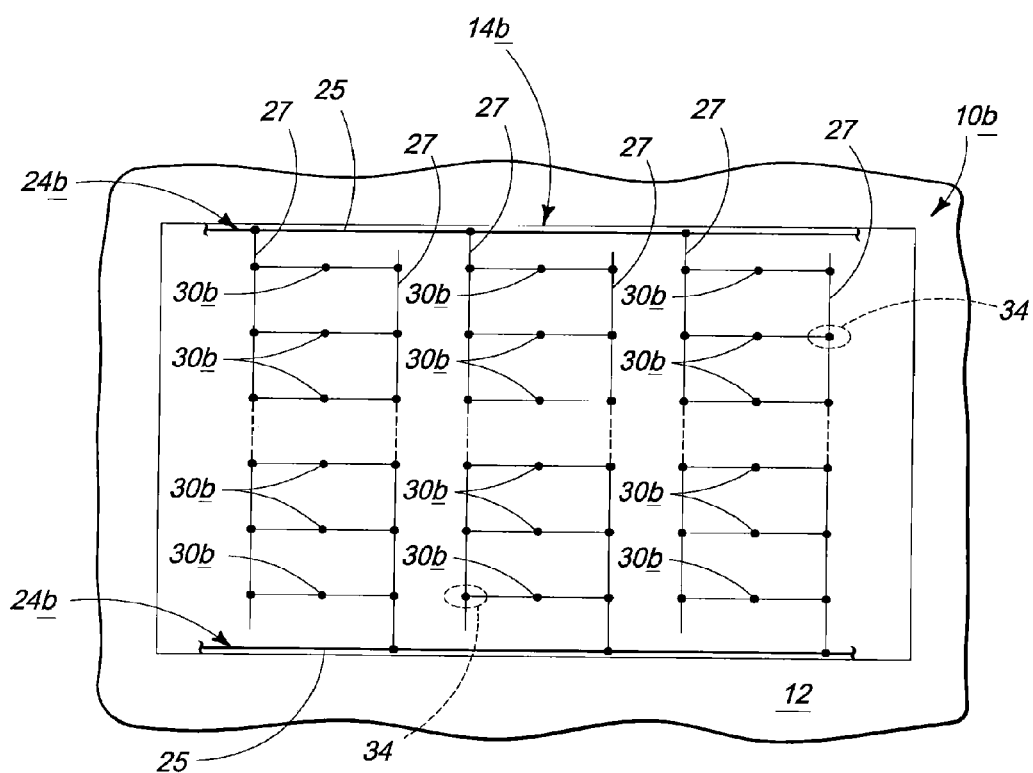
FIG. 4 is a diagrammatic top plan view of another substrate in accordance with an embodiment of the invention.

Another embodiment array 10b of vertically stacked tiers of non-volatile cross point memory cells is described with reference to FIGS. 4 and 5. Like numerals from the above-described embodiments have been used where appropriate, with differences being indicated with the suffix "b" or with different numerals. In array 10b, horizontally oriented word lines 24b within individual tiers 18, 20, 22 comprise global horizontal word lines 25 having local horizontal word line extensions 27. The local horizontal word line extensions respectively extend from the global horizontal word lines at an angle (not at 180°), and in one embodiment as shown may extend orthogonally from the global horizontal word lines. In one embodiment, the individual of tiers 18, 20 and 22 comprise two global horizontally oriented word lines 25 individually adjacent opposite sides of the array and from which local horizontal word line extensions 27 extend. In one embodiment and as shown, local horizontal word line extensions 27 extend from one of the two global horizontal word lines 25 across the array within an individual tier toward the other of two global word lines 25 in the individual tier. In one embodiment and as shown, local horizontal word line extensions 27 extending from the two global word lines 25 alternate with the local horizontal word line extensions 27 extending from the other of two global word lines 25 within an individual of the tiers. Regardless, in one embodiment, individual of tiers 18, 20, 22 contain no more than two global word lines. By way of example, FIG. 4 depicts two horizontal global word lines 25 which are individually adjacent opposite sides of array 10b within array area 14b. Thousands or millions of memory cells 34 would likely be associated with each local horizontal word line extension 27.

In one embodiment and as shown, array 10b has two, and only two, row decode select circuits 39 within an individual of tiers 18, 20, 22. Regardless, in one embodiment, array 10b comprises a plurality of local vertical bit line extension select circuits 45 individually, electrically, and physically connected between an individual of global horizontal bit lines 28b and an individual of local vertical bit line extensions 30b connected therewith. Such may be encompassed by one or more electronic devices received wholly or partially within array area 14b, or wholly or partially outside of array area 14b. FIG. 5 depicts bit line extension select circuits 45 as comprising a field effect transistor 47 having a control gate line 29.

Figure 5:
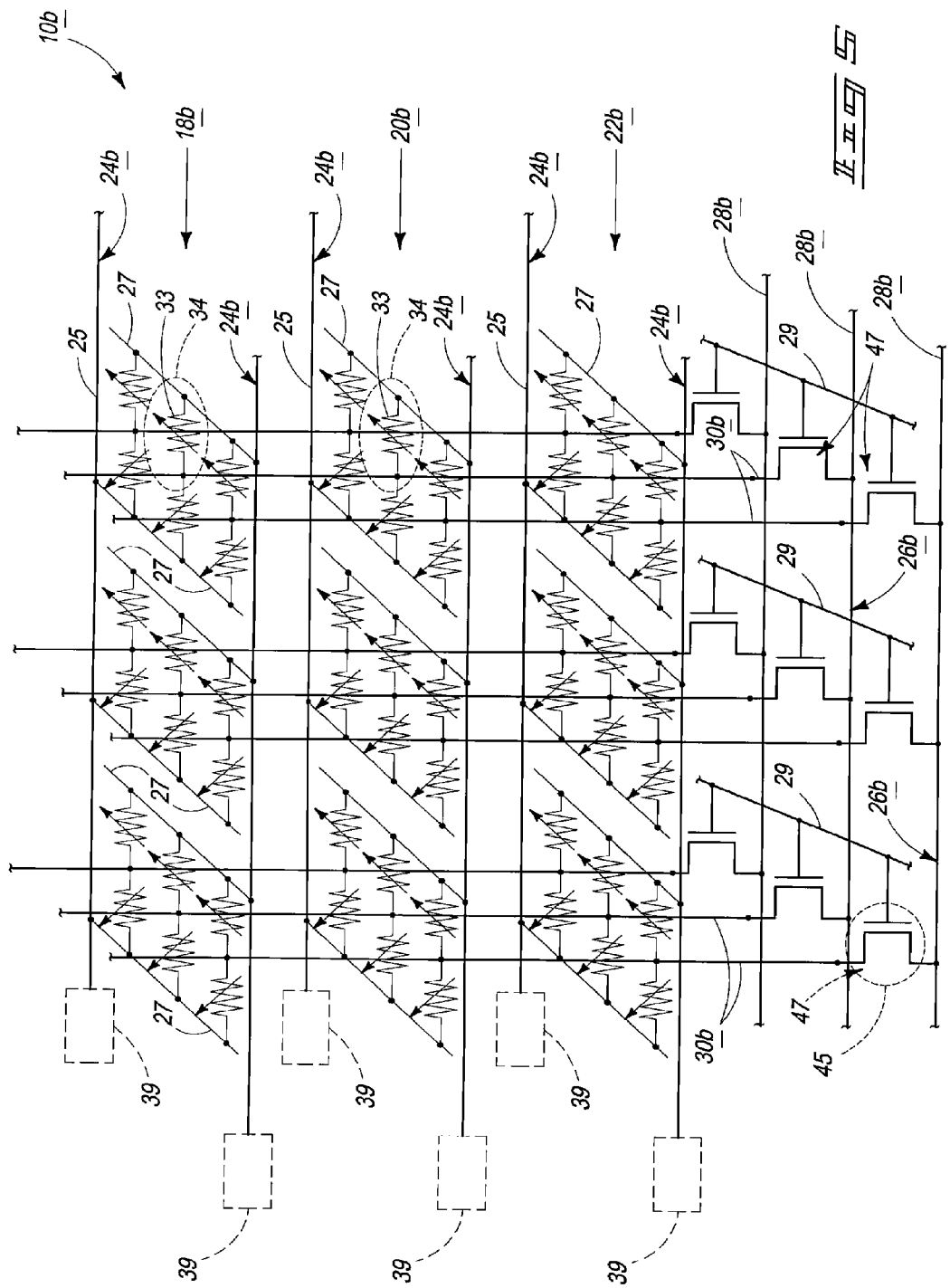
FIG. 5 is diagrammatic schematic of an array of vertically stacked tiers of non-volatile cross point memory cells in accordance with FIG. 4 and an embodiment of the invention.
Figure 6:
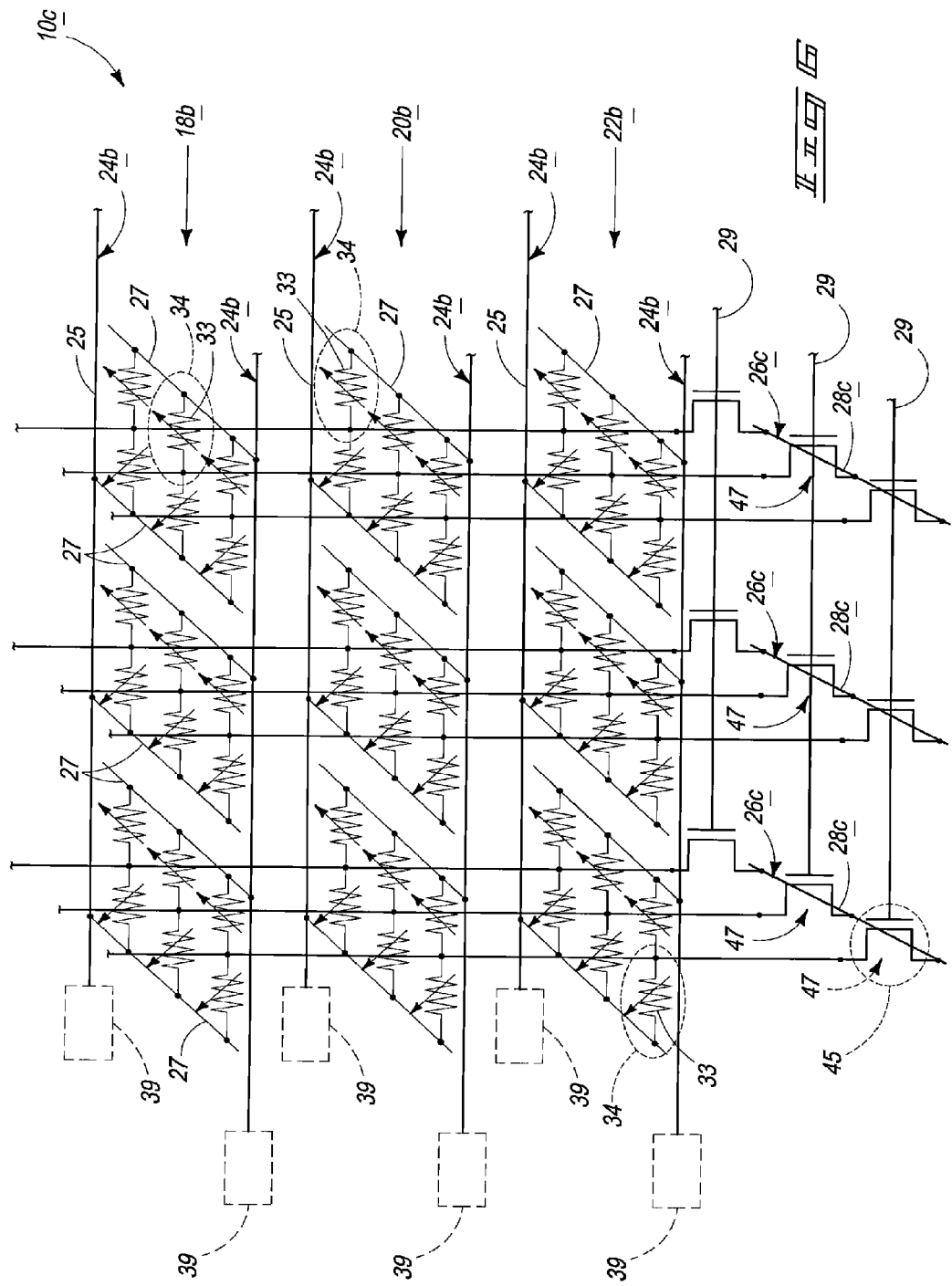
FIG. 6 is an alternate embodiment to that depicted by FIG. 5.

FIGS. 4 and 5 depict an example embodiment wherein global word lines 25 run parallel relative to one another within a tier and global bit lines 28b run parallel relative to one another, and also wherein global word lines 25 run parallel with/relative to global bit lines 28b. FIG. 6 is intended to depict an alternate embodiment array 10c wherein global word lines 25 run perpendicular to global bit lines 28c. Like numerals from the above-described embodiments have been used where appropriate, with differences being indicated with the suffix "c".

The embodiments of FIGS. 4-6 depict the global bit lines and associated local vertical bit line extension select circuits 45 received elevationally inward of the tiers of memory cells. Alternately, such could be received elevationally outward (not shown) of the tiers of memory cells, for example analogous to the alternate embodiments of FIGS. 2 and 3. Further, the embodiments of FIGS. 2 and 3 may incorporate word lines having global horizontally oriented word lines with local horizontal word line extensions extending there-from, for example in manners somewhat similar to that described immediately above with respect to the FIGS. 4-6 embodiments.

An embodiment of the invention encompasses an array of vertically stacked tiers of non-volatile cross point memory cells. Such array comprises a plurality of horizontally oriented word lines independent of whether an individual tier comprises a plurality of such word lines and independent of whether any individual of the horizontally oriented word lines comprises global horizontal word lines having local horizontal word line extensions extending therefrom. Regardless, such array comprises a plurality of horizontally oriented global horizontal bit lines having local vertical bit line extensions extending through multiple tiers of memory cells. Individual of the memory cells comprise multi-resistive state material received between one of the horizontally oriented word lines and one of the local vertical bit line extensions where such cross. Such array includes at least one, and no more than two, row decode select circuits for individual of the tiers. By ways of example only, the embodiments of FIGS. 4-6 depict example such circuitry wherein two and only two row decode select circuits are provided for individual of the tiers. Alternate circuitry comprising two and only two row decode select circuits for the individual tiers is also contemplated.

FIG. 7 depicts an alternate embodiment array 10d which comprises only one row decode select circuit for individual of the tiers. Like numerals from the above-described embodiments had been utilized where appropriate, with differences being indicated with the suffix "d". By way of examples only, the embodiments of FIGS. 1-6 may be considered as forming individual memory cells on opposing sides of the local vertical bit line extensions. Array 10d of FIG. 7 only uses one side of individual local vertical bit line extensions in an individual tier, and only a single row decode select circuit 39 for each tier. Alternate constructions may be used. Further, FIG. 7 is analogous to the FIG. 5 layout, although the FIG. 6 or alternate layouts could of course be used.

An embodiment of the invention encompasses a method of reading a data value stored by an array of vertically stacked tiers of non-volatile cross point memory cells, wherein individual of the memory cells comprise multi-resistive state material received between a word line and a bit line where such cross. Such a method encompasses pulling one of a plurality of horizontally oriented word lines within individual tiers of memory cells to a first voltage potential. One of a plurality of horizontally oriented global bit lines having local vertical bit line extensions extending through multiple of the tiers of memory cells is electrically connected to a voltage source via one of the vertical bit line extensions, thereby pulling the one bit line to a second voltage potential. Based upon the pulling of the one of the horizontally oriented word lines to the first voltage potential and the pulling of the one of the horizontally oriented global bit lines to the second voltage potential, a data value stored by one of the memory cells of the array is determined.

In one embodiment, the determining of the data value is based on a current flowing through the one of the memory cells, with the current resulting from a difference between the first voltage potential and the second voltage potential. In one embodiment, the first voltage potential is greater than the second voltage potential. In one embodiment, the electrically connecting to a voltage source is with only one of the local vertical bit line extensions. In one embodiment, a bit line select circuit is physically connected between the one local vertical bit line extension and the voltage source, with the stated electrically connecting being accomplished at least in part by operation of the bit line select circuit. By ways of example only, any of the embodiments of this paragraph and the immediately preceding paragraph may be conducted using the circuitry embodiments of FIGS. 1-3.

In another embodiment, one of a plurality of vertically oriented local vertical bit line extensions of a plurality of horizontally oriented global bit lines is pulled to a first voltage potential. The vertically oriented bit line extensions extend through individual tiers of memory cells. One of a plurality of horizontally oriented global word lines is pulled to a second voltage potential. The global word lines have horizontally oriented local word line extensions which cross more than one of the plurality of vertically oriented bit line extensions. Based on the pulling of the one of the local vertical bit line extensions to the first voltage potential and the pulling of the one of the global word lines to the second voltage potential, a data value stored by one of the memory cells of the array is determined.

In one embodiment, the one local vertical bit line extension may be considered as a first local vertical bit line extension and the one of the memory cells may be considered as a first memory cell positioned between the local vertical bit line extension and one of the local horizontal word line extensions. While the first local vertical bit line extension is being pulled to the first voltage potential and the one of the horizontally oriented global word lines is being pulled to the second voltage potential, a second one of the local vertical bit line extensions is pulled to the first voltage potential. Based on the pulling of the second one of the local vertical bit line extensions to the first voltage potential and the pulling of the one of the global bit lines to the second voltage potential, a data value stored by the second one of the memory cells positioned between the second local vertical bit line extension and the one local horizontal word line extension is determined.

In one embodiment, the local word line extensions run parallel relative to one another. In one embodiment, the second voltage potential is greater than the first voltage potential. In one embodiment, the determining of the data value is based on a current flowing through the one of the memory cells. By ways of example only, any of the embodiments of this paragraph and the immediately preceding two paragraphs may be conducted using the circuitry embodiments of FIGS. 4-7.

As used herein, pulling a conductive node to a voltage potential refers to causing the conductive node to be at or very close to the voltage potential. The voltage potential may be positive or negative and may have substantially any magnitude. For example, the voltage potential may be ground. In pulling a conductive node to a voltage potential, it is to be understood that individual voltage potentials measured at various locations of the conductive node might not be exactly the same due to, for example, the resistance of the conductive node itself. However, the individual voltage potentials may be substantially the same since the individual voltage potentials may be as close to the voltage potential as the physical limitations of the conductive node will allow. In some instances, the conductive node may be connected directly to a voltage source having the voltage potential. For example, a bit line (including any extensions of the bit line) may be pulled to ground by connecting the bit line (and/or one or more of any extensions of the bit line) to ground, or a word line (including any extensions of the word line) may be pulled to 3.5 volts by connecting the word line (and/or one or more of any extensions of the word line) to a voltage source of 3.5 volts. Additionally or alternatively, the conductive node may be pulled to a voltage potential by circuitry intermediate the conductive node and a voltage source, such as a sense amplifier.

FIG. 8 diagrammatically depicts a portion of an example substrate 50 comprising components in accordance with the FIG. 6 schematic. Such is highly diagrammatic and only shows a broken portion of a single tier 20 for clarity in the drawings. Field effect transistors 47 of local vertical bit line extension select circuits 45 are shown as respective vertically oriented transistors having a wrap-around control gate line 29. Field effect transistors 47 respectively have an example source 37, a channel 39, and a drain 41, with local vertical bit line extensions 30b electrically connecting with individual of drains 41. Only a single row of local vertical bit line extensions 30b is shown in FIG. 8 for clarity. Global horizontal bit lines 28c electrically connect with sources 37 of individual field effect transistors 47, with the structure as shown being elevationally supported over an example insulative dielectric 43. Other layers of circuitry components may of course be fabricated below or within dielectric 43, as well as circuit components fabricated above the depicted upper ends of local vertical bit line extensions 30b.

FIG. 9 diagrammatically shows a portion of an alternate embodiment substrate 50a fabricated in accordance with the FIGS. 1 and 2 schematic. Like numerals from the FIG. 8 embodiment have been used where appropriate, with differences being indicated with the suffix "a". None of tiers 18, 20, 22 is shown, with only a single bit line 28 and a single local vertical bit line extension 30 being shown for clarity. Field effect transistor 40 of bit line select circuit 38 includes a source 37a, a channel 39a, and a drain 41a. A wrap-around gate construction (not shown) may be used proximate channel region 39a analogous to the gate structure 29 of FIG. 8.

Example constructions of arrays of vertically stacked tiers of non-volatile cross point memory cells and methods of fabricating such are next described with reference to FIGS. 10-32. Like numerals from the above-described embodiments have been used where appropriate. Referring to FIG. 10, an example construction 54 includes an elevationally inner dielectric 56 having alternating rows of different composition materials 57, 58 formed thereover. In one embodiment, material 58 is insulative. Example materials 56 and 58 include doped or undoped silicon dioxide, and an example material 57 comprises silicon nitride. In one embodiment, material 57 will be wholly or at least mostly sacrificial within the array. Layers 57 as depicted correspond with tiers 18, 20, and 22 where memory cells and horizontally oriented word lines will be formed. An additional outer tier 16 is used in one embodiment, as will be apparent in the continuing discussion. An additional inner tier (not numerically designated) is received between tier 22 and dielectric 56. Fewer or more than the depicted tiers may be used, and tier 16 is not required in all embodiments. An example thickness range for each of layers 57 and 58 is 50 nanometers, with the elevationally outermost insulative layer 58 being thicker than the other layers 58, for example of a thickness from 65 to 100 nanometers. An etch stop capping layer 60 has been formed over elevationally outermost insulative layer 58, with undoped polysilicon deposited to a thickness of 30 nanometers being an example.

Figure 11:
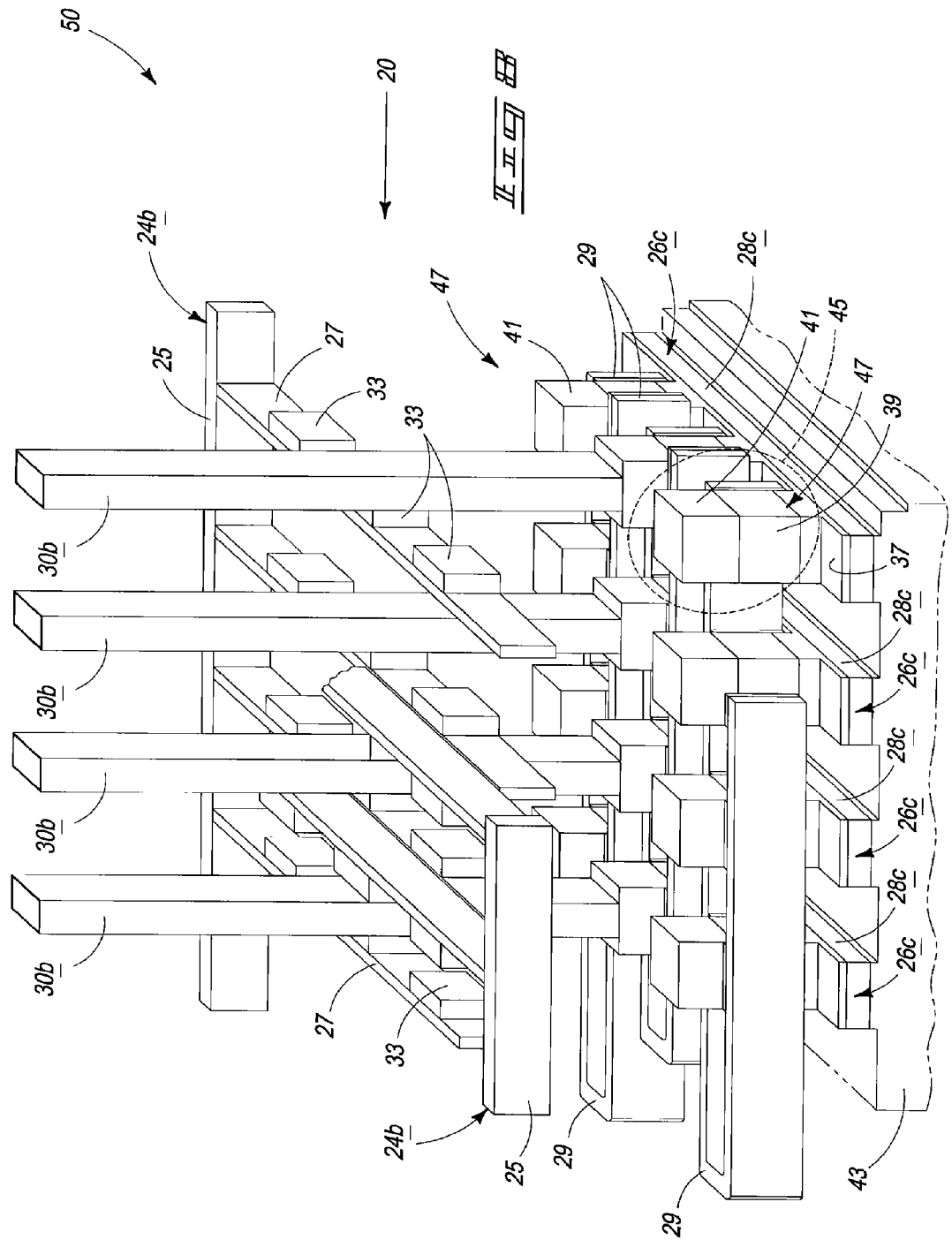
FIG. 11 is a view of the FIG. 10 substrate at a processing step subsequent to that shown by FIG. 10.
Figure 11:
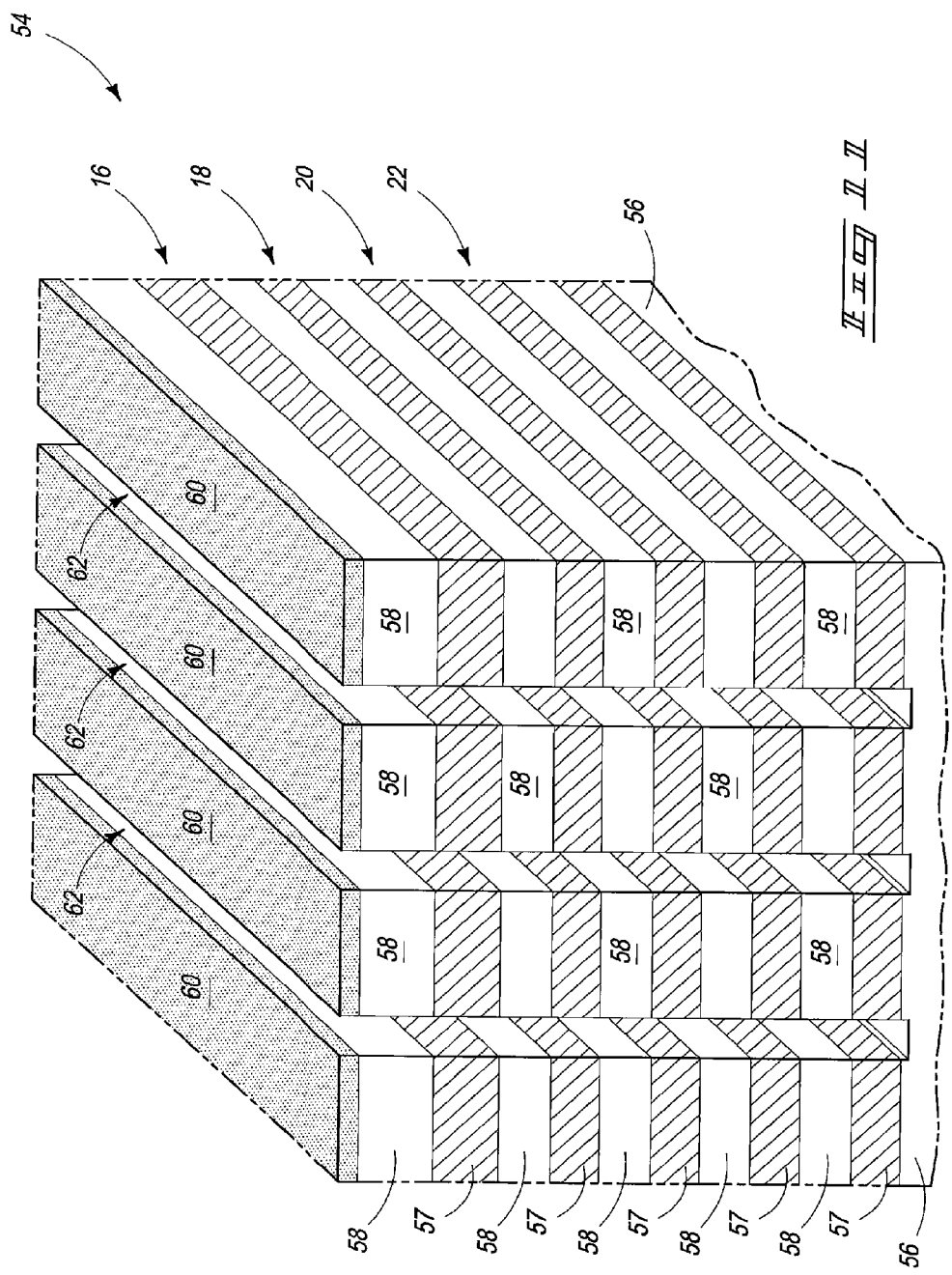

Referring to FIG. 11, horizontally elongated trenches 62 have been formed within insulative material 58 and through material 57. Such may be formed initially using a suitable mask (not shown) over material 60 to form the depicted trench mask openings 62 in material 60, and then using suitable alternating dry anisotropic etching chemistries to etch materials 58 and 57. In one embodiment, trenches 62 have a minimum lateral width of F, with the material immediately between adjacent of trenches 62 having a lateral thickness/width of 3F. Pitch multiplication may or may not be used. In one example, the mask used for producing the FIG. 11 pattern might initially be fabricated to provide 2F width of openings for each of the trenches and material between immediately adjacent trenches, with the trench openings subsequently being reduced in size by a 1F thickness deposition, thereby increasing the width of the material between the trenches to 3F.

Figure 12:
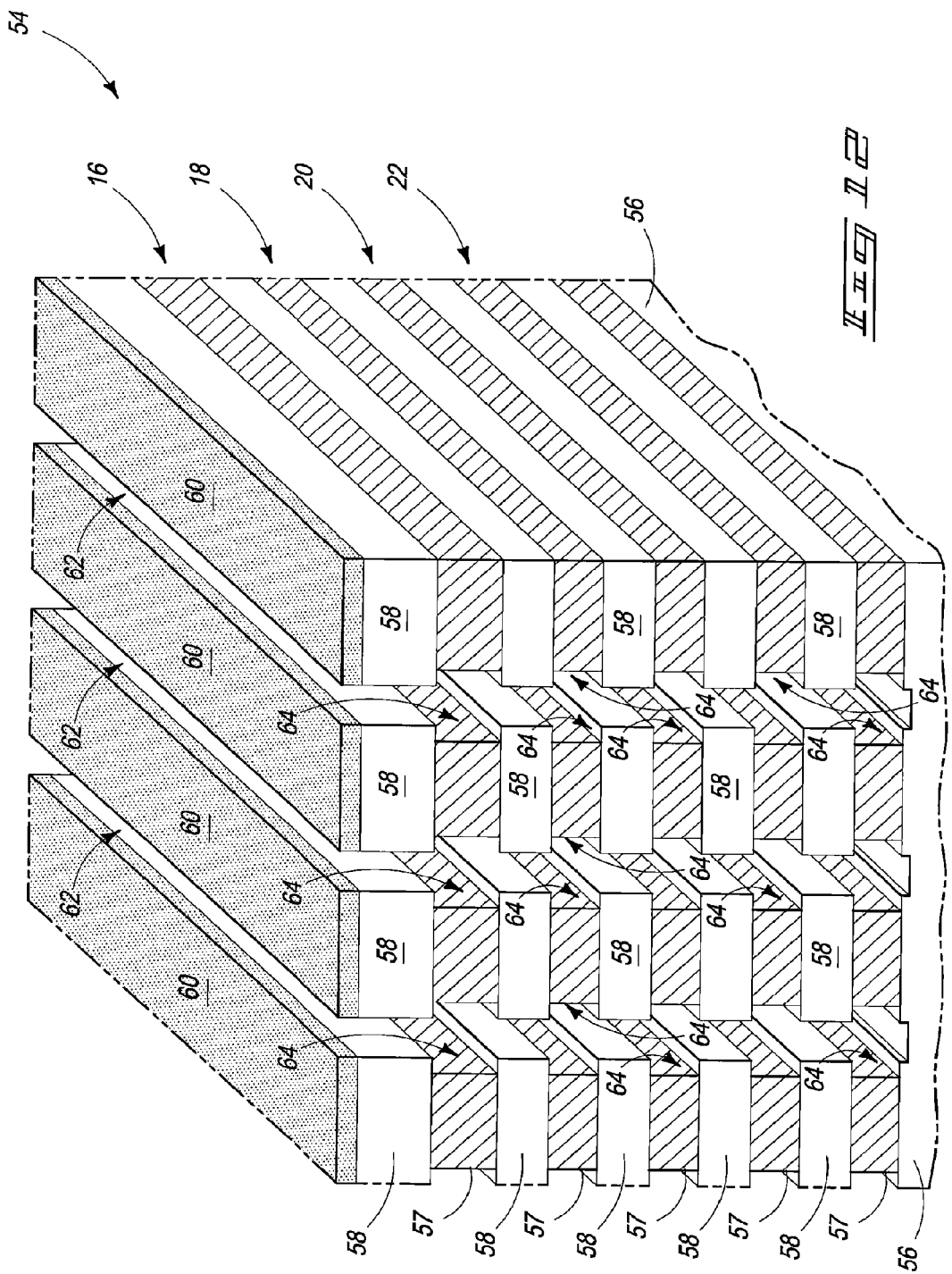
FIG. 12 is a view of the FIG. 11 substrate at a processing step subsequent to that shown by FIG. 11.

Referring to FIG. 12, lateral recesses 64 have effectively been formed within insulative material 58 within trenches 62. Such may be formed, for example, by isotropic wet etching material 57. For example where material 57 comprises silicon nitride, such may be isotropically etched highly selectively relative to an example insulative silicon dioxide material 58. Accordingly, lateral recesses 64 may effectively be formed within insulative material 58 with little or no etching thereof. In the context of this document, a "selective" etch requires removal of one material relative to another at a rate of at least 1.5:1. An example depth of lateral recess of material 57 relative to the example vertical sidewalls of material 58 of trenches 62 is 25 nanometers.

Figure 13:
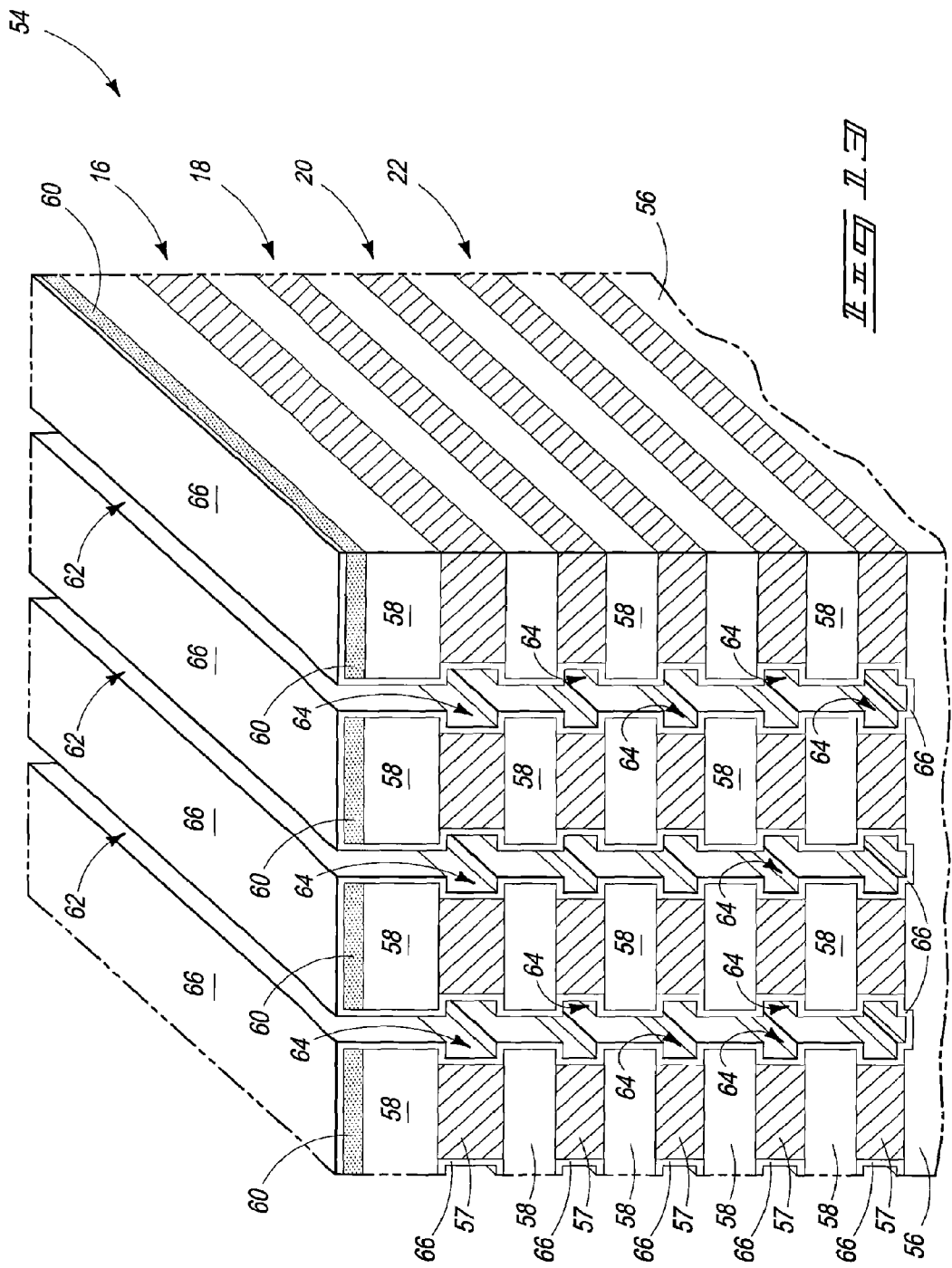
FIG. 13 is a view of the FIG. 12 substrate at a processing step subsequent to that shown by FIG. 12.

Referring to FIG. 13, trenches 62 and lateral recesses 64 have been lined with a first conductive material 66. An example material is platinum, for example in any one or combinations of elemental, alloy, or compound forms. An example thickness is from 10 nanometers to 15 nanometers and ideally is ineffective to fill or pinch-off between the tiers.

Figure 14:
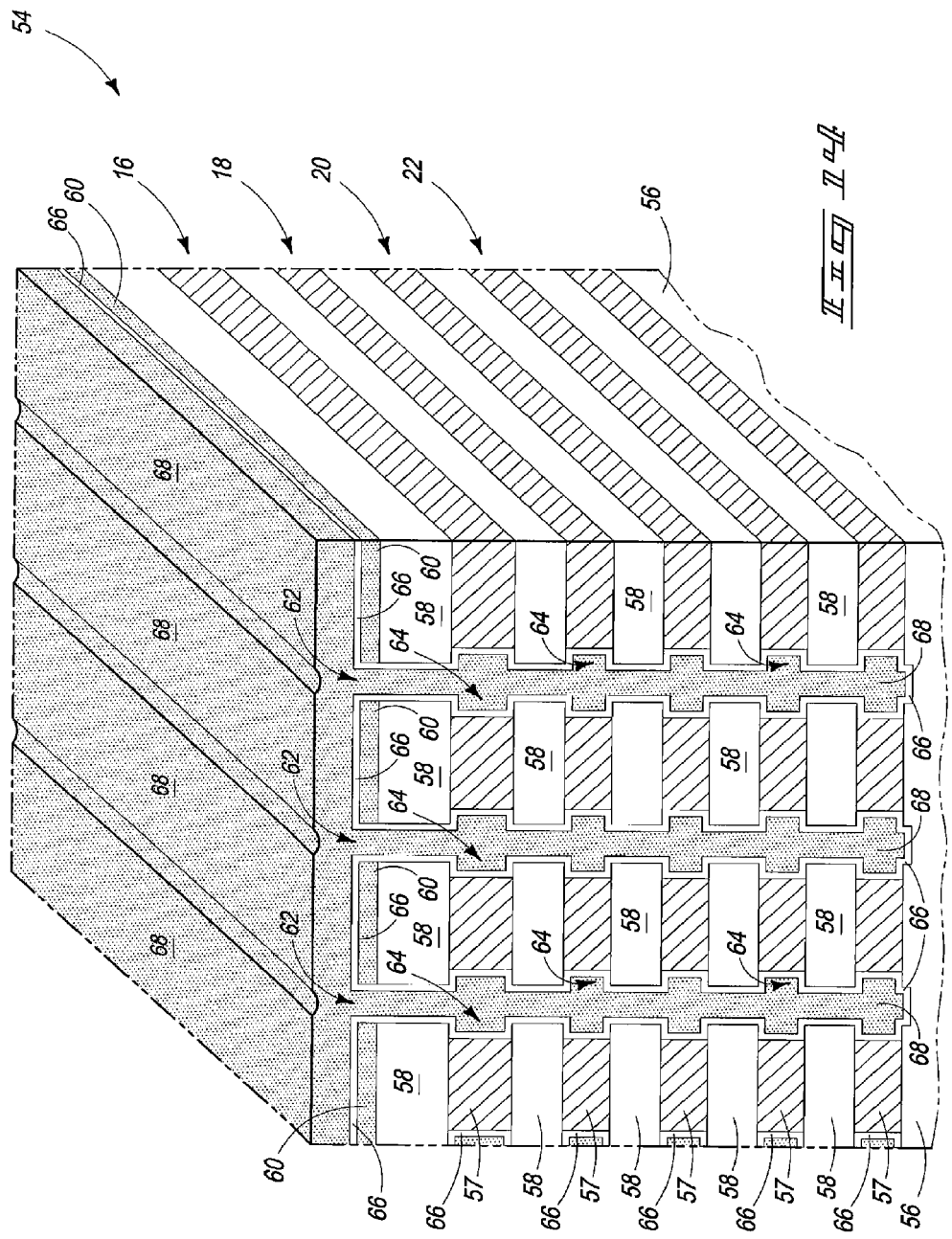
FIG. 14 is a view of the FIG. 13 substrate at a processing step subsequent to that shown by FIG. 13.

Referring to FIG. 14, lined trenches 62 and lined lateral recesses 64 have been filled with a second conductive material 68 which is different in composition from that of first conductive material 66. An example second conductive material is conductively doped polysilicon, although other metal or nonmetal-containing conductive materials may be used.

Figure 15:
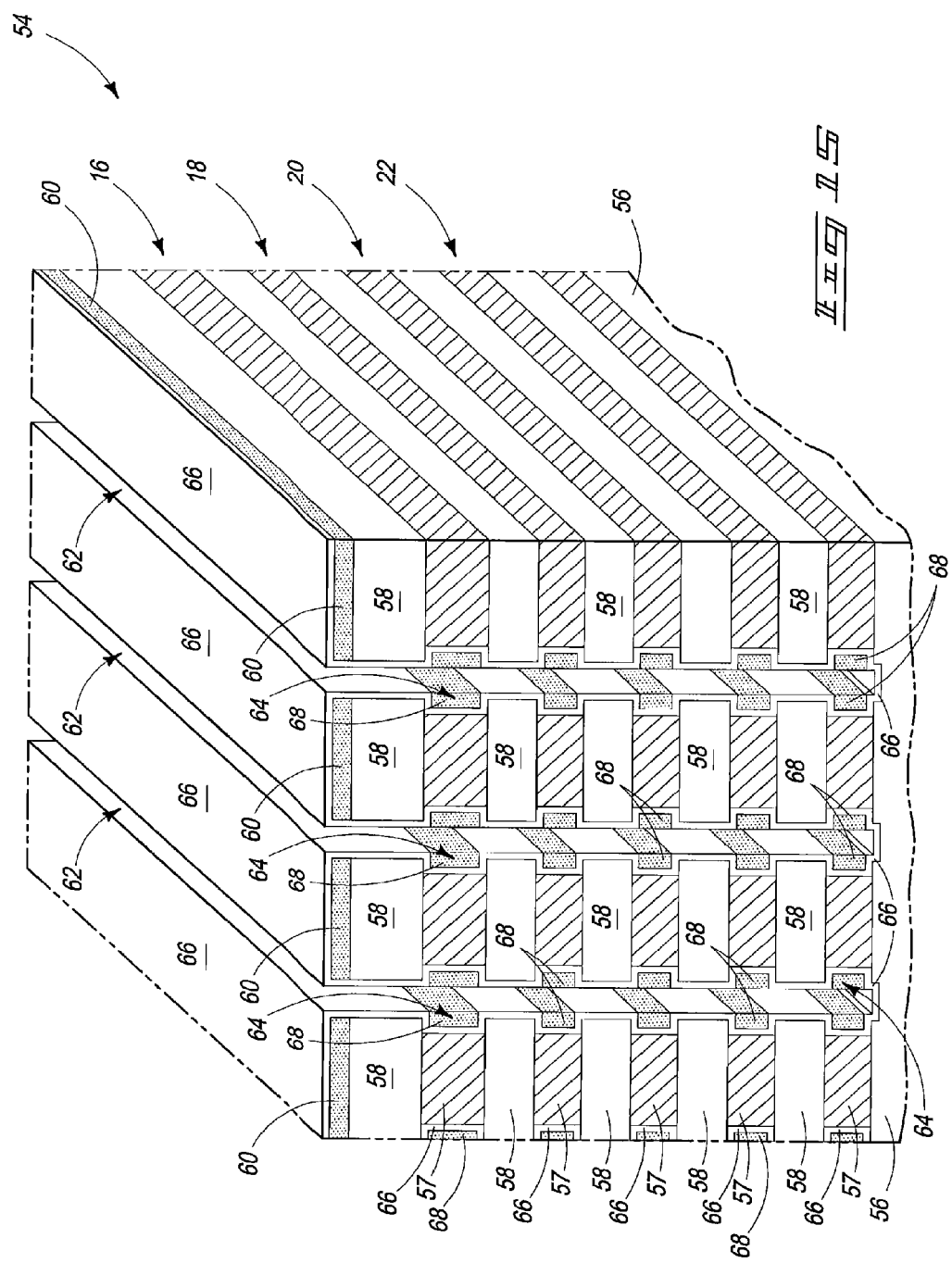
FIG. 15 is a view of the FIG. 14 substrate at a processing step subsequent to that shown by FIG. 14.

Referring to FIG. 15, second conductive material 68 has been etched within trenches 62 selectively relative to first conductive material 66 to leave second conductive material 68 within, at least, lined lateral recesses 64. In one embodiment, such etching is conducted to be anisotropic, for example as shown.

Figure 16:
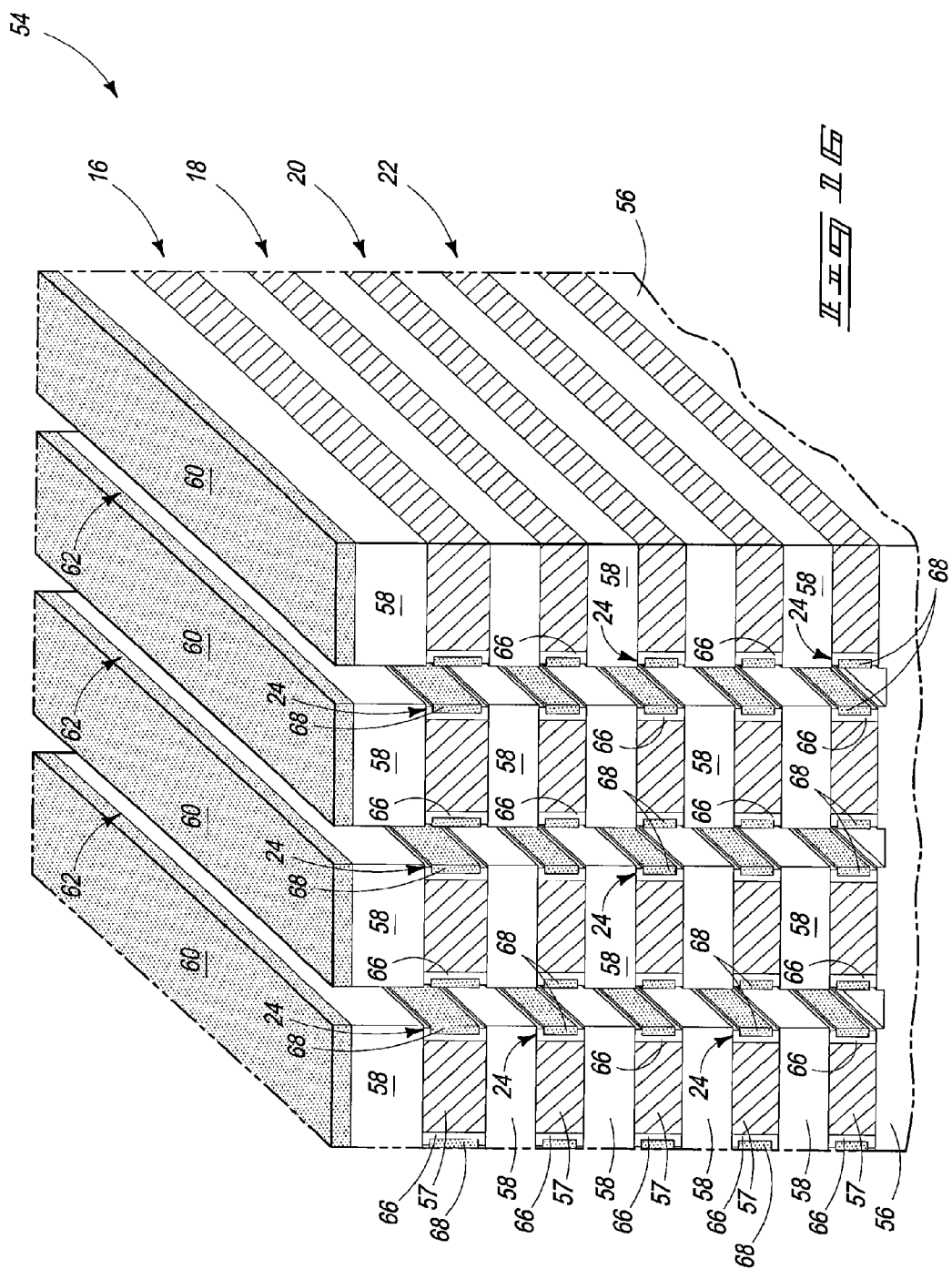
FIG. 16 is a view of the FIG. 15 substrate at a processing step subsequent to that shown by FIG. 15.

Referring to FIG. 16, first conductive material 66 has been etched selectively relative to second conductive material 68 to remove first conductive material 66 from being received over sidewalls of trenches 62 defined by material 58 between the tiers. Thereby, in one embodiment, a plurality of horizontally oriented word lines 24 are formed within individual of tiers 16, 18, 20 and 22 which comprise first conductive material 66 and second conductive material 68. The depicted word lines which are formed may or may not comprise either of a global horizontal word line and/or a local horizontal word line extension extending from a global horizontal word line. In one embodiment, the etching of first conductive material 66 is conducted isotropically, and in one example is conducted wet. For example, with respect to a predominantly platinum-comprising first conductive material 66, a suitable isotropic etching chemistry to produce the FIG. 16 construction comprises an aqueous etching solution comprising $HNO_3$ and HCl. Lateral recessing, as shown, may occur of first conductive material 66 relative to sidewalls of trenches 62 and, if so, may increase word line resistance due to reduction of the higher conductive platinum versus the example conductively doped polysilicon material 68 in an example finished word line construction. Regardless, the etching of first conductive material 66 may also etch second conductive material 68 laterally to some degree.

The above description with respect to FIGS. 10-16 is but one example embodiment of forming multiple tiers that individually comprise a plurality of horizontally oriented word lines. In one embodiment, an elevationally outermost tier 16 of tiers 16, 18, 20 and 22 will comprise dummy horizontally oriented word lines 24 that are non-functional within the array in a finished circuitry construction. In one embodiment, the dummy word lines are taller than the word lines of an immediately next elevationally inner of the tiers, and in one embodiment taller than all elevationally inner of the word lines.

Regardless, in one embodiment, word lines 24 are of a conductively filled C-shape in a vertical cross section. An outline of the C-shape comprises one conductive material 66, with a central portion of the C-shape being filled with another conductive material 68 of different composition from the one conductive material 66. Materials 66 and 68 may or may not, respectively, be homogenous. Regardless, in one embodiment, conductive material 66 is of higher conductivity than conductive material 68. In one embodiment and as shown, the etching of first conductive material 66 laterally recesses first conductive material 66 relative to sidewalls of second conductive material 68 which is within the central portion of the C-shape outline defined by first material 66. In one embodiment and as shown, second conductive material 68 extends laterally outward of the C-shape outline defined by first material 66.

Figure 17:
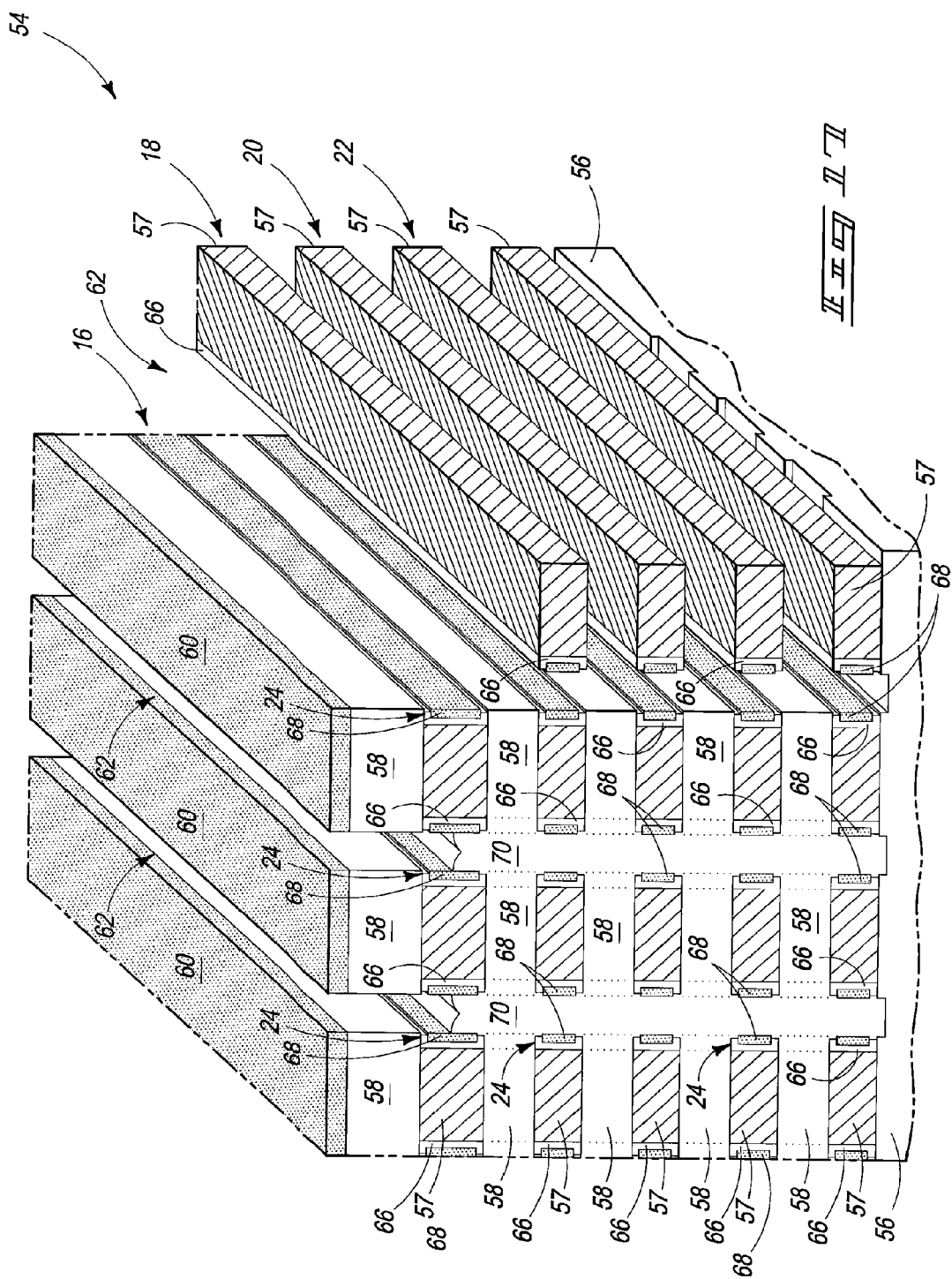
FIG. 17 is a view of the FIG. 16 substrate at a processing step subsequent to that shown by FIG. 16.

Referring to FIG. 17, trenches 62 in one embodiment have been overfilled with a material 70, for example silicon dioxide, which has then been recessed back by etching to have an elevationally outermost surface received within the elevational confines of dummy tier 16. In one embodiment, such is conducted selectively relative to etch stop layer 60. In FIG. 17 and subsequent figures, various materials are not shown in the right-most portion of the view for clarity in the construction. For example, material 60, top tier 16 and material 58 are not shown in the right-most portion.

Figure 18:
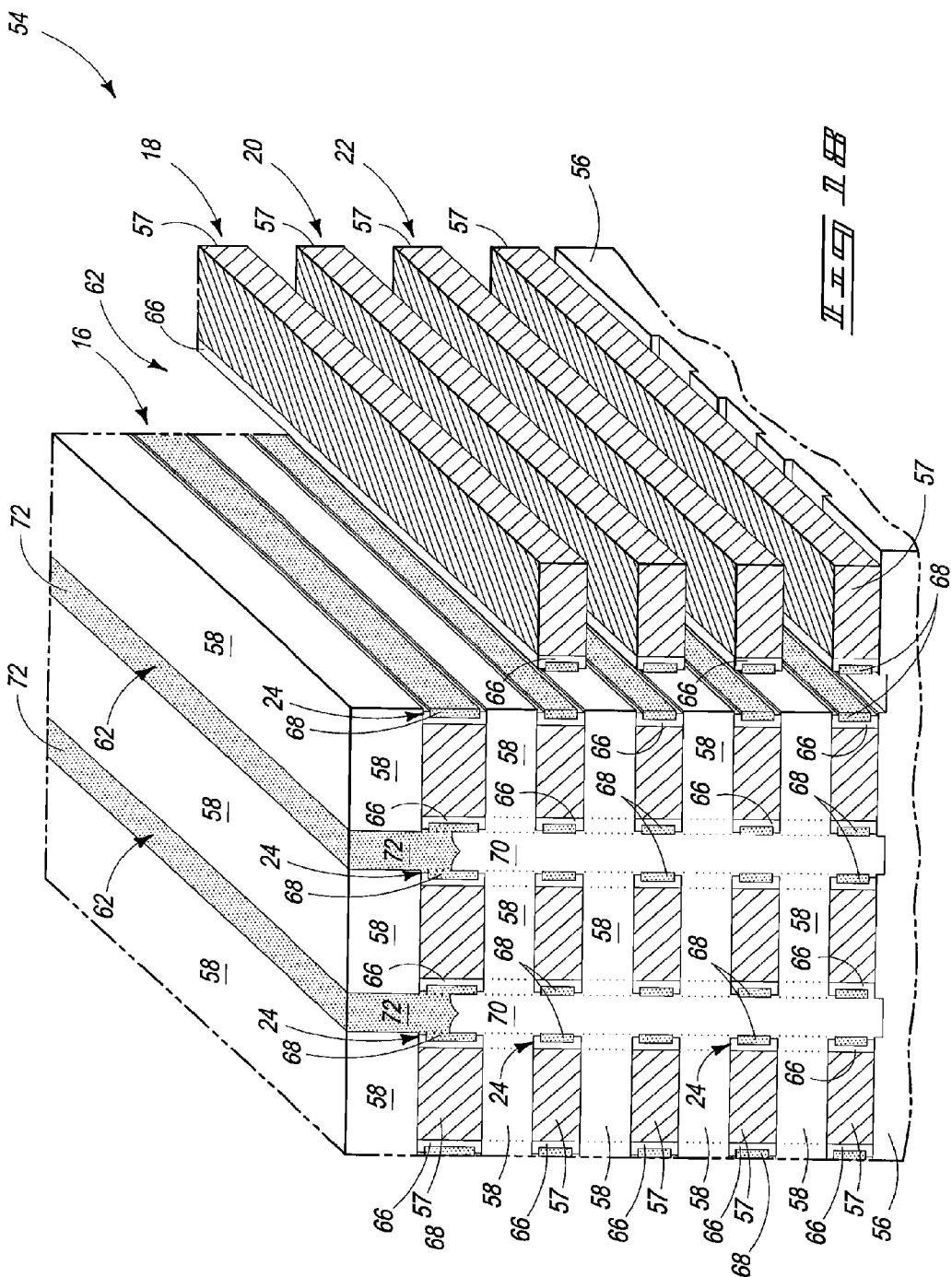
FIG. 18 is a view of the FIG. 17 substrate at a processing step subsequent to that shown by FIG. 17.

Referring to FIG. 18, a material 72, for example the same as that of etch stop layer 60 (not shown), has been deposited to overfill remaining volume of trenches 62. Subsequently, materials 72 and 60 have been planarized back at least to the elevationally outermost surface of outermost material 58.

Figure 19:
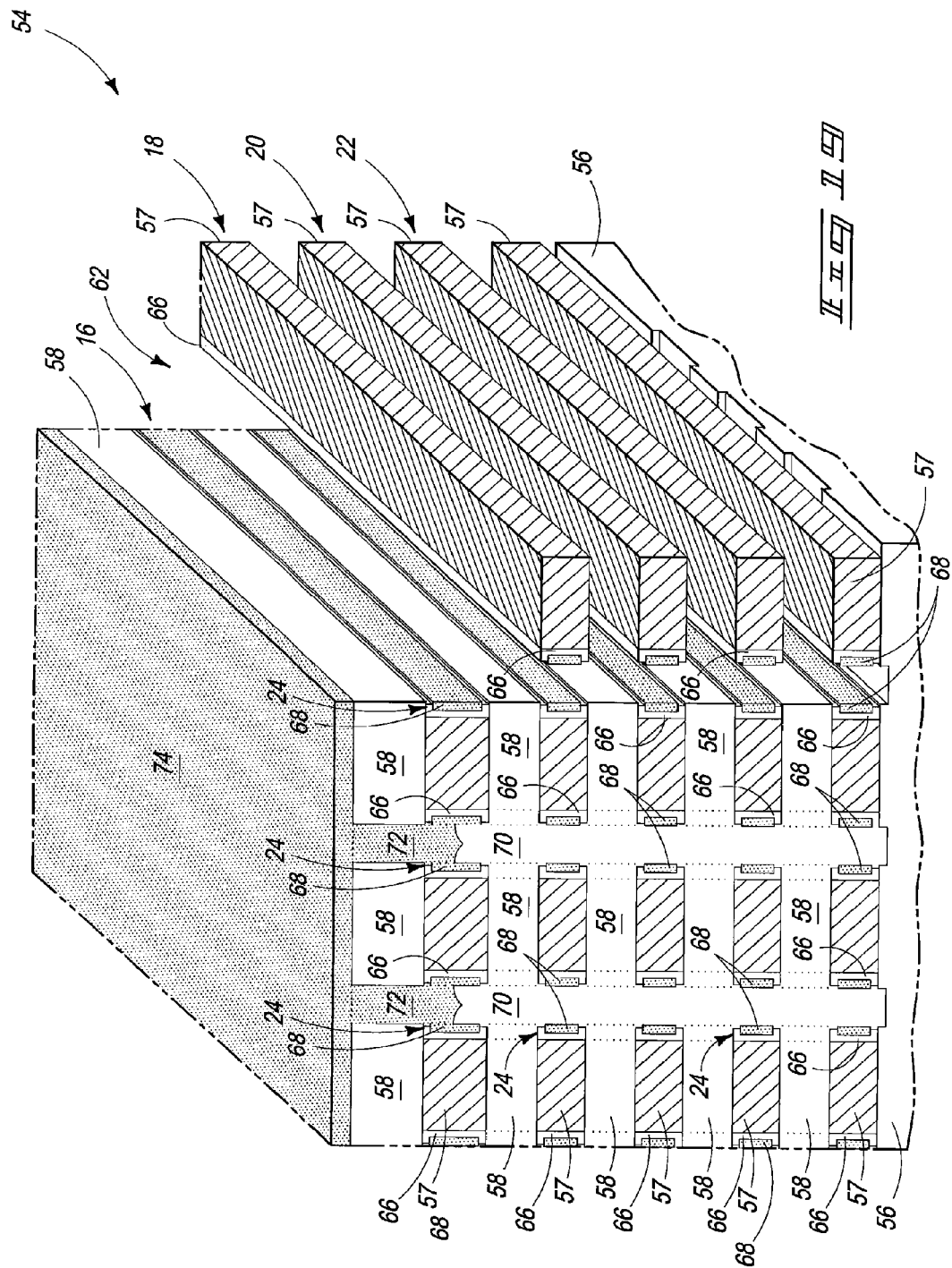
FIG. 19 is a view of the FIG. 18 substrate at a processing step subsequent to that shown by FIG. 18.

Referring to FIG. 19, another etch stop layer 74, for example of the same composition as that of material 72 (i.e., polysilicon), has been deposited. An example thickness is 30 nanometers.

Figure 20:
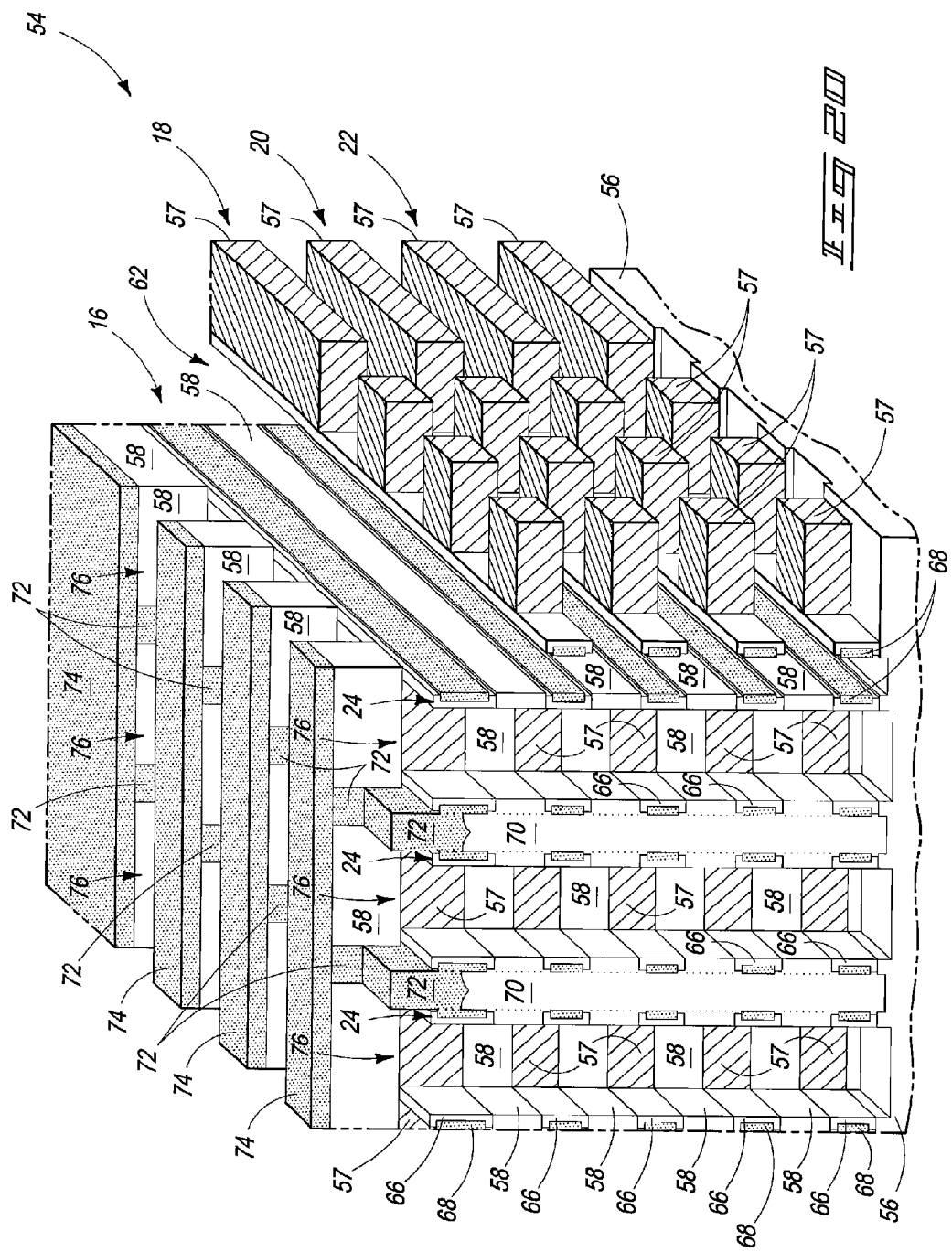
FIG. 20 is a view of the FIG. 19 substrate at a processing step subsequent to that shown by FIG. 19.

Referring to FIG. 20, a trench mask pattern (not shown) has been used to etch the depicted longitudinally elongated trenches through materials 74 and 58. The material 74 and 58 between such longitudinal trenches is effectively used as a mask to etch openings 76 into materials 57 and 58 therebelow selectively relative to horizontally oriented word lines 24. Etching chemistry may be altered to etch materials 57 and 58 selectively relative to each other and other exposed materials to extend openings 76 down to dielectric 56. In one embodiment, openings 76 are so etched using dummy horizontally oriented word lines 24 within elevationally outermost tier 16 as a hardmask to horizontally oriented word lines received elevationally inward thereof. In one embodiment, the dummy word lines 24 within tier 16 comprise elevationally outermost surfaces comprising platinum which may function as a good hard-masking material in conducting conventional dry anisotropic selective etches in separately etching silicon dioxide and silicon nitride. Regardless, blocks of material 57 are formed within the array.

Figure 21:
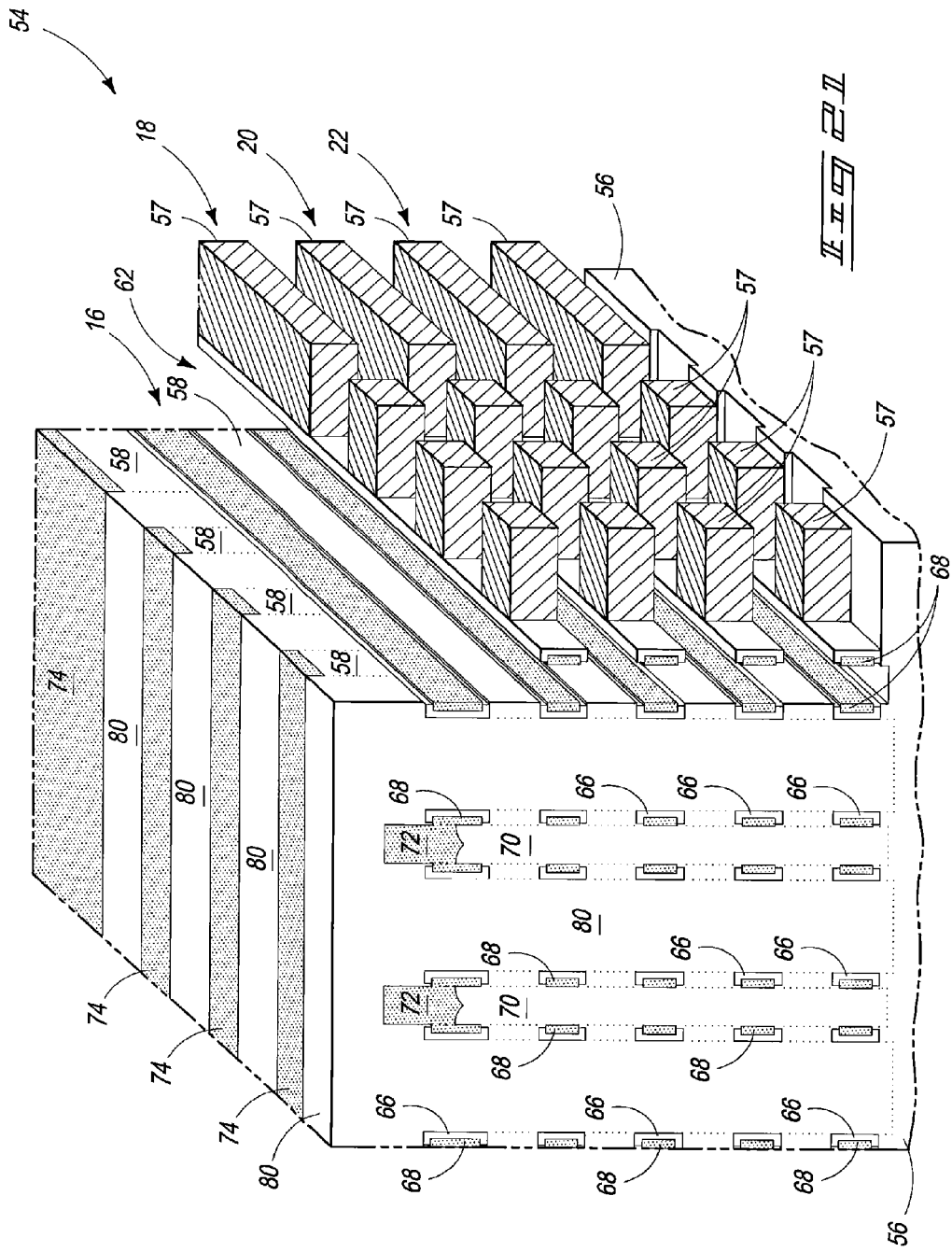
FIG. 21 is a view of the FIG. 20 substrate at a processing step subsequent to that shown by FIG. 20.

Referring to FIG. 21, insulative material 80 has been deposited to overfill the depicted trenches and openings, and planarized back at least to elevationally outermost surfaces of material 74. Material 80 may or may not be the same composition as material 58. Material 80 would also fill the depicted right-illustrated portion of FIG. 21 but, again, is not shown for clarity. Such provides but one example embodiment of effectively encapsulating spaced sacrificial blocks 78 within insulative material, for example insulative materials 80 and 58.

Figure 22:
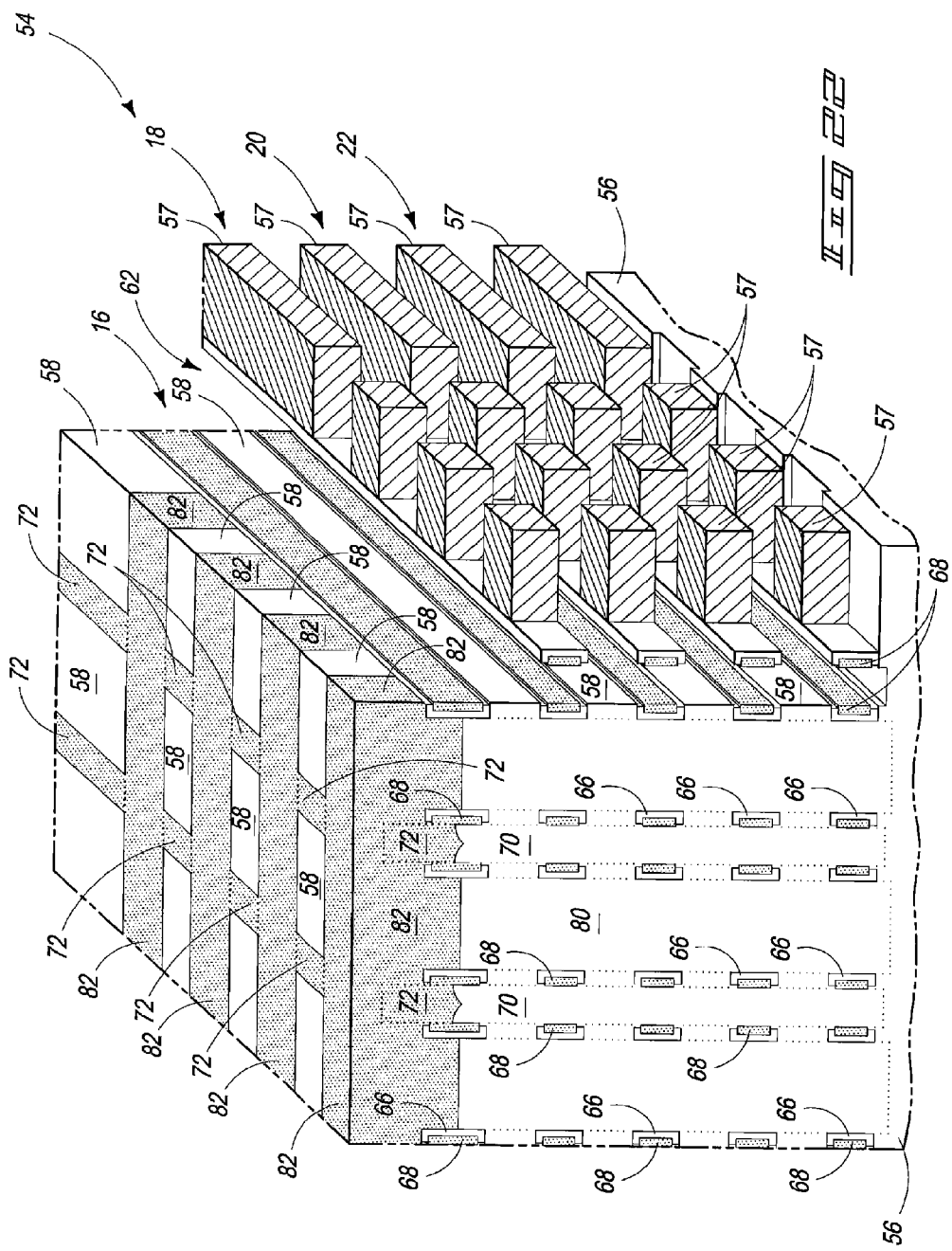
FIG. 22 is a view of the FIG. 21 substrate at a processing step subsequent to that shown by FIG. 21.

Referring to FIG. 22, the hard-masking has been inverted by recessing oxide material 80 selectively relative to polysilicon material 74 (not shown), followed by deposition of polysilicon, followed by polysilicon planarization at least to the elevationally outermost surfaces of material 58.

Figure 23:
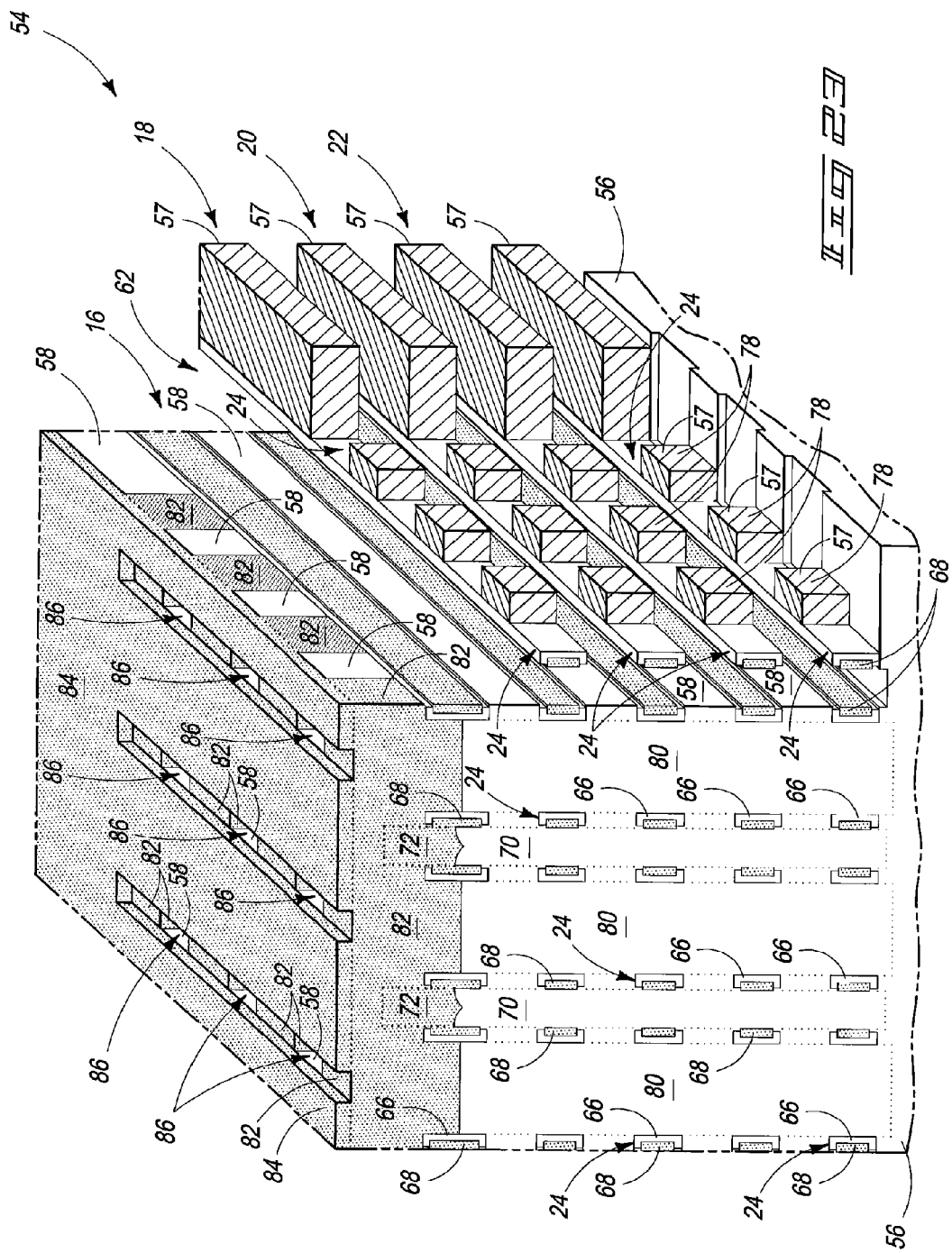
FIG. 23 is a view of the FIG. 22 substrate at a processing step subsequent to that shown by FIG. 22.

Referring to FIG. 23, another etch stop layer 84, for example of the same composition of material 82 (i.e., polysilicon), has been deposited to an example thickness of 30 nanometers. With materials 84, 82, 72 and 68 used as etch stopping/hardmask materials, a mask (not shown) has been used to etch openings 86 into materials 58 and 80. In one embodiment, such etching of openings 86 is conducted anisotropically. Regardless, in one embodiment, the processing depicted through FIG. 23 is but one example of forming of a plurality of sacrificial spaced blocks 78 adjacent horizontal word lines 24. Sacrificial blocks 78 may comprise, consist of, or consist essentially of any one or combination of insulative, conductive, or semiconductive materials. In one embodiment and as shown, spaced sacrificial blocks 78 may be formed to comprise rectangular faces.

Figure 24:
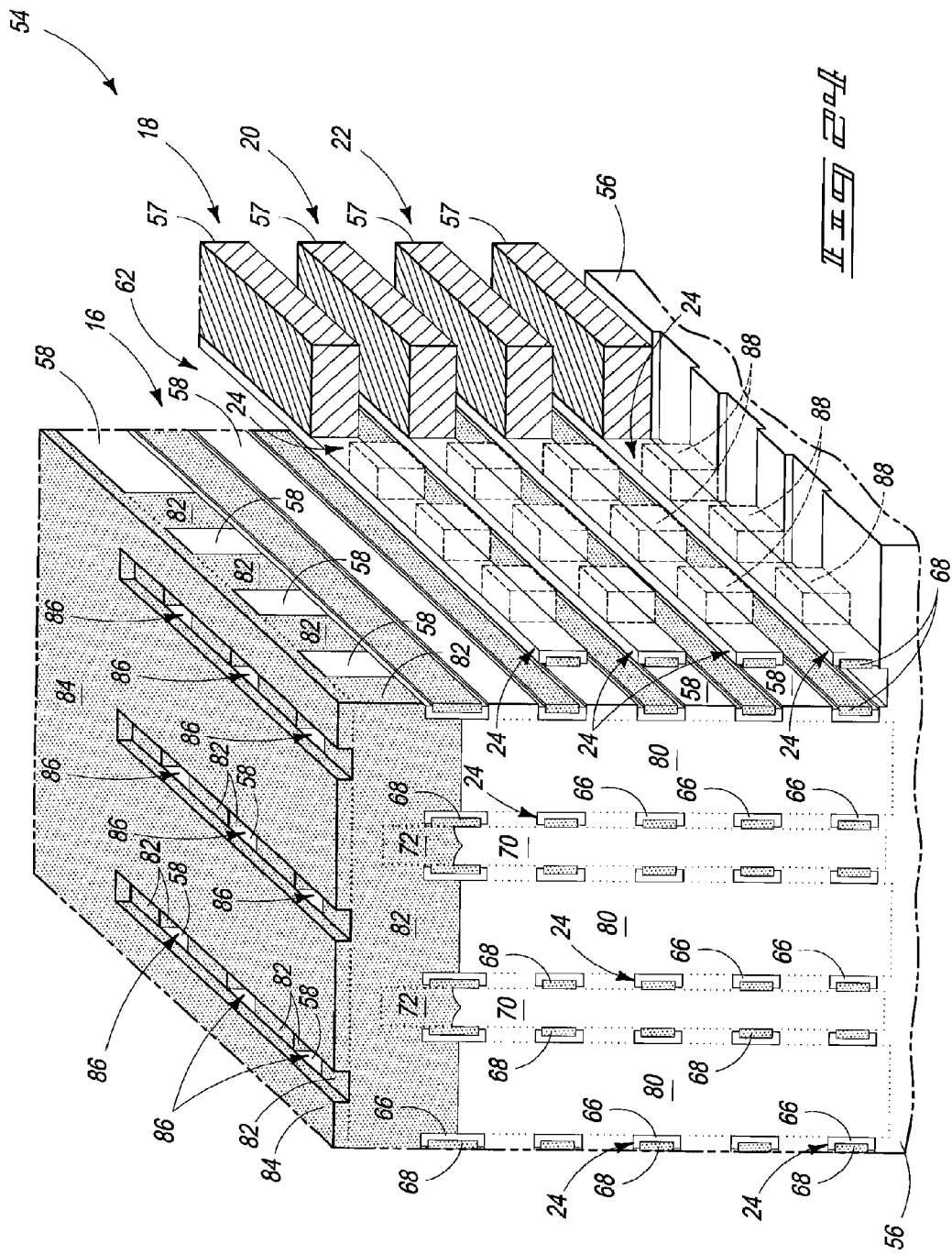
FIG. 24 is a view of the FIG. 23 substrate at a processing step subsequent to that shown by FIG. 23.

Referring to FIG. 24, exposed spaced sacrificial blocks 78 (not shown) have been selectively etched relative to materials 80 and 58, thereby leaving void spaces 88 there-behind. In one example embodiment, such etching is conducted isotropically, and in one example embodiment is conducted wet. An example wet etching chemistry that will isotropically wet etch a silicon nitride 57 selectively relative to silicon dioxide 58 and 80, and platinum 66, includes a heated aqueous solution of $H_3PO_4$.

Figure 25:
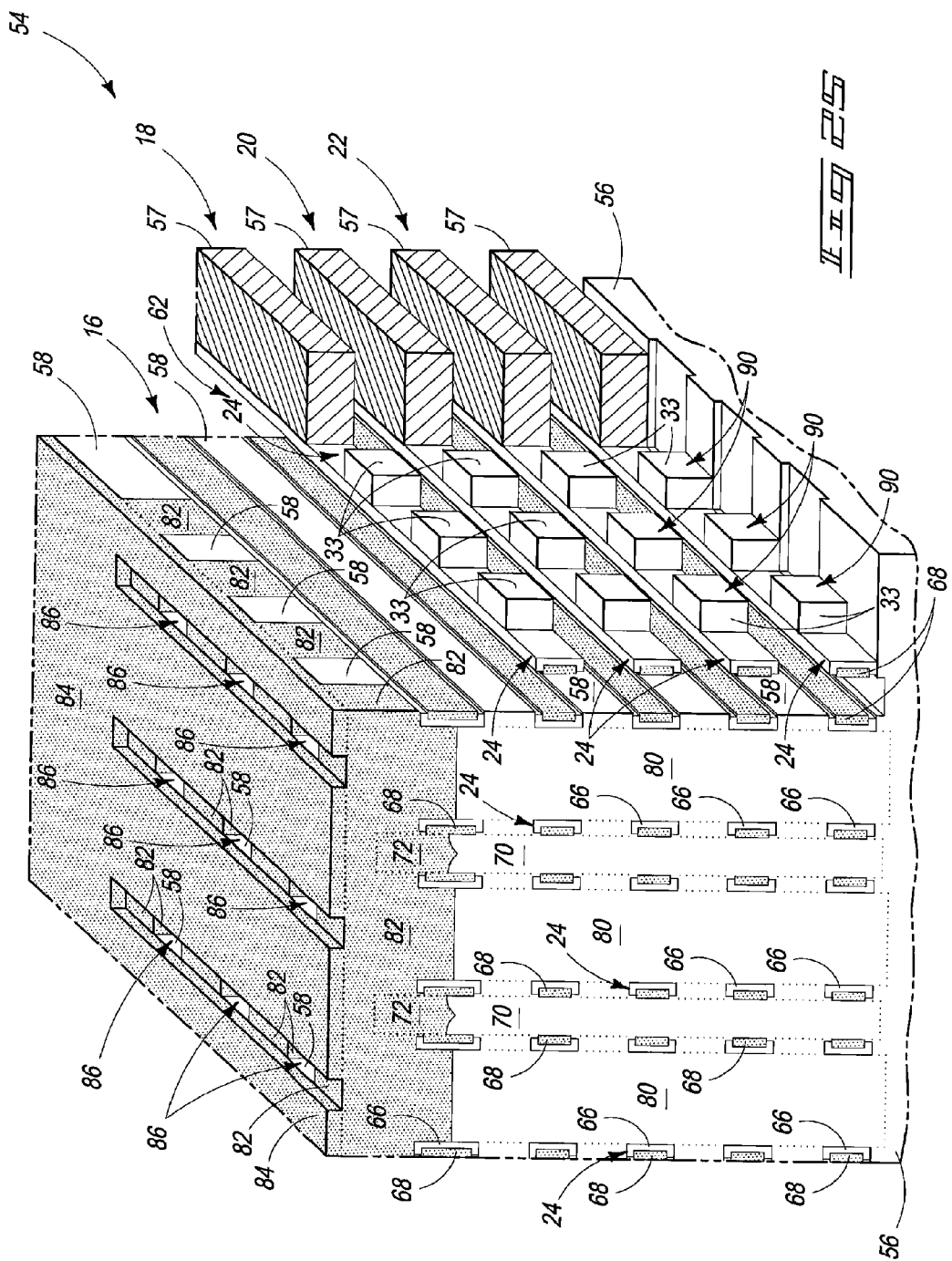
FIG. 25 is a view of the FIG. 24 substrate at a processing step subsequent to that shown by FIG. 24.

Referring to FIG. 25, and in but one embodiment, void spaces 88 (not shown) have been filled with multi-resistive state material 33, with programmable spaced blocks 90 effectively being formed there-from. An example technique for doing so includes deposition of one or more suitable multi-resistive state materials to within openings 86 to overfill such openings, followed by anisotropic etching of such material from within openings 86 such that the multi-resistive state material 33 remains filling the previous void spaces. In one embodiment, the programmable spaced blocks 90 are formed to comprise rectangular faces. Multi-resistive state material 33 may be homogenous or non-homogenous, and may comprise one or more different compositions and/or layers. Accordingly, material 33 might be deposited/formed in more than one step.

In one embodiment, a method of forming an array of vertically stacked tiers of non-volatile cross point memory cells includes exchanging sacrificial spaced blocks with programmable spaced blocks comprising multi-resistive state material. Such may comprise etching of the sacrificial spaced blocks followed by filling void space left there-behind with multi-resistive state material. The above processing with respect to FIGS. 10-25 comprises but one example such technique. Another embodiment is described below wherein the void spaces which are created are lined with multi-resistive state material.

By ways of example only, material 33 might comprise multi-resistive state metal oxide-comprising material, further for example comprising two different layers or regions generally regarded as or understood to be active or passive regions, although not necessarily. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, material 33 might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed.

Multi-resistive state material 33 may comprise memristive material. In one embodiment, multi-resistive state material 33 may be statically programmable semiconductive material which comprises mobile dopants that are received within a dielectric such that the material is statically programmable between at least two different resistance states. At least one of the states includes localization or gathering of the mobile dopants such that a dielectric region is formed within material 33, and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$.

In one embodiment, a multi-resistive state material 33 that comprises oxygen vacancies as mobile dopants may comprise a combination of $TiO_2$ and $TiO_{2-x}$ in at least one programmed resistance state depending on location of the oxygen vacancies and the quantity of the oxygen vacancies in the locations where such are received. In one embodiment, a multi-resistive state material 33 that comprises nitrogen vacancies as mobile dopants may comprise a combination of AlN and $AlN_{1-x}$ in at least one programmed state depending on location of the nitrogen vacancies and the quantity of the nitrogen vacancies in the locations where such are received. In one embodiment, a multi-resistive state material 33 that comprises fluorine vacancies as mobile dopants may comprise a combination of $MgF_2$ and $MgF_{2-x}$ in at least one programmed resistance state depending on location of the fluorine vacancies and the quantity of the fluorine vacancies in the locations where such are received. In one embodiment, the mobile dopants comprise aluminum atom interstitials in a nitrogen-containing material.

A plurality of horizontally oriented global bit lines are formed which have local vertical bit line extensions extending through multiple of the tiers. Individual of the local vertical bit line extensions may be received laterally adjacent programmable spaced blocks received within multiple of the tiers, with the programmable spaced blocks also being received adjacent the horizontally oriented word lines. For example and by way of example only, the openings 86 remaining after the FIG. 25 processing may be used to define and/or form local vertical bit line extensions there-within, and to encompass any of the example circuitries shown in any of the embodiments of FIGS. 1-6 by way of examples. Accordingly, global horizontal bit lines and/or bit line select circuits and/or local vertical bit line extension select circuits (none being shown) may have previously been fabricated elevationally inward of the tier below tier 22. Alternately, one or more of such circuitry components may be fabricated elevationally outward of the example dummy tier 16. Alternately, one or more of such circuitry components may be fabricated elevationally between (not shown) the tiers.

Figure 26:
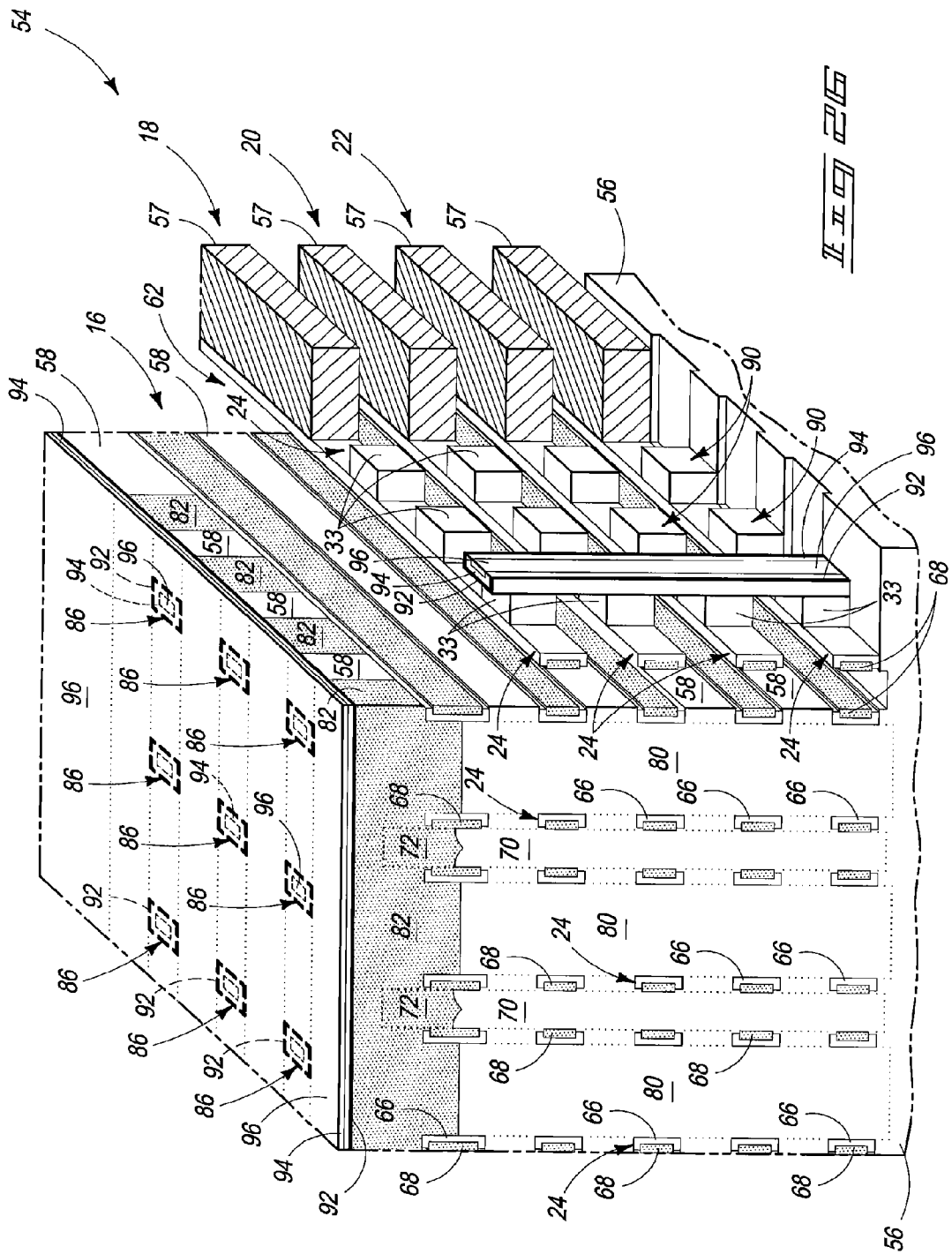
FIG. 26 is a view of the FIG. 25 substrate at a processing step subsequent to that shown by FIG. 25.

Regardless, the description proceeds with reference to FIGS. 26-31 of example techniques of forming local vertical bit line extensions. Such may comprise one or more conductive materials. Further as stated previously, the multi-resistive state material in the methods and arrays disclosed herein may be of a single general composition or of multiple different compositions. Referring to FIG. 26, a multi-resistive state material 92 has been deposited to line openings 86. Such is simply shown as a thick black line in the drawings for clarity. In one embodiment, an example multi-resistive state material 33 and 92 is a composite of $Pr_{0.7}Ca_{0.3}MnO_3$ and a yttrium-zirconium-oxide, for example with material 33 being $Pr_{0.7}Ca_{0.3}MnO_3$ and material 92 being a yttrium-zirconium-oxide. A conductive layer 94 has been deposited over material 92 to line a remaining portion of openings 86. An example material 94 comprises, consists essentially of, or consists of platinum. Remaining volume of openings 86 have been subsequently filled with a sacrificial material 96, for example silicon dioxide.

Figure 27:
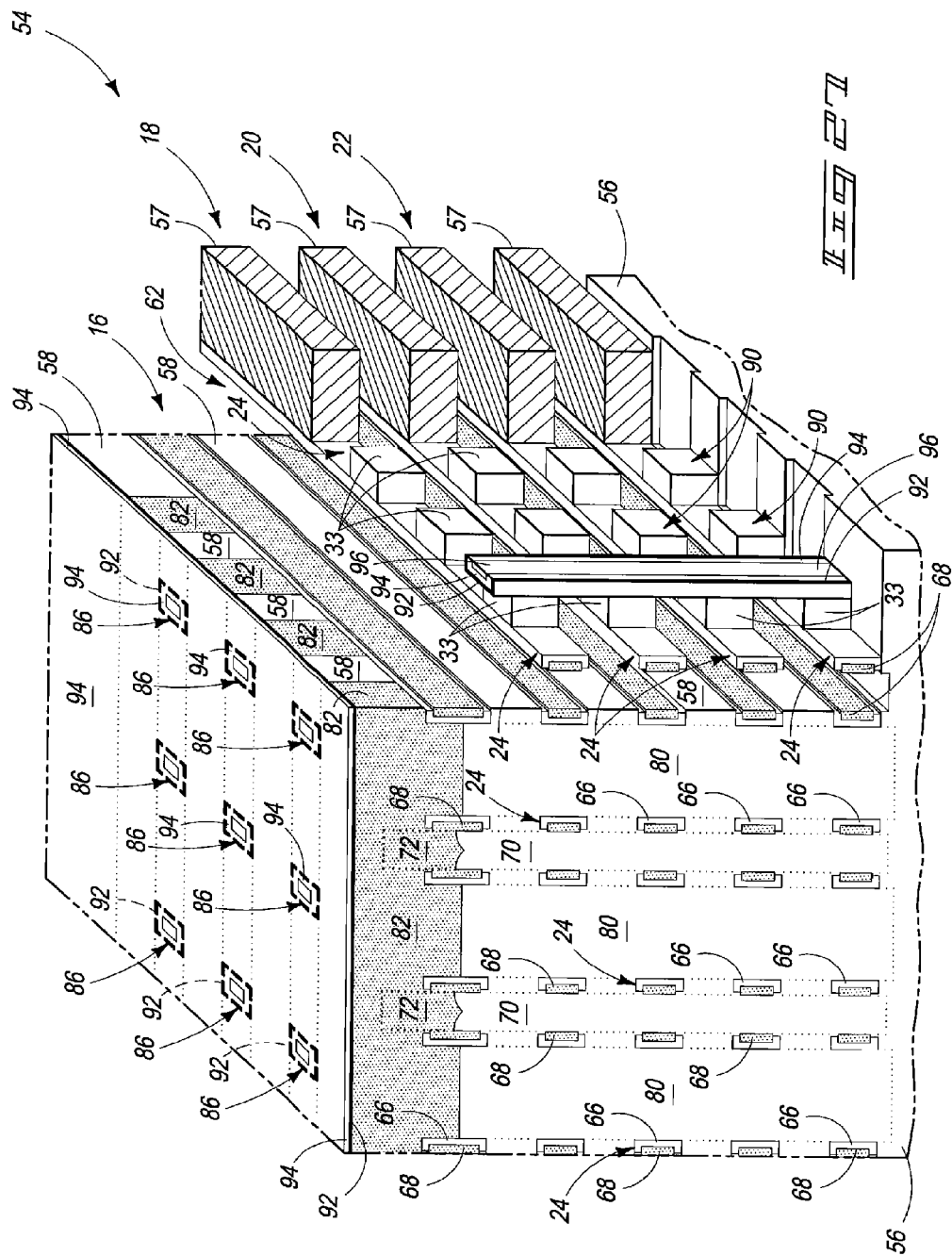
FIG. 27 is a view of the FIG. 26 substrate at a processing step subsequent to that shown by FIG. 26.

Referring to FIG. 27, sacrificial material 96 has been removed back to expose conductive material 94.

Figure 28:
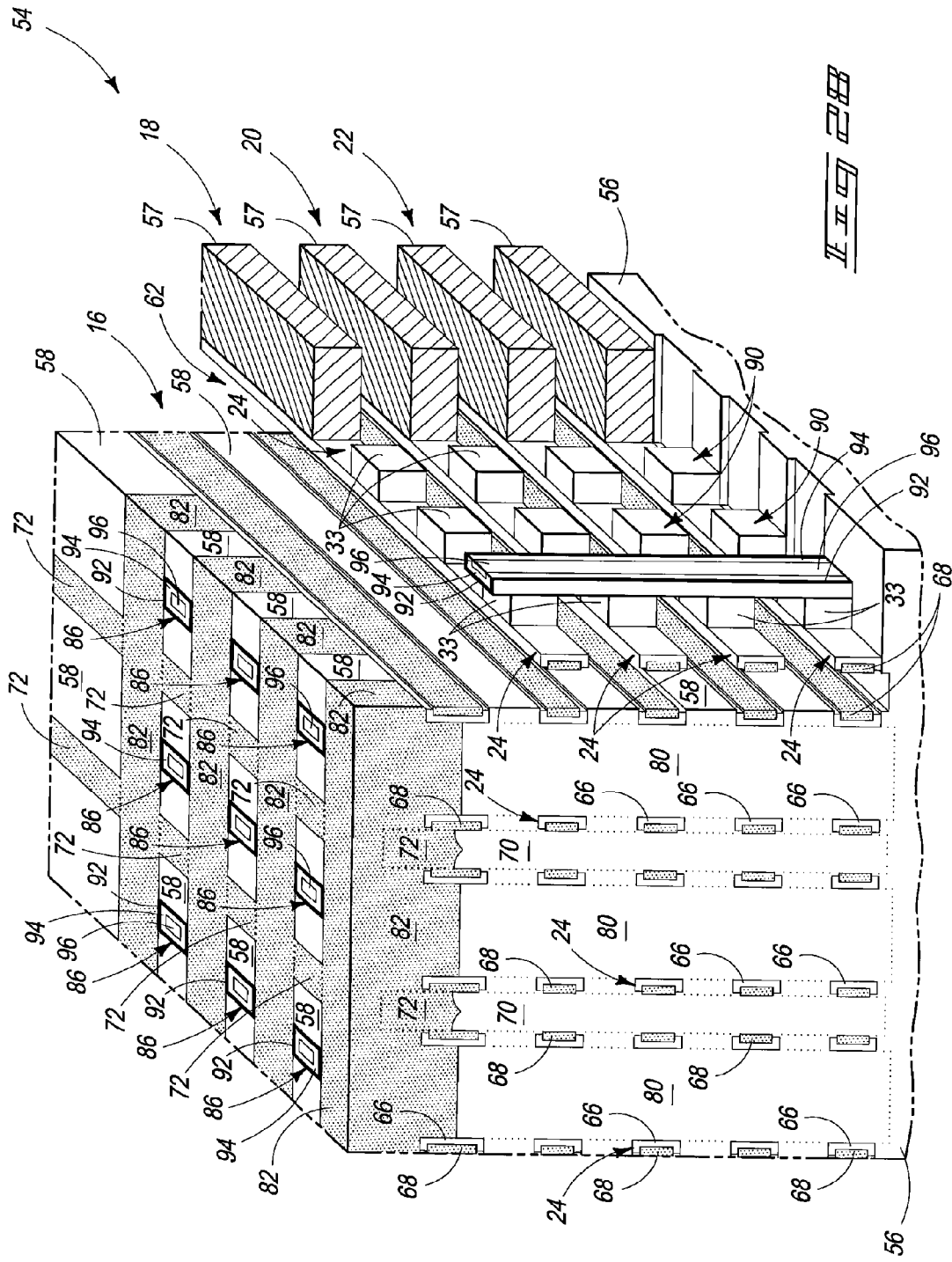
FIG. 28 is a view of the FIG. 27 substrate at a processing step subsequent to that shown by FIG. 27.

Referring to FIG. 28, conductive material 94 has been removed back to expose material 92, and material 92 has then been removed from outwardly of filled openings 86 thereby exposing materials 58 and 82.

Figure 29:
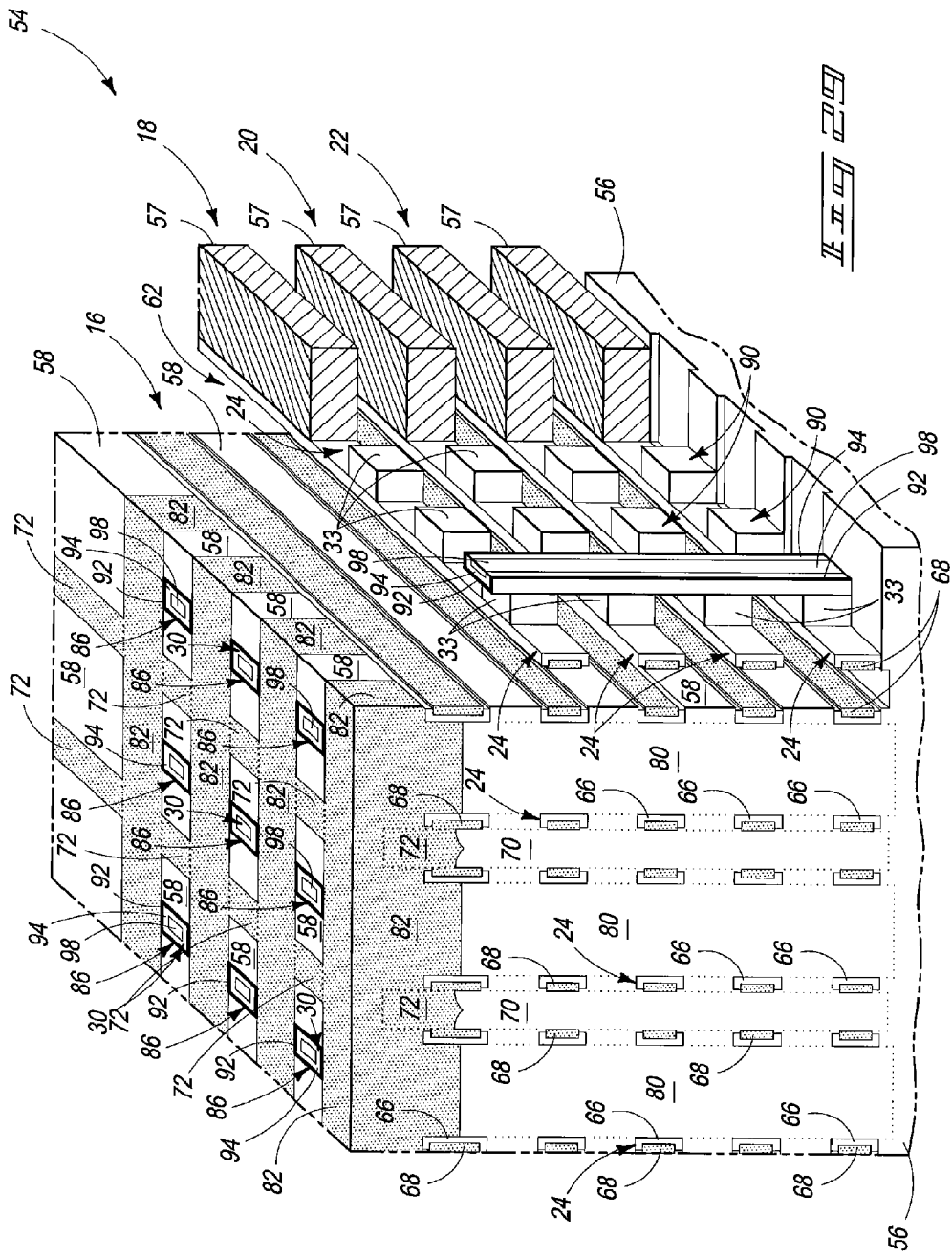
FIG. 29 is a view of the FIG. 28 substrate at a processing step subsequent to that shown by FIG. 28.

Referring to FIG. 29, sacrificial material 96 (not shown) has been removed by etching from being received within openings 86, and another conductive material 98 substituted therefore. An example conductive material is TiN, and which has subsequently been planarized back at least to the outer surfaces of materials 58 and 82 in FIG. 29. Thereby, local vertical bit line extensions 30 comprising conductive material 98 and conductive material 94 have been formed.

Figure 30:
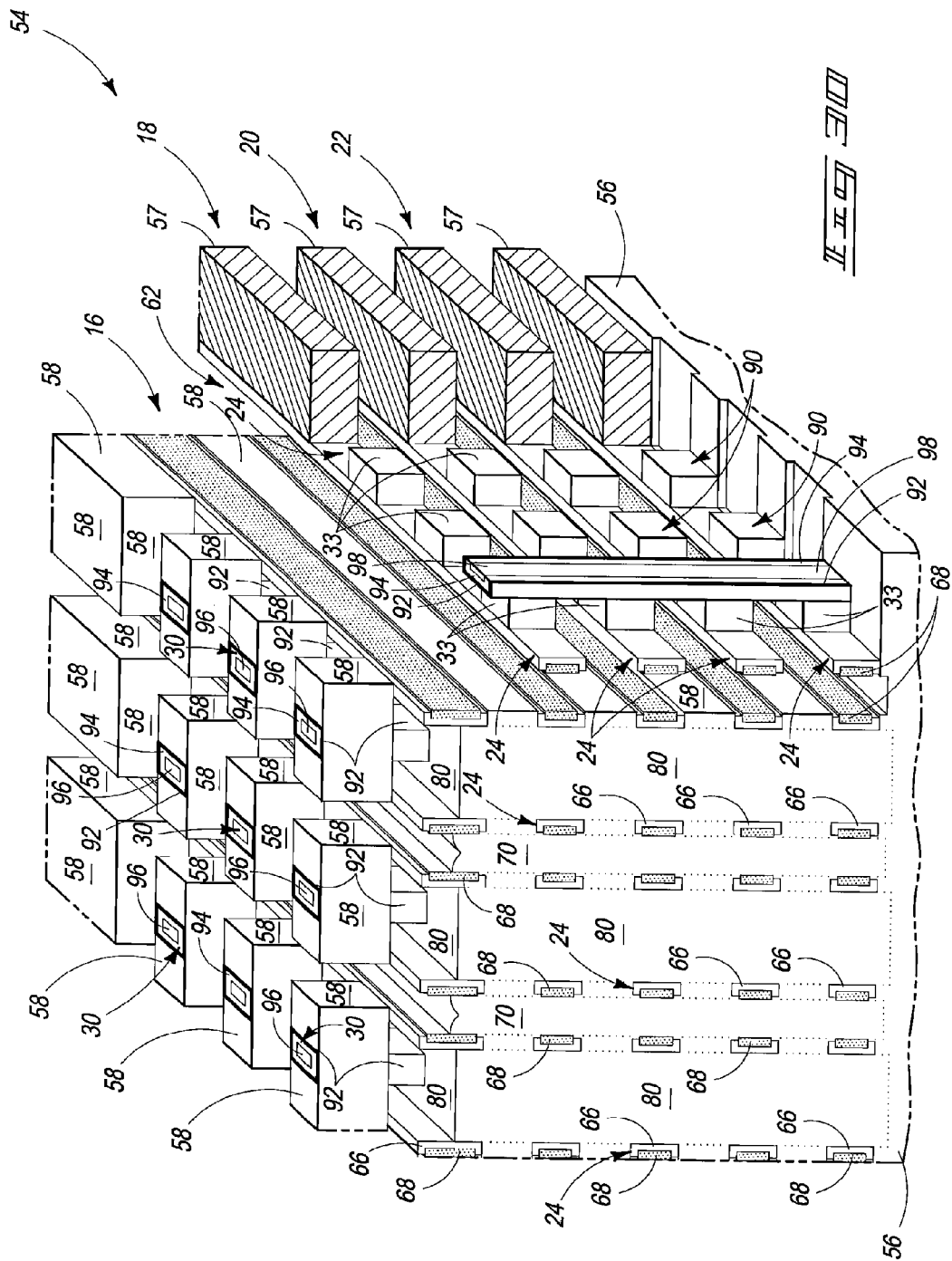
FIG. 30 is a view of the FIG. 29 substrate at a processing step subsequent to that shown by FIG. 29.
Figure 31:
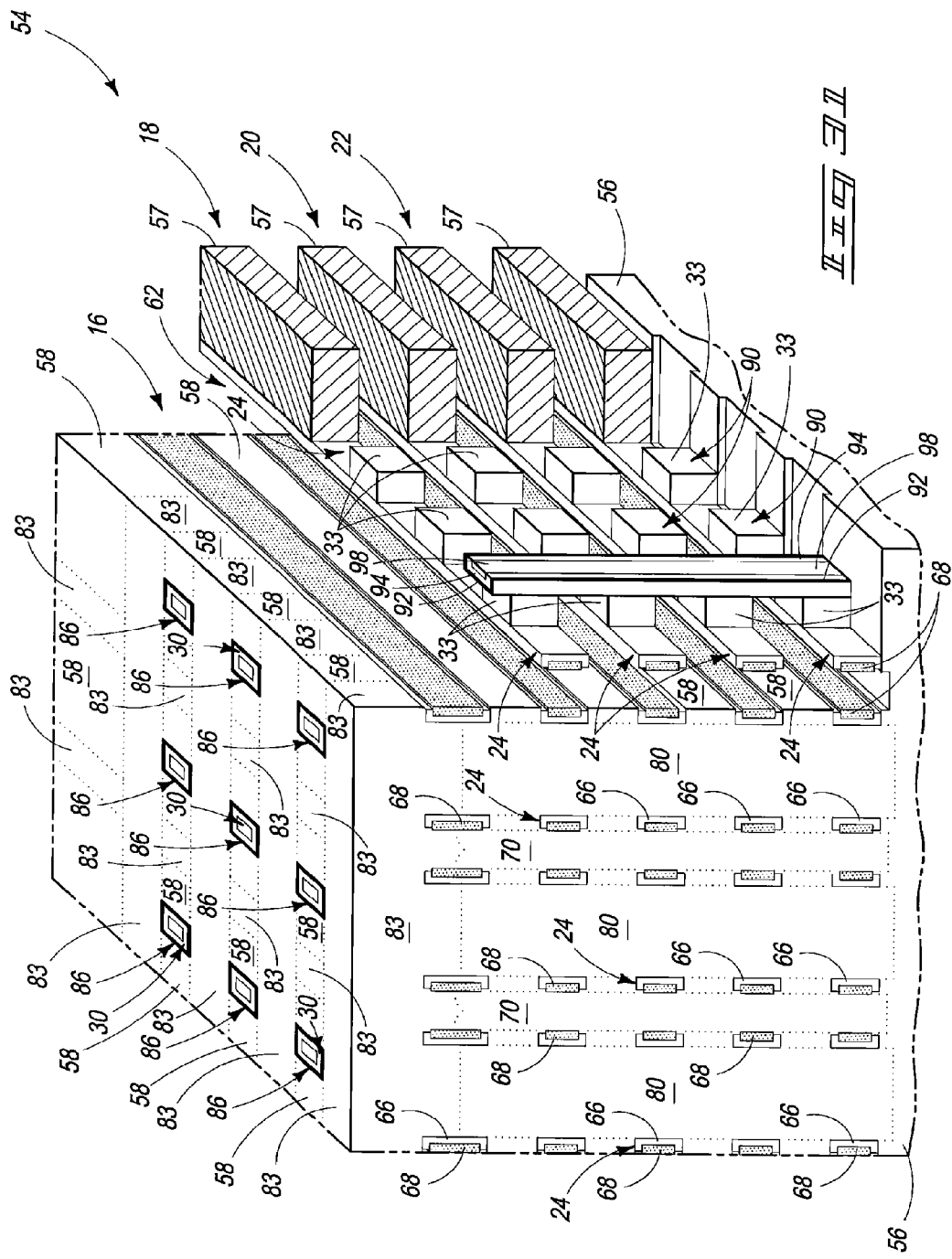
FIG. 31 is a view of the FIG. 30 substrate at a processing step subsequent to that shown by FIG. 30.

FIG. 30 depicts subsequent removal of materials 82 and 72 (not shown). FIG. 31 depicts subsequent fill with insulative material 83 which may be of the same or different composition from that of material 58.

Figure 32:
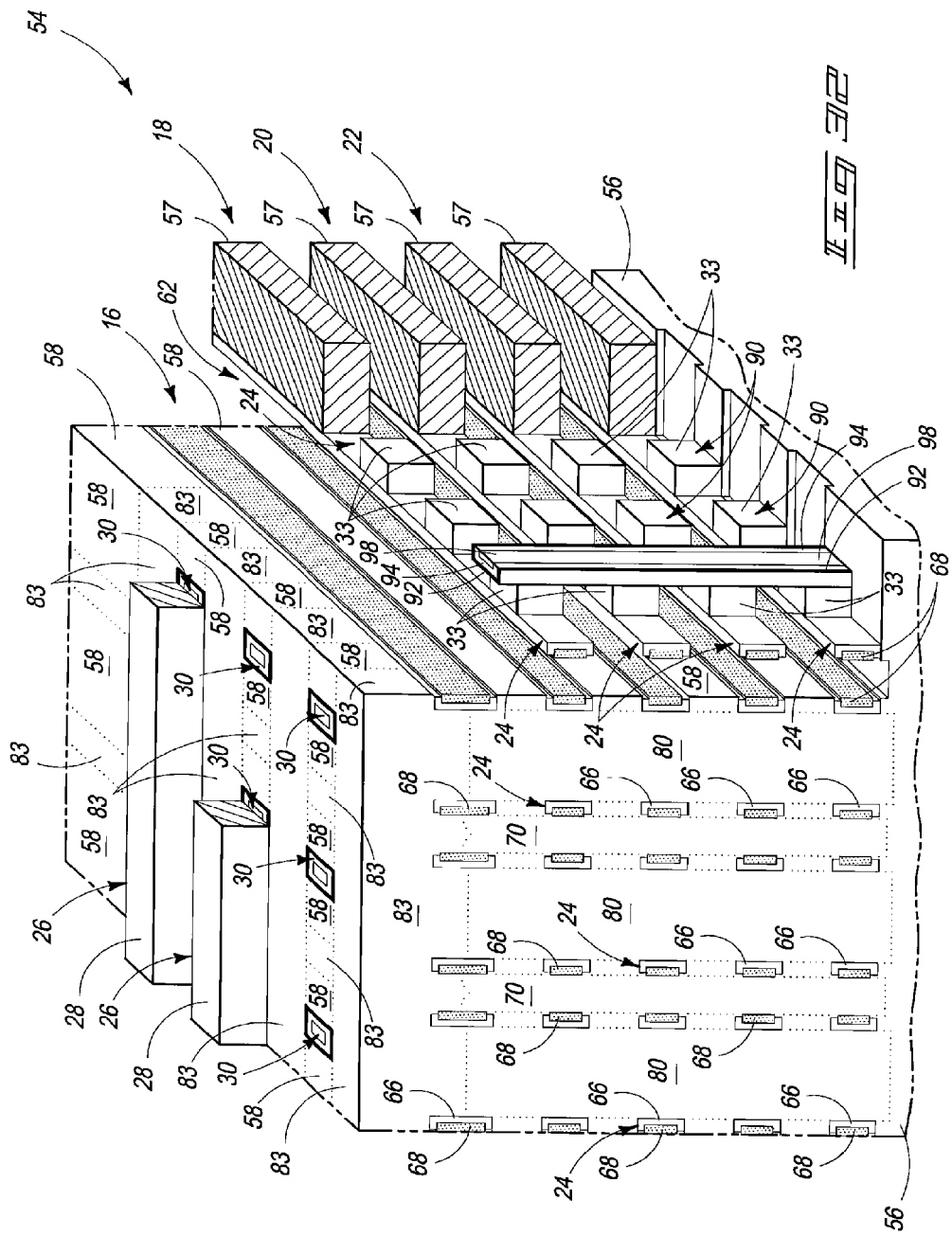
FIG. 32 is a view of the FIG. 31 substrate at a processing step subsequent to that shown by FIG. 31.
Figure 6H:
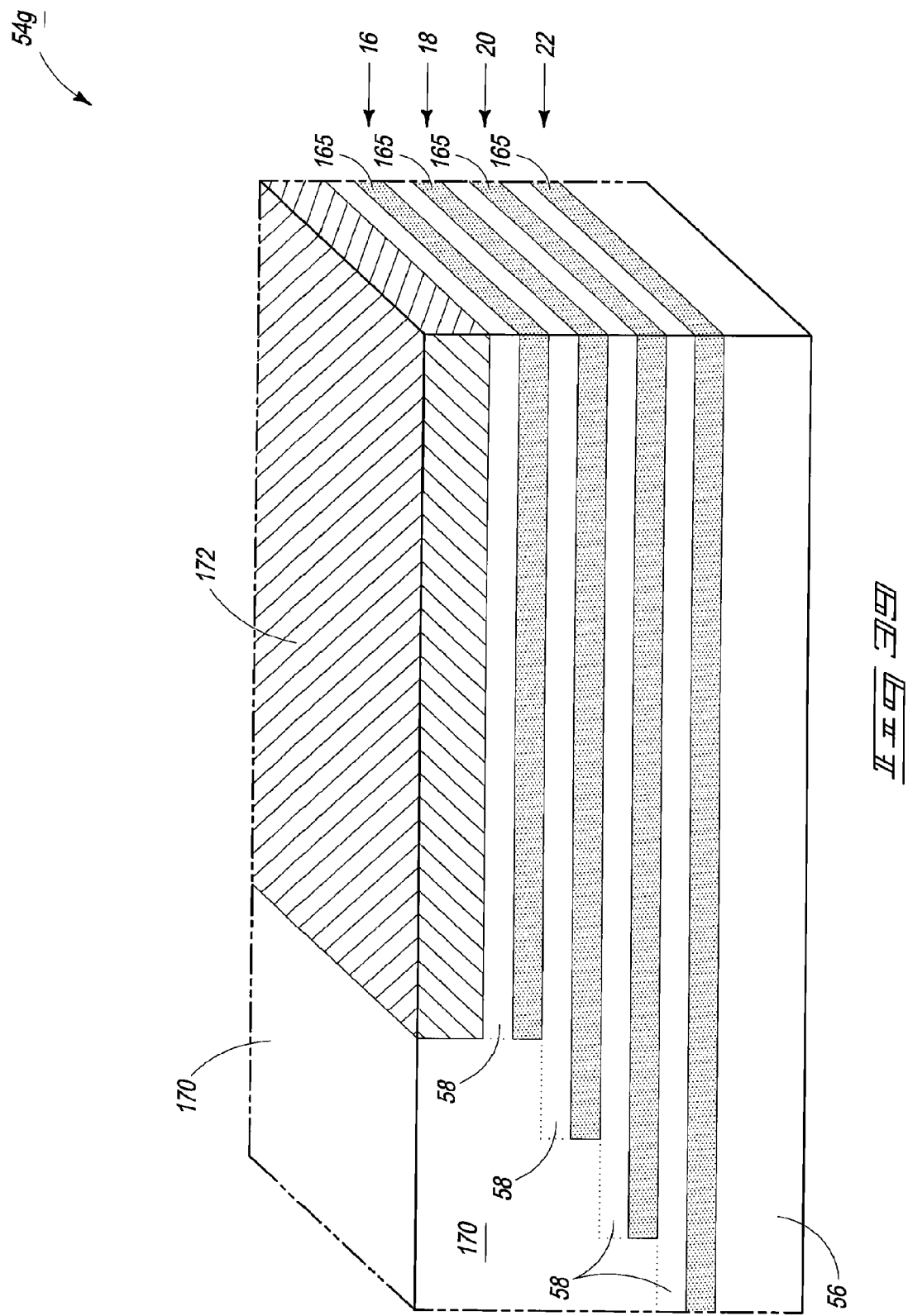

FIG. 32 depicts subsequent processing, by way of example only, whereby bit lines 26 have been fabricated which include a plurality of horizontally oriented global bit lines 28 in electrical connection with local vertical bit line extensions 30 which extend through multiple of the tiers of memory cells. Global horizontal bit lines 28 are shown as broken for clarity in the figure.

The embodiment described above in connection with FIG. 32 is but one example of an array of vertically stacked tiers of non-volatile cross point memory cells. Such comprises a plurality of horizontally oriented word lines within individual tiers of memory cells. Such also encompasses a plurality of horizontally oriented global bit lines having local vertical bit line extensions extending through multiple of the tiers of memory cells. Individual of the memory cells comprise multi-resistive state material received between one of the horizontal word lines and one of the local vertical bit line extensions where such cross. The multi-resistive state material comprises a composite of two different composition materials. One of the two materials of the composite comprises a plurality of spaced blocks 90 received along individual of the local vertical bit line extensions, with individual of the blocks being associated with individual of the memory cells. The other material 92 of the composite is of C-shape in a horizontal cross section and extends continuously along individual of the local vertical bit line extensions through multiple of the tiers.

An alternate example embodiment of an array construction 54e, and of a method of forming an array, is next described with respect to FIGS. 33-36. Like numerals from the FIGS. 10-32 embodiments have been utilized where appropriate, with differences being indicated with the suffix "e" or with different numerals. Array construction 54e is the same as that of construction 54 in FIG. 23, but shown at a different cross-sectional cut and without showing the partial construction shown at the far right in FIG. 23. In FIG. 33, the depicted front x-axis cut is along the front edge of an opening 86, the y-axis cut is along a left edge of an opening 86, and spaced sacrificial blocks 78 are thereby viewable in the depicted front face of construction 54e. Accordingly, spaced sacrificial blocks 78 are encapsulated by insulative material 80 and 58, but for openings 86 which have been etched to expose spaced sacrificial blocks 78.

Referring to FIG. 34, exposed spaced sacrificial blocks 78 (not shown) have been etched selectively relative to insulative materials 80 and 58, thereby leaving void spaces 88 therebehind. Accordingly, substrate fragment 54e in FIG. 34 is of the same construction as that of FIG. 24, but only showing a portion thereof at the different above-identified x and y cuts.

Referring to FIG. 35, void spaces 88 have been lined with multi-resistive state material 33e. Such may be homogenous or non-homogenous, and comprise any of the classifications and specific materials identified above, by way of examples. In one embodiment and as shown, multi-resistive state material 33e which lines void spaces 88 is formed to be continuous between the depicted tiers.

Referring to FIG. 36, conductive material 94e has been deposited within lined void spaces 88 and planarized back, thereby forming what will be vertical bit line extensions 30e which extend through multiple tiers of the memory cells. Individual of local vertical bit line extensions 30e comprise portions which are received laterally adjacent lined void spaces 88, now filled with material 94e, received within multiple of the tiers. In one embodiment and as shown in FIG. 36, conductive material 94e has been deposited or formed to be homogenous and continuous within the openings within which the local vertical bit line extensions 30e are formed. Alternately, by way of example, the local vertical bit line extensions might be formed by etching of the deposited conductive material followed by deposition of a conductor material of different composition from that of the conductive material. Such is shown by way of example only in FIG. 37 with respect to an array/substrate fragment 54f. Like numerals from the above-described embodiments have been utilized where appropriate, with differences being indicated with the suffix "f" or with different numerals. In FIG. 37, conductive material 94f has been etched, and in one embodiment has been etched in a substantially anisotropic manner as shown. A conductor material 95 of different composition from that of 94f has been deposited, and materials 94f and 95 then planarized back, thereby forming local vertical bit line extensions 30f.

A plurality of horizontally oriented global bit lines would subsequently be formed in electrical connection with local vertical bit line extensions 30e/30f. FIG. 38 depicts such an example with respect to substrate fragment 54f in the formation of bit lines 26f having horizontally oriented global bit lines 28 having local vertical bit line extensions 30f. Hardmasking material 82 (not shown) may be replaced with another material, for example an insulative oxide material 99 as shown.

An embodiment of the invention encompasses an array of vertically stacked tiers of non-volatile cross point memory cells. Such an array comprises a plurality of horizontally oriented word lines within individual tiers of memory cells. A plurality of horizontally oriented global bit lines are provided which have local vertical bit line extensions extending through multiple of the tiers of memory cells. Individual of the memory cells comprise multi-resistive state material received between one of the horizontal word lines and one of the local vertical bit line extensions where such cross. Such crossing horizontal word lines and local vertical bit line extensions comprise opposing conductive electrodes of individual memory cells where such cross, with a multi-resistive state material comprising a C-shape in a vertical cross section. For example, either of the embodiments of FIGS. 36 and 37 when incorporating horizontally oriented global bit lines show multi-resistive state material 33e as comprising a C-shape in a vertical cross section taken through former void spaces 88.

In one embodiment, the multi-resistive state material extends continuously along individual of the local vertical bit line extensions through multiple of the tiers. In one embodiment, the multi-resistive state material comprises a C-shape in a horizontal cross section. For example, either of the embodiments of FIGS. 36 and 37 have multi-resistive state material 33e in a C-shape in a horizontal cross section taken through former individual void spaces 88.

In one embodiment, the local vertical bit line extensions laterally fill center volume of the C-shape. In one embodiment, the local vertical bit line extensions are individually homogenous, for example as shown in the embodiment of FIG. 36. In one embodiment, the individual horizontally oriented global bit lines and local vertical bit line extensions are not homogenous, for example as shown in the embodiment of FIGS. 37 and 38.

An alternate embodiment array construction 54g is next described with reference to FIGS. 39-45. Like numerals from the FIGS. 10-38 embodiments have been utilized where appropriate, with differences being indicated with the suffix "g" or with different numerals.

Referring to FIG. 39, array construction 54g comprises conductive material 165 received between insulative material 58 at tiers 16, 18, 20 and 22. Tier 16 may or may not be a dummy tier in this embodiment. Conductive material 165 may or may not be homogenous, with an example being titanium nitride. Such is shown as having been patterned to form a stair step-like construction for providing horizontal area for later etching electrical contacts (not shown) to conductive material 165. Stair-stepping may also be used with any of the above-described embodiments. Regardless, an insulative material 170 and an adjacent hardmask 172 have been formed. Material 170 may be the same as or different from the composition of material 58. An example material 172 is silicon nitride.

Figure 40:
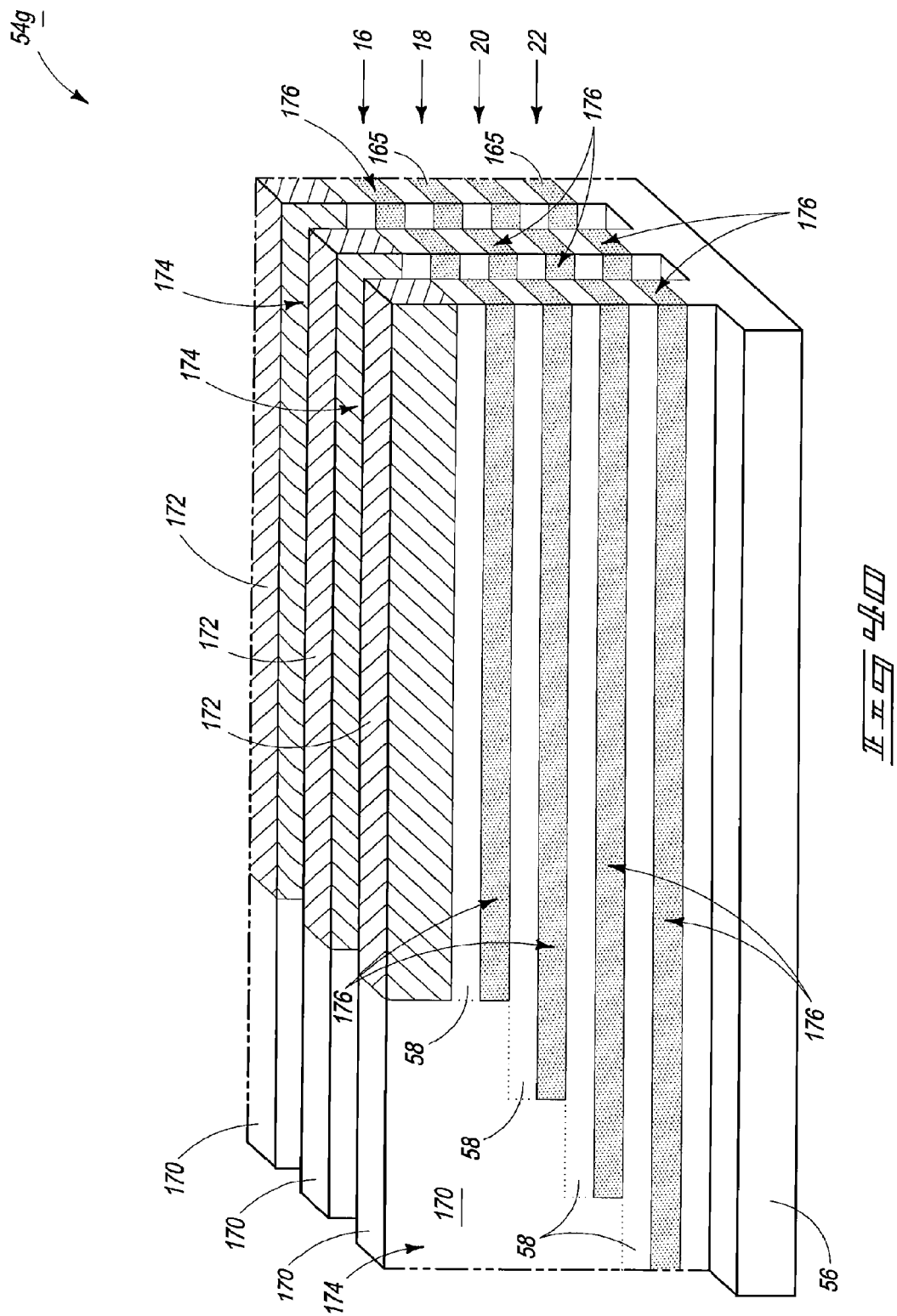
FIG. 40 is a view of the FIG. 39 substrate at a processing step subsequent to that shown by FIG. 39.

Referring to FIG. 40, horizontally elongated trenches 174 have been etched as shown. Thereby, a plurality of horizontally oriented word lines 176 have been formed within individual tiers 16, 18, 20 and 22.

Figure 41:
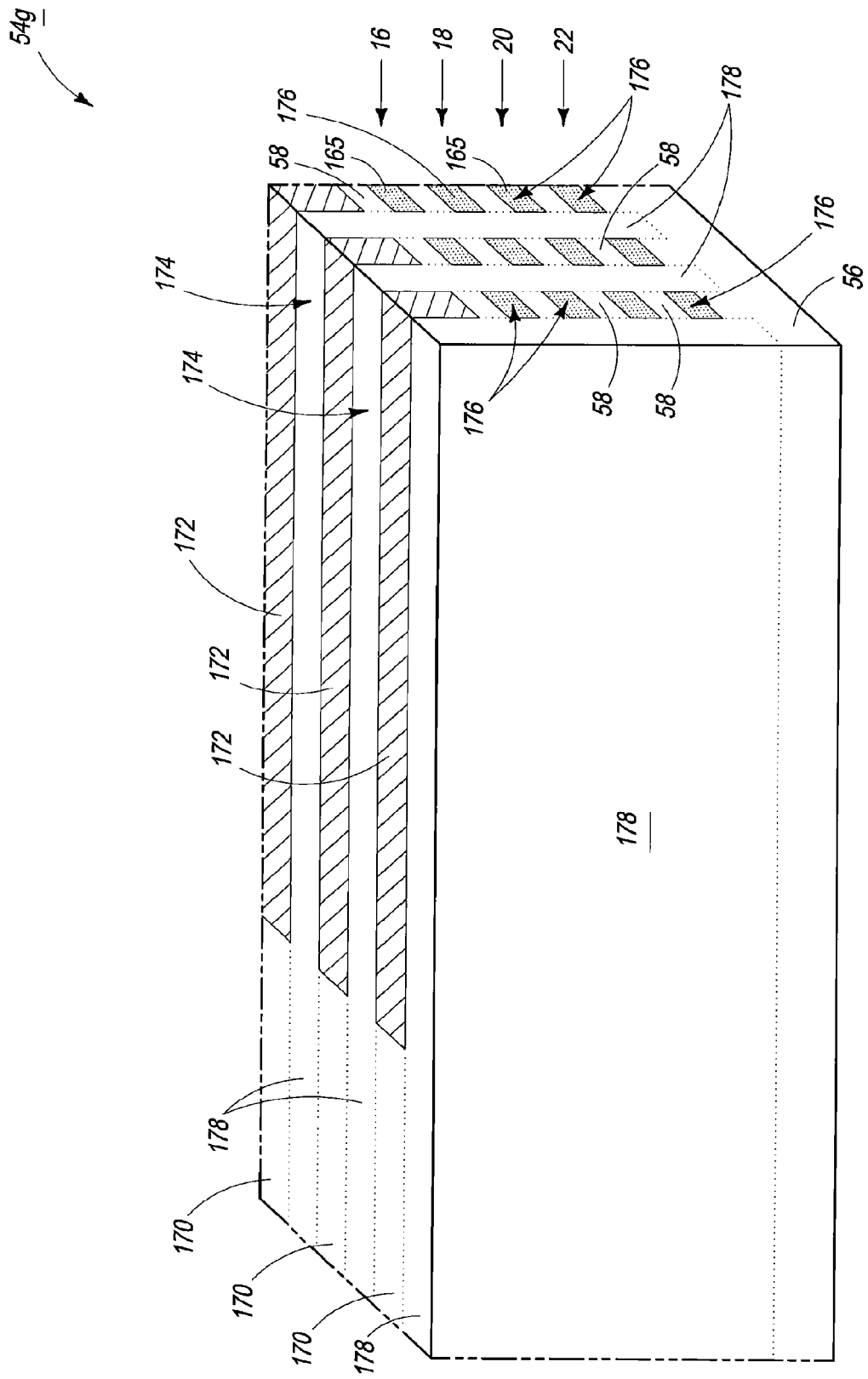
FIG. 41 is a view of the FIG. 40 substrate at a processing step subsequent to that shown by FIG. 40.

Referring to FIG. 41, trenches 174 have been filled with insulative material 178 followed by planarizing such back, for example by chemical mechanical polishing, to stop on hardmask material 172. Material 178 may be the same as or different from the composition of materials 170 and/or 58.

Figure 42:
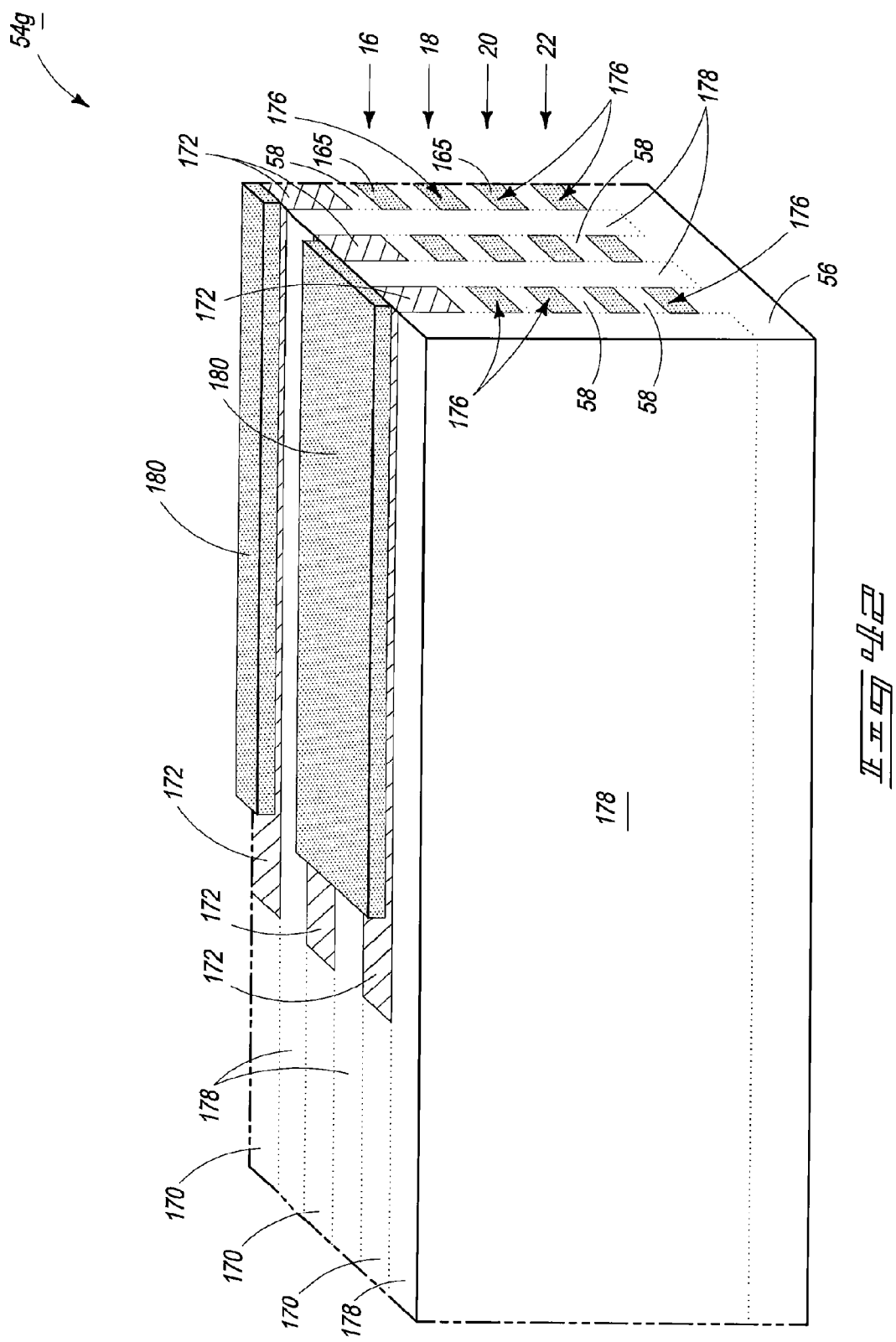
FIG. 42 is a view of the FIG. 41 substrate at a processing step subsequent to that shown by FIG. 41.

Referring to FIG. 42, a patterned hardmask 180 has been formed as shown. An example material 180 is silicon nitride. Regardless, material 180 may be the same or different as underlying hardmask material 172.

Figure 43:
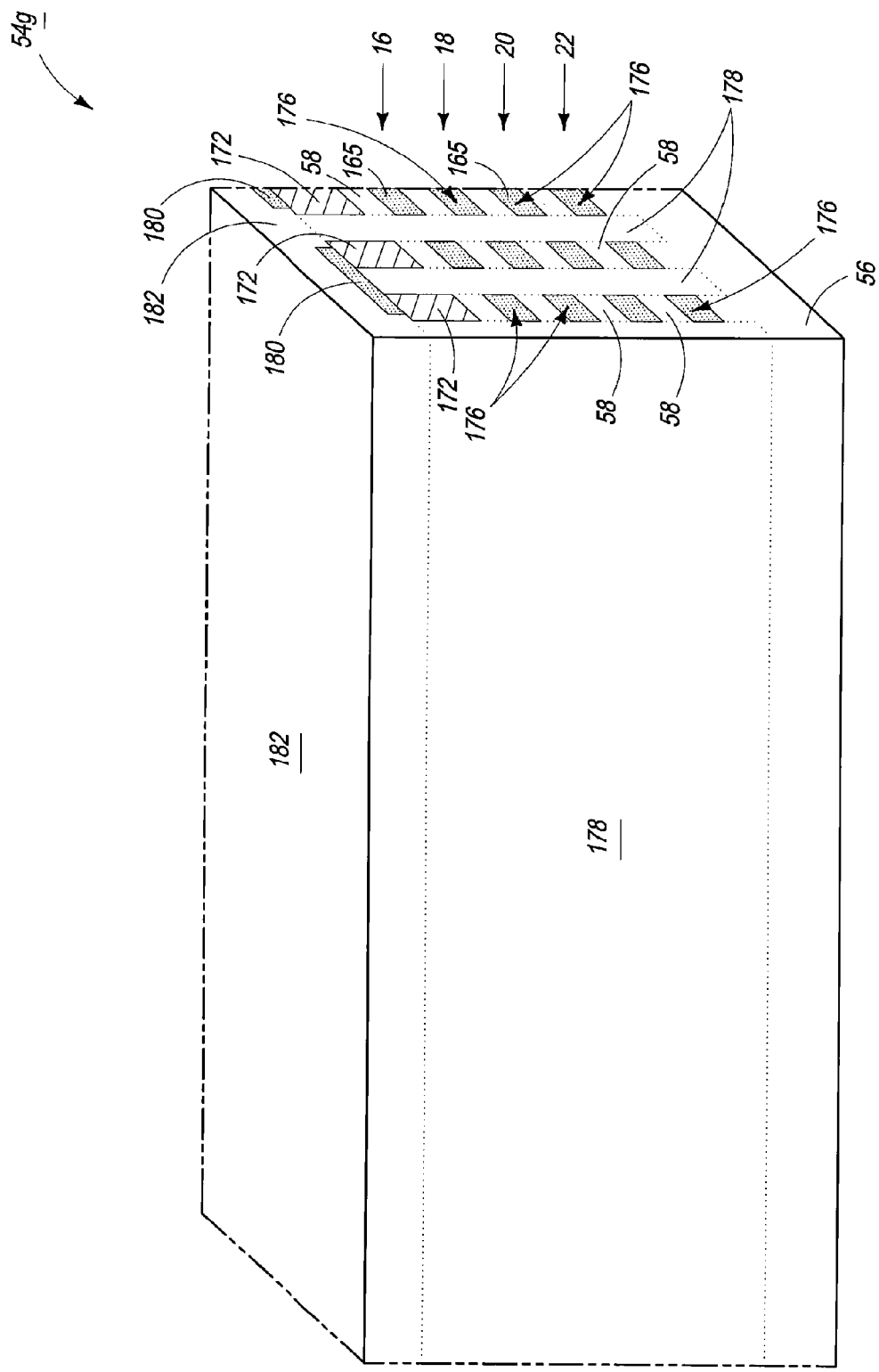
FIG. 43 is a view of the FIG. 42 substrate at a processing step subsequent to that shown by FIG. 42.

Subsequent processing is described wherein horizontally oriented global bit lines will be formed using a trench and refill technique. Alternately by way of example only, such may be formed by deposition and subtractive etch techniques. Referring to FIG. 43, a material 182 has been deposited, and within which trenches will be subsequently formed and filled. An example material 182 is silicon dioxide.

Figure 44:
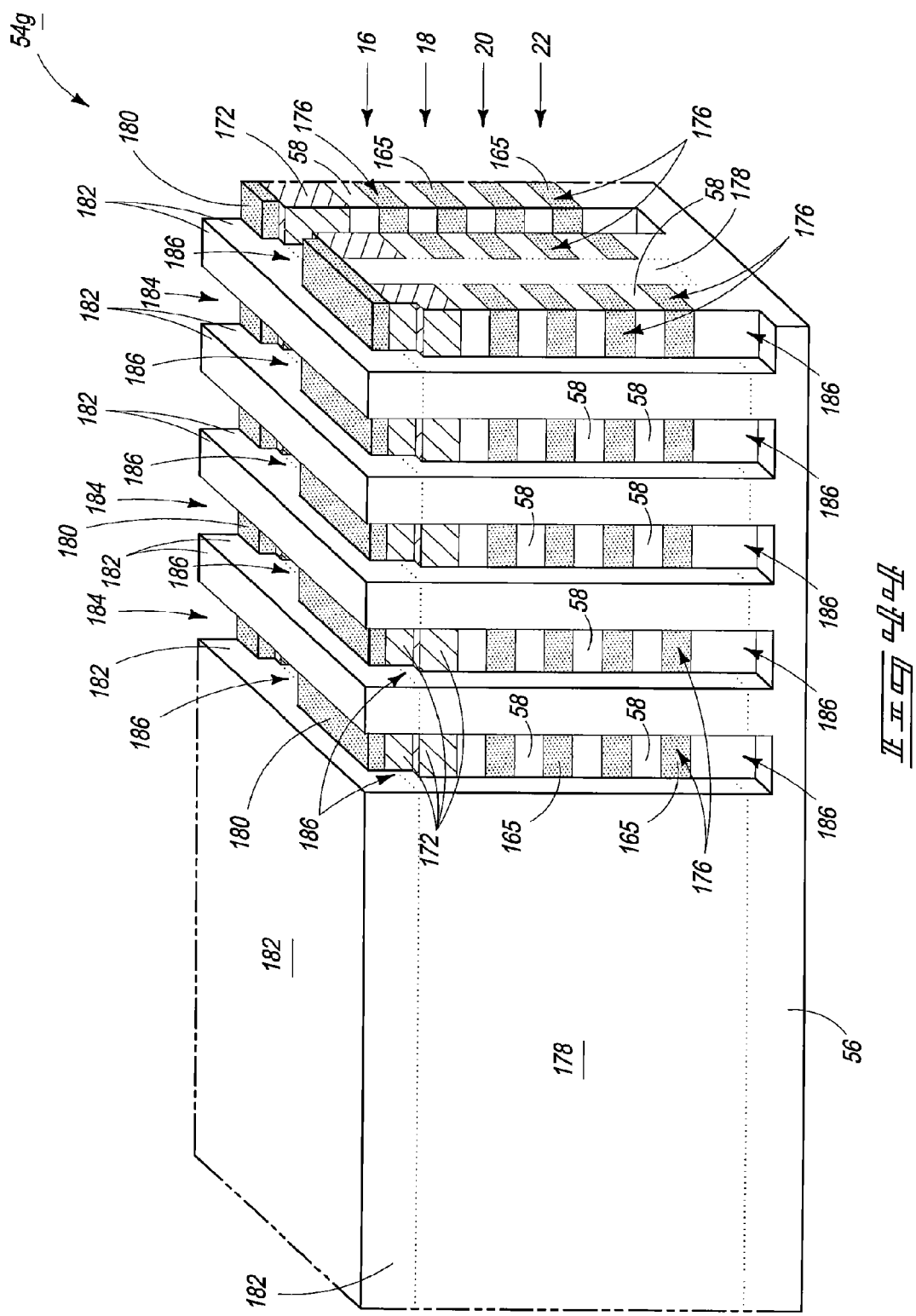
FIG. 44 is a view of the FIG. 43 substrate at a processing step subsequent to that shown by FIG. 43.

Referring to FIG. 44, a suitable mask (not shown) has been used to form mask openings (not shown) of an outline corresponding to trenches 184. Such mask openings run orthogonal to the openings within hardmask 180. Accordingly, subsequent etching of materials 182, 178, and 58 forms trenches 184 in material 182 and openings 186 extending downwardly there-from within materials 8 and 178 between every other immediately adjacent pairs of horizontally oriented word lines 176.

Figure 45:
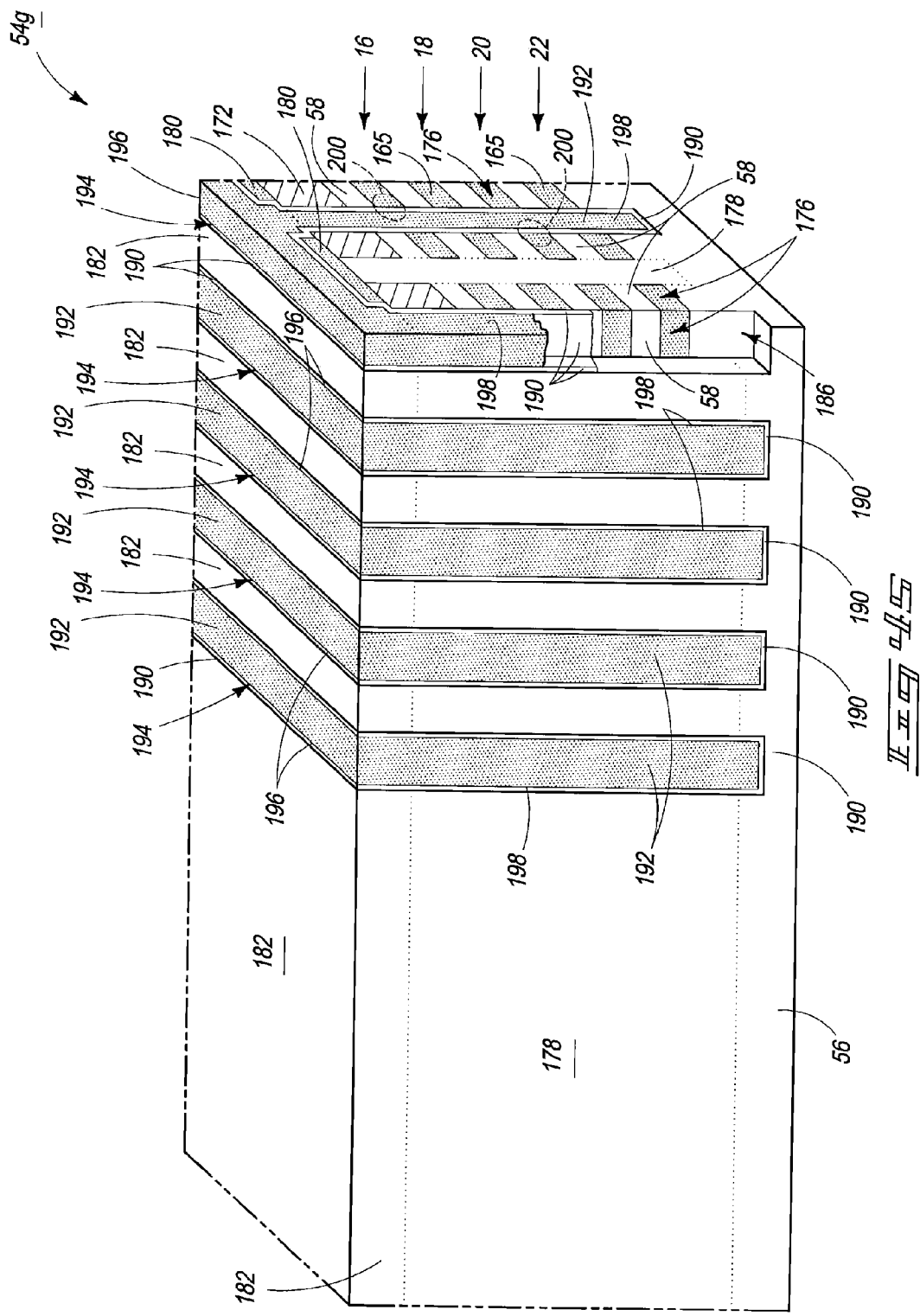
FIG. 45 is a view of the FIG. 44 substrate at a processing step subsequent to that shown by FIG. 44.

Referring to FIG. 45, multi-resistive state material 190 has been deposited to line trenches 184 and openings 186. Such may or may not be homogenous, with any of the multi-resistive state materials as described above being examples. Thereafter, conductive material 192 has been deposited to overfill remaining volume of trenches 184 and openings 186. Subsequently, materials 190 and 192 have been planarized back to at least the elevationally outermost surfaces of material 182. Such forms bit lines 194 which comprise a plurality of horizontally oriented global bit lines 196 having local vertical bit line extensions 198 extending therefrom through multiple of the tiers of memory cells, with individual of such memory cells being depicted with phantom circles 200.

Figure 46:
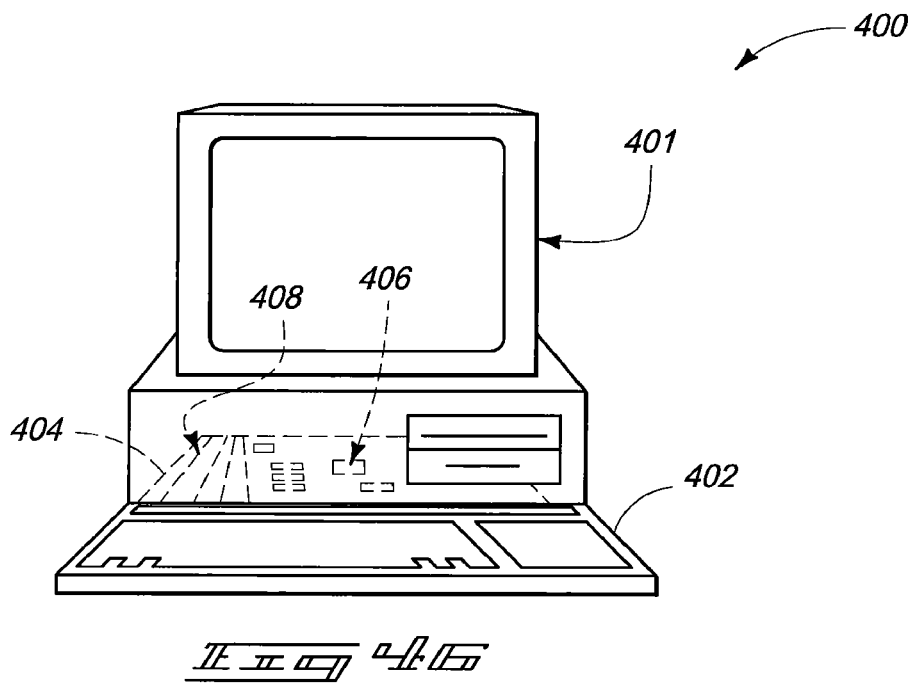
FIG. 46 is a diagrammatic view of a computer embodiment.
Figure 47:
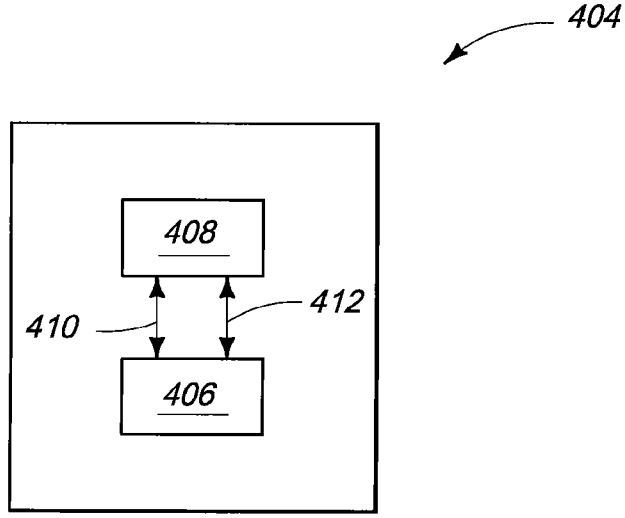
FIG. 47 is a block diagram showing particular features of the motherboard of the FIG. 46 computer embodiment.

FIG. 46 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 47. In such block diagram, the addressing circuitry is illustrated as 410 and the read circuitry is illustrated as 412.

Processor device 406 may correspond to a processor module, and associated memory utilized with the module may comprise various structures of the types described with reference to FIGS. 1-45.

Memory device 408 may correspond to a memory module, and may comprise various structures of the types described with reference to FIGS. 1-45.

Figure 48:
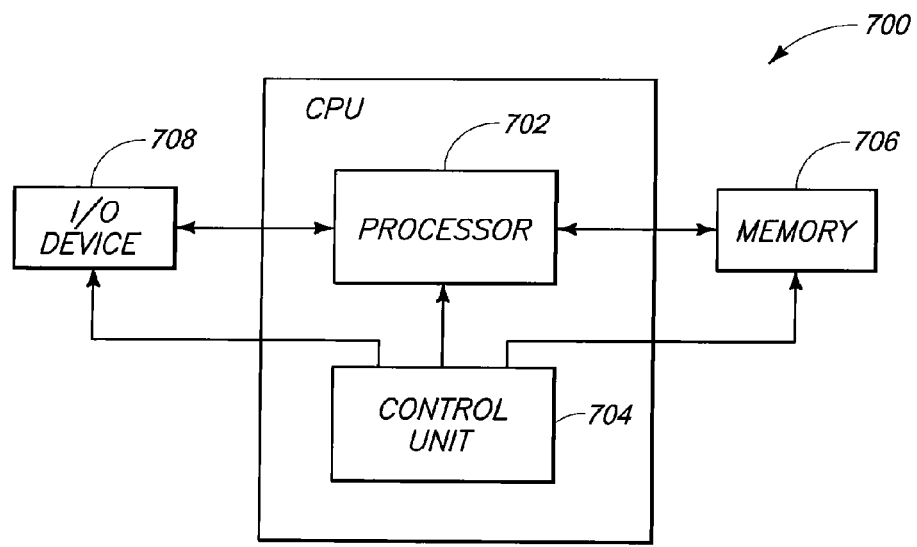
FIG. 48 is a high level block diagram of an electronic system embodiment.

FIG. 48 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include various structures of the types described with reference to FIGS. 1-45.

Figure 49:
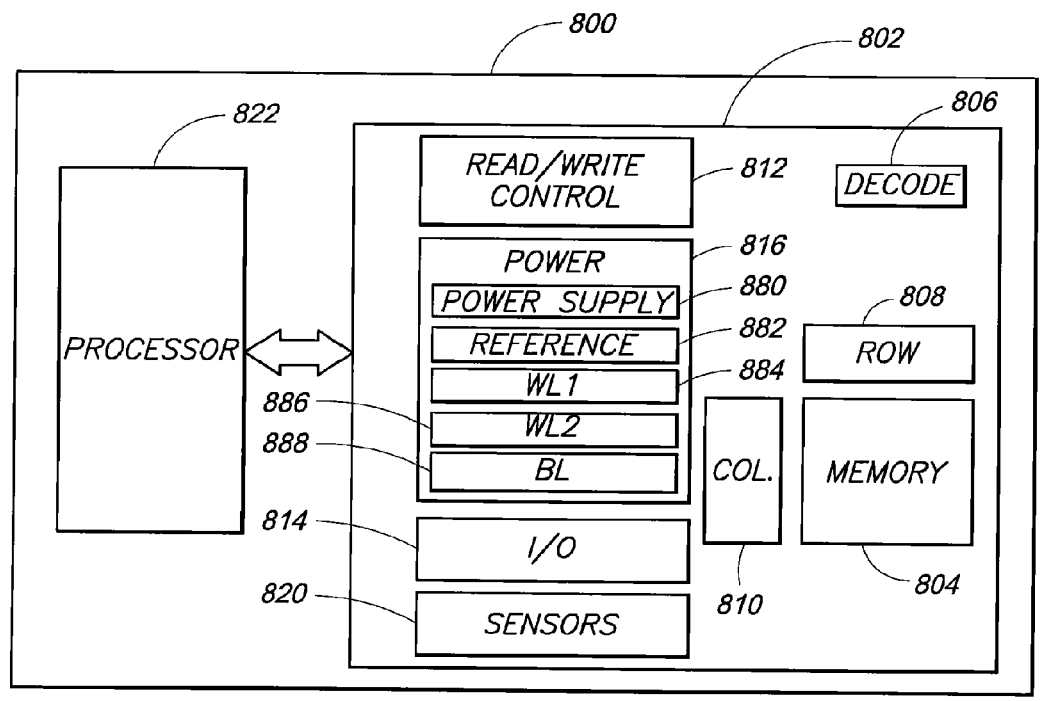
FIG. 49 is a simplified block diagram of a memory device embodiment.

FIG. 49 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first interconnection line (for instance, a word line) with pulses, circuitry 886 for providing a second interconnection line (for instance, another word line) with pulses, and circuitry 888 for providing a third interconnection line (for instance, a bit line) with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include various structures of the types described with reference to FIGS. 1-45.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of vertically stacked tiers of non-volatile cross point memory cells, comprising:
   a plurality of horizontally oriented word lines within individual tiers of memory cells;
   a plurality of horizontally oriented global bit lines having local vertical bit line extensions extending through multiple of the tiers of memory cells; and
   individual of the memory cells comprising multi-resistive state material received between one of the horizontally oriented word lines and one of the local vertical bit line extensions where such cross, with such ones of the horizontally oriented word lines and local vertical bit line extensions comprising opposing conductive electrodes of individual memory cells where such cross, the horizontally oriented word lines at least where such cross being of a conductively filled C-shape in a vertical cross section with an outline of the C-shape comprising one conductive material with a central portion of the C-shape being filled with another conductive material of different composition from the one conductive material.

2. The array of claim 1 wherein the one and another conductive materials are homogenous, respectively.

3. The array of claim 1 wherein the one conductive material comprises platinum.

4. The array of claim 1 wherein the one conductive material is of higher conductivity than the another conductive material.

5. The array of claim 1 wherein the another conductive material extends laterally outward of the C-shape outline of the one conductive material.

6. The array of claim 1 wherein the one and another conductive materials are non-homogenous, respectively.

7. The array of claim 1 wherein at least one of the one and another conductive materials is homogenous.

8. The array of claim 1 wherein at least one of the one and another conductive materials is non-homogenous.

9. The array of claim 1 wherein the multi-resistive state material comprises a C-shape in a horizontal cross section.

10. An array of vertically stacked tiers of non-volatile cross point memory cells, comprising:
   a plurality of horizontally oriented word lines within individual tiers of memory cells;
   a plurality of horizontally oriented global bit lines having local vertical bit line extensions extending through multiple of the tiers of memory cells; and
   individual of the memory cells comprising multi-resistive state material received between one of the horizontal word lines and one of the local vertical bit line extensions where such cross, with such ones of the horizontal word lines and local vertical bit line extensions comprising opposing conductive electrodes of individual memory cells where such cross, the multi-resistive state material comprising a C-shape in a vertical cross section.

11. The array of claim 10 wherein the multi-resistive state material extends continuously along individual of the local vertical bit line extensions through multiple of the tiers.

12. The array of claim 10 wherein the multi-resistive state material comprises a C-shape in a horizontal cross section.

13. The array of claim 10 wherein the local vertical bit line extensions laterally fill center volume the C-shape.

14. The array of claim 10 wherein the local vertical bit line extensions are individually homogenous.

15. The array of claim 10 wherein the individual horizontal global bit lines with the local vertical bit line extensions are homogenous.

16. The array of claim 10 wherein,
   the multi-resistive state material extends continuously along individual of the local vertical bit line extensions through multiple of the tiers;
   the multi-resistive state material comprises a C-shape in a horizontal cross section; and
   the local vertical bit line extensions laterally fill center volume the C-shapes.

17. An array of vertically stacked tiers of non-volatile cross point memory cells, comprising:
   a plurality of horizontally oriented word lines within individual tiers of memory cells;
   a plurality of horizontally oriented global bit lines having local vertical bit line extensions extending through multiple of the tiers of memory cells; and
   individual of the memory cells comprising multi-resistive state material received between one of the horizontal word lines and one of the local vertical bit line extensions where such cross, with such ones of the horizontal word lines and local vertical bit line extensions comprising opposing conductive electrodes of individual memory cells where such cross, the multi-resistive state material comprising a composite of two different composition materials, one of the two materials of the composite comprising a plurality of spaced blocks received along individual of the local vertical bit line extensions with individual of the spaced blocks being associated with individual of the memory cells, the other of the two materials of the composite being of C-shape in a horizontal cross section and extending continuously along individual of the local vertical bit line extensions through multiple of the tiers.

* * * * *

UNITED STATES PATENT AND TRADEMARK OFFICE
CERTIFICATE OF CORRECTION

PATENT NO. : 8,542,513 B2  
APPLICATION NO. : 13/777083  
DATED : September 24, 2013  
INVENTOR(S) : Tang et al.

Page 1 of 1

It is certified that error appears in the above-identified patent and that said Letters Patent is hereby corrected as shown below:

In the Claims

Column 20, line 4, in Claim 13, delete "volume" and insert -- volume of --, therefor.

Column 20, line 18, in Claim 16, delete "volume" and insert -- volume of --, therefor.

Signed and Sealed this
Twenty-sixth Day of November, 2013

Margaret A. Focarino
*Commissioner for Patents of the United States Patent and Trademark Office*